US012772558B2

(12) United States Patent
Medisetti et al.

(10) Patent No.: US 12,772,558 B2
(45) Date of Patent: Oct. 20, 2026

(54) DOMAIN MERGER CELL TO ABUT POWER DOMAINS FOR CHIP AREA REDUCTION

(71) Applicant: QUALCOMM Incorporated, San Diego, CA (US)

(72) Inventors: Kamesh Medisetti, Bangalore (IN); Sharad Kumar Gupta, Bangalore (IN); Sudesh Chandra Srivastava, Bangalore (IN); Somesh Agarwal, Noida (IN); Udayakiran Kumar Yallamaraju, Bangalore (IN); Anand Ashok Baligatti, Bangalore (IN); Girish T P, Bangalore (IN); Ankur Mehrotra, Greater Noida (IN); Gousulu Kandukuru, Proddatur (IN); Abhinav Chauhan, Moradabad (IN); Amit Kashyap, Bangalore (IN); Parissa Najdesamii, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 564 days.

(21) Appl. No.: 18/454,376

(22) Filed: Aug. 23, 2023

(65) Prior Publication Data

US 2025/0072110 A1 Feb. 27, 2025

(51) Int. Cl.
*H10D 84/90* (2025.01)

(52) U.S. Cl.
CPC ......... *H10D 84/907* (2025.01); *H10D 84/981* (2025.01)

(58) Field of Classification Search
CPC ..................................................... G06F 30/392
See application file for complete search history.

(56) References Cited

U.S. PATENT DOCUMENTS

| | | | | |
|---|---|---|---|---|
| 8,487,658 | B2 * | 7/2013 | Datta | H03K 19/018521 326/63 |
| 11,728,795 | B2 * | 8/2023 | Park | H03K 3/356113 327/333 |
| 2014/0146630 | A1 * | 5/2014 | Xie | G06F 1/3287 716/133 |
| 2015/0262936 | A1 * | 9/2015 | Bansal | H10D 89/10 257/499 |
| 2017/0336845 | A1 | 11/2017 | Raj et al. | |
| 2017/0352649 | A1 * | 12/2017 | Pant | H10D 89/10 |
| 2020/0074039 | A1 * | 3/2020 | Lu | G06F 30/394 |

(Continued)

OTHER PUBLICATIONS

International Search Report and Written Opinion—PCT/US2024/037092—ISA/EPO—Nov. 4, 2024.

*Primary Examiner* — Seokjin Kim
(74) *Attorney, Agent, or Firm* — Loza & Loza, LLP

(57) ABSTRACT

A chip includes a merger cell including a first p-type length of diffusion (LOD) region extending in a first direction, a first n-well underneath the first p-type LOD region, a first supply rail configured to receive a first supply voltage, and a first n-tap coupling the first n-well to the first supply rail. The merger cell also includes a second p-type length of diffusion (LOD) region extending in the first direction, a second n-well underneath the second p-type LOD region, a second supply rail configured to receive a second supply voltage different from the first supply voltage, and a second n-tap coupling the second n-well to the second supply rail.

20 Claims, 36 Drawing Sheets

(56) References Cited

U.S. PATENT DOCUMENTS

| | | | | |
|---|---|---|---|---|
| 2021/0225830 | A1* | 7/2021 | Liu | H10D 89/10 |
| 2023/0223394 | A1* | 7/2023 | Stockinger | H10D 89/611<br>361/56 |

* cited by examiner

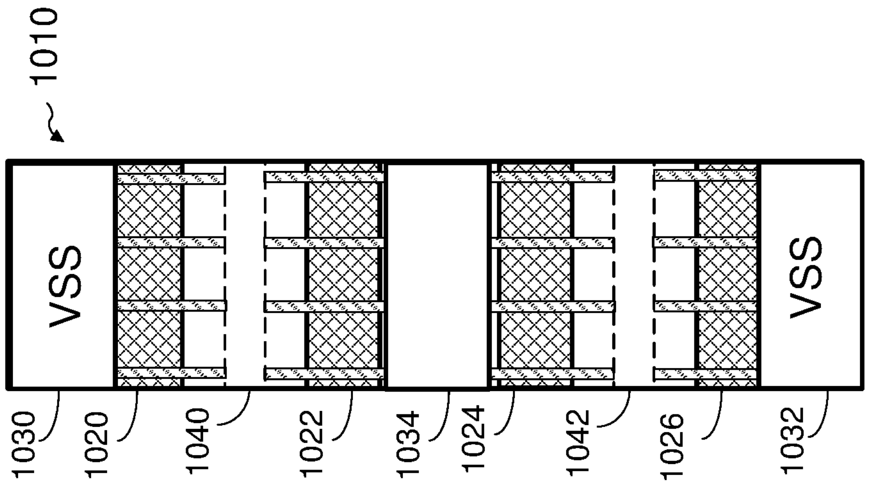
FIG. 10B
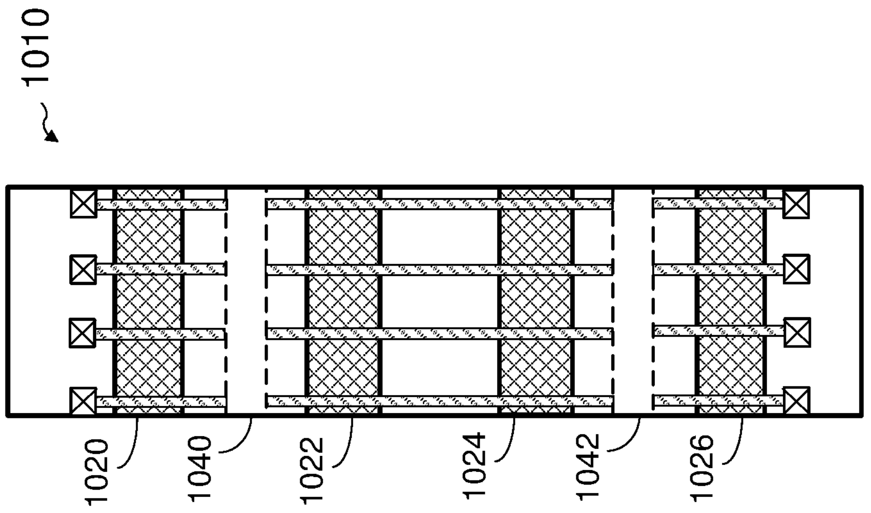
FIG. 10A
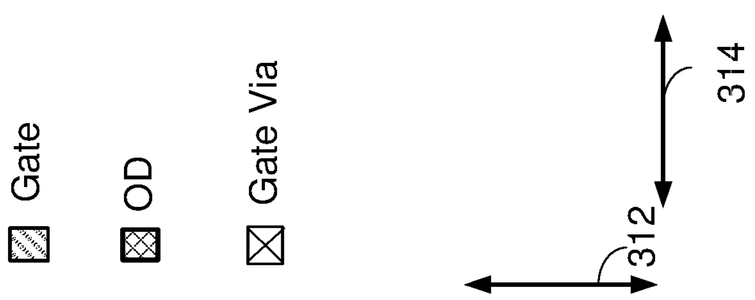

DOMAIN MERGER CELL TO ABUT POWER DOMAINS FOR CHIP AREA REDUCTION

BACKGROUND

Field

Aspects of the present disclosure relate generally to chip layout, and, more particularly, to domain merger cells.

Background

A chip (i.e., silicon die) may include different voltage domains (also referred to as power domains) operating at different supply voltages. Each voltage domain may include cells (e.g., logic cells) operating at the supply voltage of the voltage domain. The voltage domains may be separated from one another by empty areas that do not perform any functionality on the chip but consume area on the chip.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A chip includes a merger cell including a first p-type length of diffusion (LOD) region extending in a first direction, a first n-well underneath the first p-type LOD region, a first supply rail configured to receive a first supply voltage, and a first n-tap coupling the first n-well to the first supply rail. The merger cell also includes a second p-type length of diffusion (LOD) region extending in the first direction, a second n-well underneath the second p-type LOD region, a second supply rail configured to receive a second supply voltage different from the first supply voltage, and a second n-tap coupling the second n-well to the second supply rail.

BRIEF DESCRIPTION OF THE DRAWINGS

FIG. 10A shows another example of a merger cell according to certain aspects of the present disclosure.

FIG. 10B shows an example of the merger cell of FIG. 10A further including ground rails according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
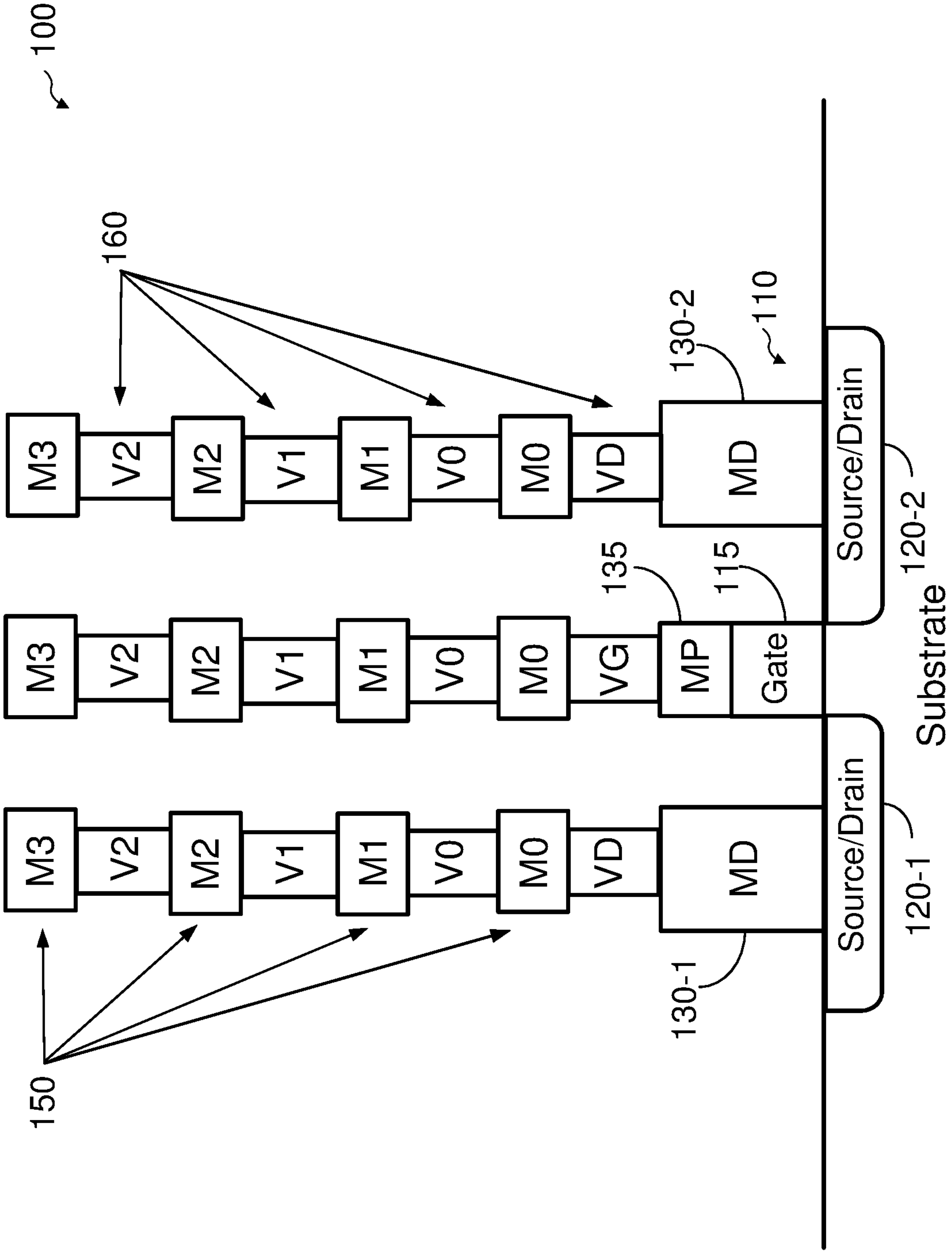
FIG. 1A shows a side view of an example of a chip including multiple layers according to certain aspects of the present disclosure.

FIG. 1A shows a side view of an example of a chip 100 (e.g., a silicon die) including multiple layers according to certain aspects. It is to be appreciated that the chip 100 is not limited to the exemplary layers shown in FIG. 1A.

The chip 100 may include a large number of devices (e.g., transistors) integrated on the chip 100. In this regard, FIG. 1A shows an example of a transistor 110 integrated on the chip 100. Although one transistor 110 is shown in FIG. 1A for simplicity, it is to be appreciated that the chip 100 includes many transistors.

In the example shown in FIG. 1A, the transistor 110 includes a gate 115, a first source/drain 120-1, and a second source/drain 120-2. As used herein, the term "source/drain" means source, drain, or both. The gate 115 is formed over a channel between the first source/drain 120-1 and the second source/drain 120-2. The transistor 110 may also include a thin gate oxide (not shown) between the gate and the channel. The gate 115 may be a polysilicon gate (also referred to as a poly gate), a metal gate, or another type of gate. In the example shown in FIG. 1A, the transistor 110 is depicted as a planar transistor. However, it is to be appreciated that the transistor 110 may be implemented with a fin field-effect transistor (FinFET), an example of which is discussed below with reference to FIGS. 2A and 2B.

The chip 100 may also include a first source/drain contact 130-1 formed on the first source/drain 120-1, and a second source/drain contact 130-2 formed on the second source/drain 120-2. The source/drain contacts 130-1 and 130-2 may be formed from a source/drain contact layer (labeled "MD" in FIG. 1A) using, for example, a lithographic process and an etching process. The chip 100 may also include a gate contact 135 formed on the gate 115. The gate contact 135 may be formed from a gate contact layer (labeled "MP" in FIG. 1A) using, for example, a lithographic process and an etching process.

The chip 100 may also include a stack of metal layers 150. The metal layers 150 are patterned (e.g., using lithography and etching) to provide metal routing for the transistor 110 and other transistors on the chip 100. The metal routing may be used, for example, to interconnect transistors on the chip 100. The metal layers 150 may also be patterned to form supply rails (also referred to as power rails or power buses) for providing supply voltages to the transistors and/or other devices on the chip 100. The metal layers 150 may also be referred to as metallization layers, or another term.

In the example in FIG. 1A, the bottom-most metal layer is referred to as metal layer M0, the metal layer immediately above metal layer M0 is referred to as metal layer M1, the metal layer immediately above metal layer M1 is referred to as metal layer M2, the metal layer immediately above metal layer M2 is referred to as metal layer M3, and so forth. Although four metal layers are shown in FIG. 1 for case of illustration, it is to be appreciated that the chip 100 may include additional metal layers. It is to be appreciated that the present disclosure is not limited to the nomenclature in which the bottom-most metal layer is referred to as metal layer M0. For instance, in another example, the bottom-most metal layer may be referred to as metal layer M1 instead of metal layer M0.

The chip 100 also includes vias 160 that provide electrical coupling between the metal layers 150, and between metal layer M0 and the contacts 130-1, 130-2, and 135. In this example, the vias VD provide electrical coupling between the source/drain contacts 130-1 and 130-2 and metal layer M0, and the via VG provides electrical coupling between the gate contact 135 and metal layer M0. The vias V0 provide electrical coupling between metal layer M0 and metal layer M1, the vias V1 provide electrical coupling between metal layer M1 and metal layer M2, and the vias V2 provide electrical coupling between metal layer M2 and metal layer M3.

The exemplary transistor 110 shown in FIG. 1A may be used to implement an n-type transistor (e.g., n-type field effect transistor (NFET)) or a p-type transistor (e.g., p-type field effect transistor (PFET)). The chip 100 may include both n-type transistors and p-type transistors.

Figure 1B:
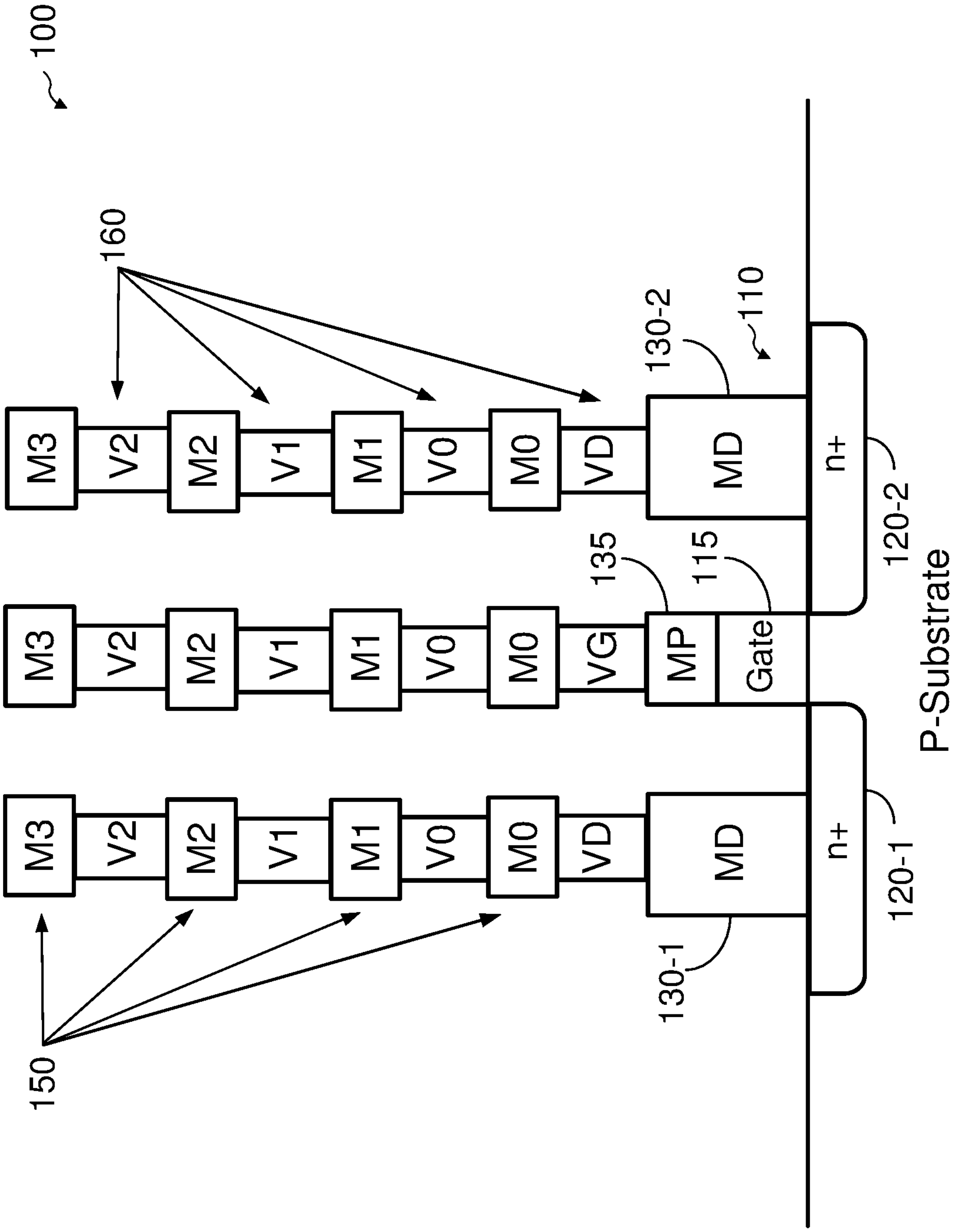
FIG. 1B shows an example of an n-type transistor according to certain aspects of the present disclosure.

FIG. 1B shows an example of an n-type implementation of the transistor 110 according to certain aspects. In this example, each of the first source/drain 120-1 and the second source/drain 120-2 is an n+ source/drain, which may be formed using n+ diffusion, n+ implantation, or another process. Also, in this example, the first source/drain 120-1 and the second source/drain 120-2 may be formed in a p-well or a p-substrate (shown in the example in FIG. 1B). The p-well or p-substrate may be coupled to a ground rail through a p-tap (not shown in FIG. 1B). The ground rail (e.g., VSS rail) may be formed from metal layer M0 or another metal layer.

Figure 1C:
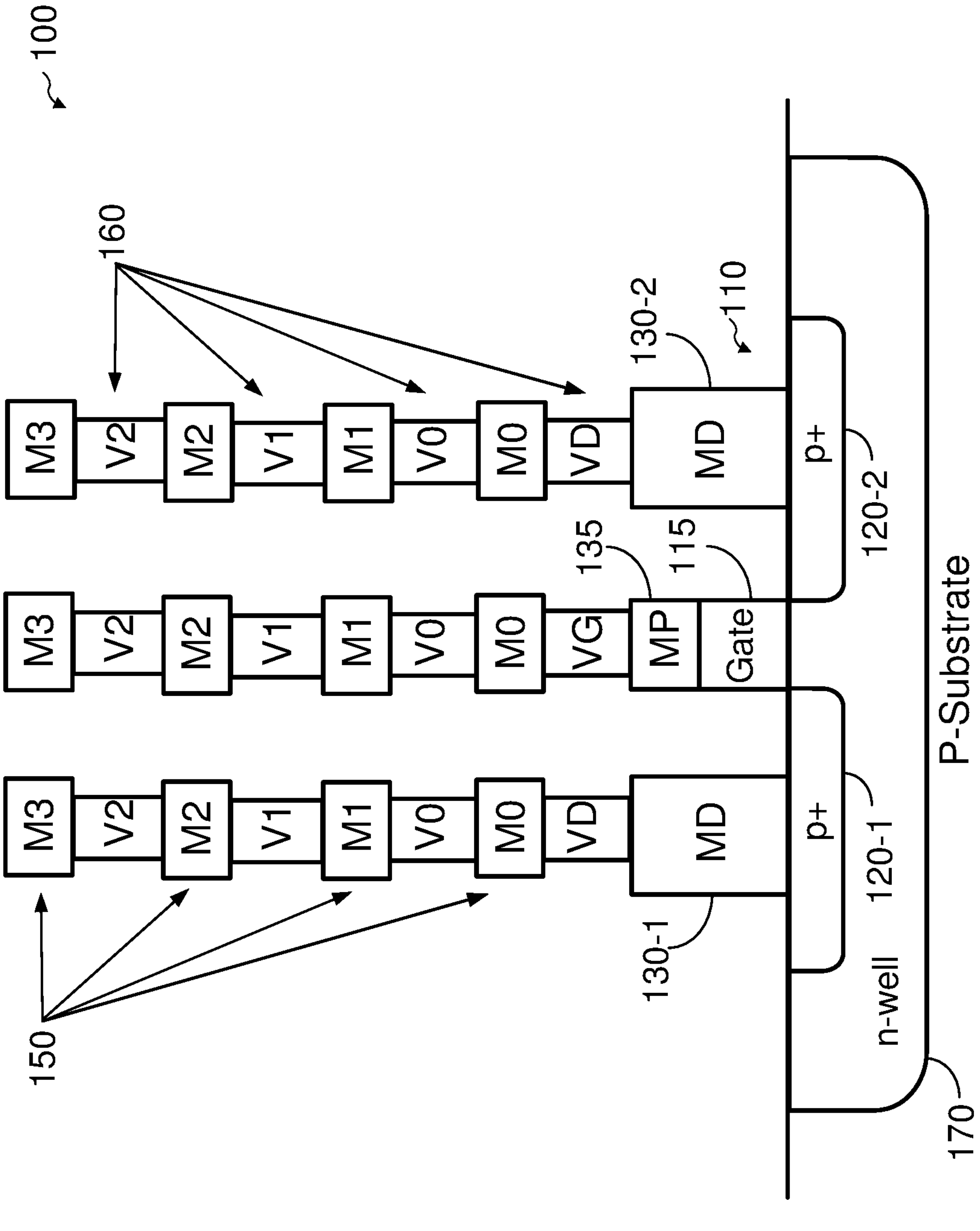
FIG. 1C shows an example of a p-type transistor according to certain aspects of the present disclosure.

FIG. 1C shows an example of a p-type implementation of the transistor 110 according to certain aspects. In this example, each of the first source/drain 120-1 and the second source/drain 120-2 may be a p+ source/drain, which may be formed using p+ diffusion, p+ implantation, or another process. Also, in this example, the first source/drain 120-1 and the second source/drain 120-2 may be formed in an n-well 170 in the p-substrate, as shown in FIG. 1C. The n-well may be coupled to a supply rail through an n-tap (not shown in FIG. 1C). An n-tap may also be referred to as an n-well tap or another term. The supply rail (e.g., VDD rail) may be formed from metal layer M0 or another metal layer.

Figure 2A:
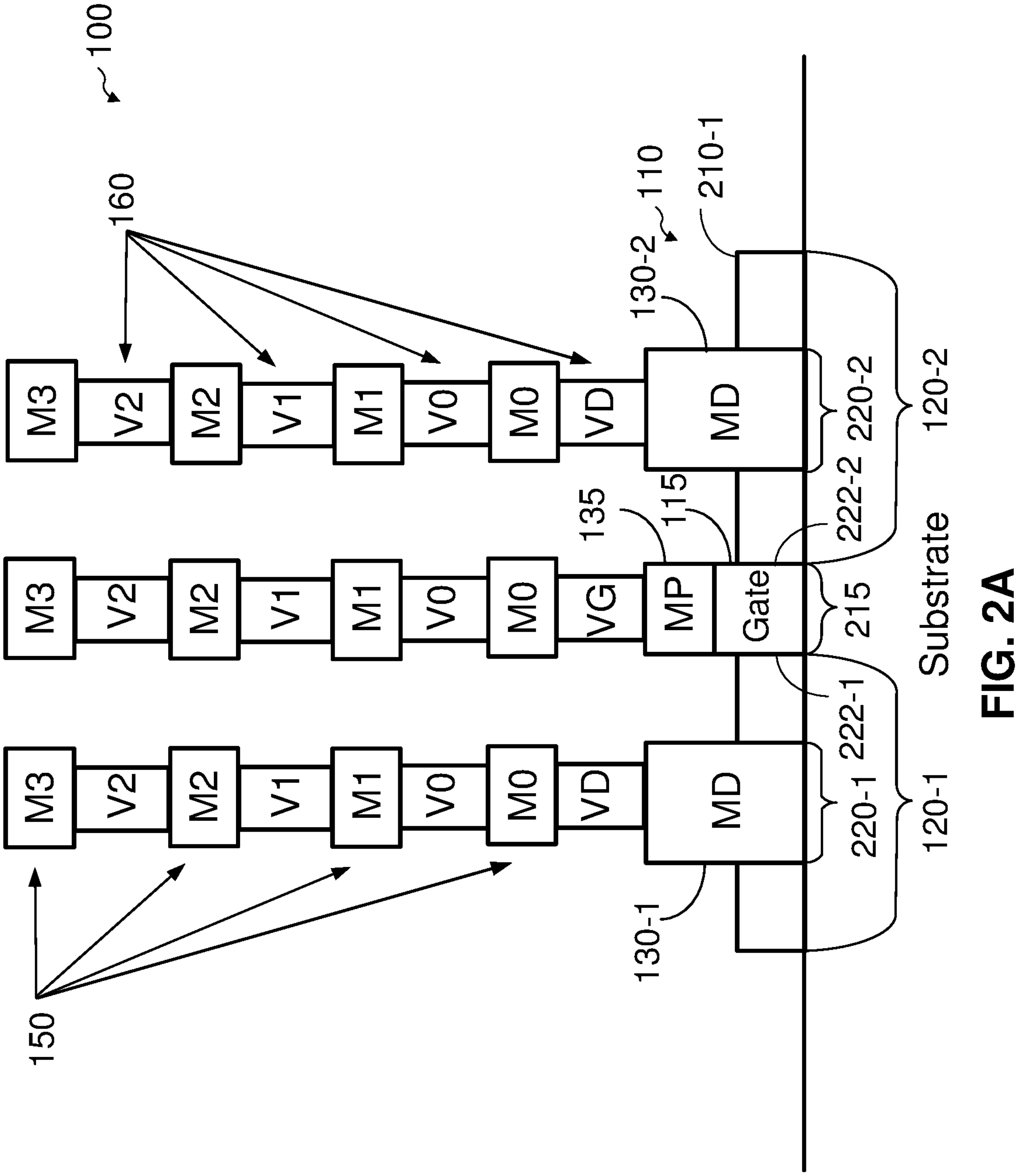
FIG. 2A shows a side view of an example of a fin field-effect transistor (FinFET) according to certain aspects of the present disclosure.
Figure 2B:
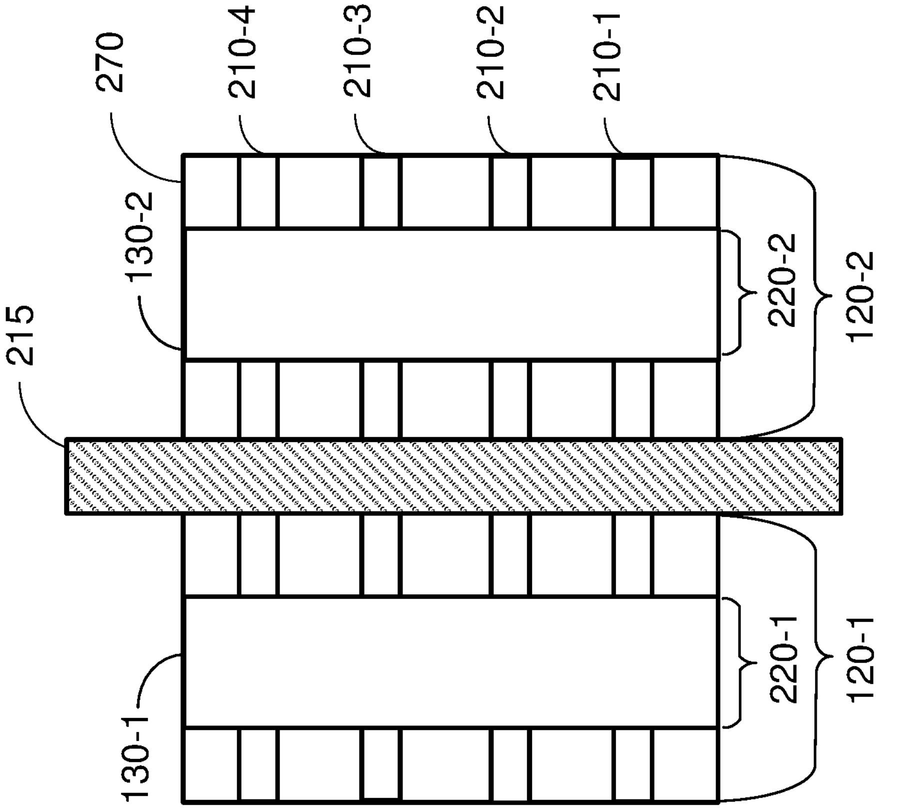
FIG. 2B shows a top view of the FinFET according to certain aspects of the present disclosure.

FIG. 2A shows a side view and FIG. 2B shows a top view of an example in which the transistor 110 is implemented with a FinFET. In this example, the transistor 110 includes fins 210-1 to 210-4 that extend perpendicularly with respect to the gate 115 and the source/drain contacts 130-1 and 130-2 (shown in FIG. 2B). The fins 210-1 to 210-4 may be formed in an oxide diffusion (OD) region 270 (also referred to as an OD layer, an oxide defined area, an active region, active diffusion, or another term). Although four fins 210-1 to 210-4 are shown in the example in FIG. 2B, it is to be understood that the transistor 110 may include a different number of fins. Also, although the fins 210-1 to 210-4 are shown having rectangular cross sections, it is to be understood that the fins may having other cross-sectional shapes (e.g., tapered cross sections). Note that the metal layers 150, the vias 160, and the gate contact 135 are not explicitly shown in the top view in FIG. 2B.

In this example, the gate 115 (e.g., poly gate) is formed over a first portion 215 of the fins 210-1 to 210-4. The gate 115 may wrap around three or more sides of each fin (e.g., the top side and two opposite sidewalls of each fin). In this example, the transistor 110 may also include a thin dielectric layer (not shown) interposed between the fins 210-1 to 210-4 and the gate 115. As shown in FIG. 2A, the gate contact 135 may be formed on the gate 115, and the via VG may electrically couple the gate contact 135 to metal layer M0.

A portion of the fins 210-1 to 210-4 extending from a first side 222-1 of the gate 115 forms the first source/drain 120-1, and a portion of the fins 210-1 to 210-4 extending from a second side 222-2 of the gate 115 forms the second source/drain 120-2, in which the first side 222-1 and the second side 222-2 are opposite sides of the gate 115. In this example, the first source/drain contact 130-1 is formed over a second portion 220-1 of the fins 210-1 to 210-4 on the first side 222-1 of the gate 115, and the second source/drain contact 130-2 is formed over a third portion 220-2 of the fins 210-1 to 210-4 on the second side 222-2 of the gate 115. Each of the source/drain contacts 130-1 to 130-2 may be made of a conductive material (e.g., one or more metals). As shown in FIG. 2A, the vias VD may electrically couple the source/drain contacts 130-1 to 130-2 to metal layer M0.

Although one gate 115 is shown in FIGS. 2A and 2B, it is to be appreciated that the transistor 110 may include multiple gates arranged in parallel is some implementations. In these implementations, the gates may be spaced apart by a uniform pitch.

Figure 3:
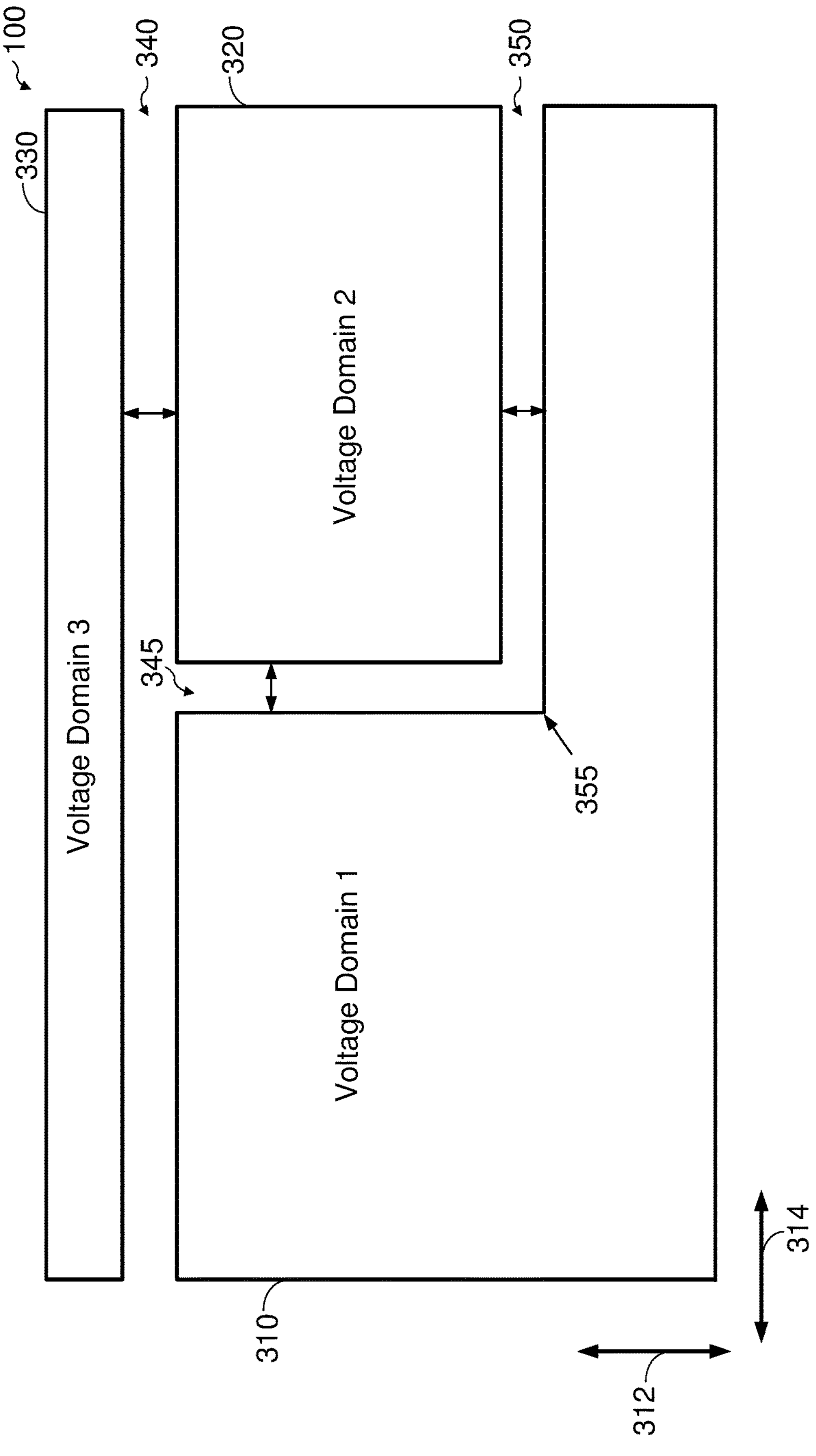
FIG. 3 shows a top view of a chip including multiple voltage domains separated by empty areas according to certain aspects of the present disclosure.

In certain aspects, the chip 100 includes a system on a chip (SoC) including different voltage domains operating at different supply voltages. In this regard, FIG. 3 shows a top view of an example in which the chip 100 includes a first voltage domain 310, a second voltage domain 320, and a third voltage domain 330. However, it is to be appreciated that the present disclosure is not limited to this example. A voltage domain may also be referred to as a power domain, a voltage island, or another term.

The first voltage domain 310 may include cells operating at a first supply voltage, the second voltage domain 320 may include cells operating at a second supply voltage, and the third voltage domain 330 may include cells operating at a third supply voltage. Each cell may include one or more transistors (e.g., one or more instances of the transistor 110) that are arranged to provide a logic gate, a latch, a flip-flop, a buffer, and/or another circuit. The layout of each cell may be specified in a standard cell library that defines the layouts for various types of cells that can be placed on the chip 100.

In FIG. 3, the voltage domains 310, 320, and 330 are separated from one another by empty areas. The empty areas may also be referred to as hollow areas, hollow spaces, or another term. In the example in FIG. 3, the first voltage domain 310 is separated from the second voltage domain 320 in a first direction 314 (e.g., horizontal direction) by empty area 345. The first voltage domain 310 is also separated from the second voltage domain 320 in a second direction 312 (e.g., vertical direction) by empty area 350, in which the second direction is perpendicular to the first direction 314 (e.g., horizontal direction), the third voltage domain 330 is separated from the first voltage domain 310 and the second voltage domain 320 in the second direction 312 (e.g., vertical direction) by empty area 340.

Figure 4:
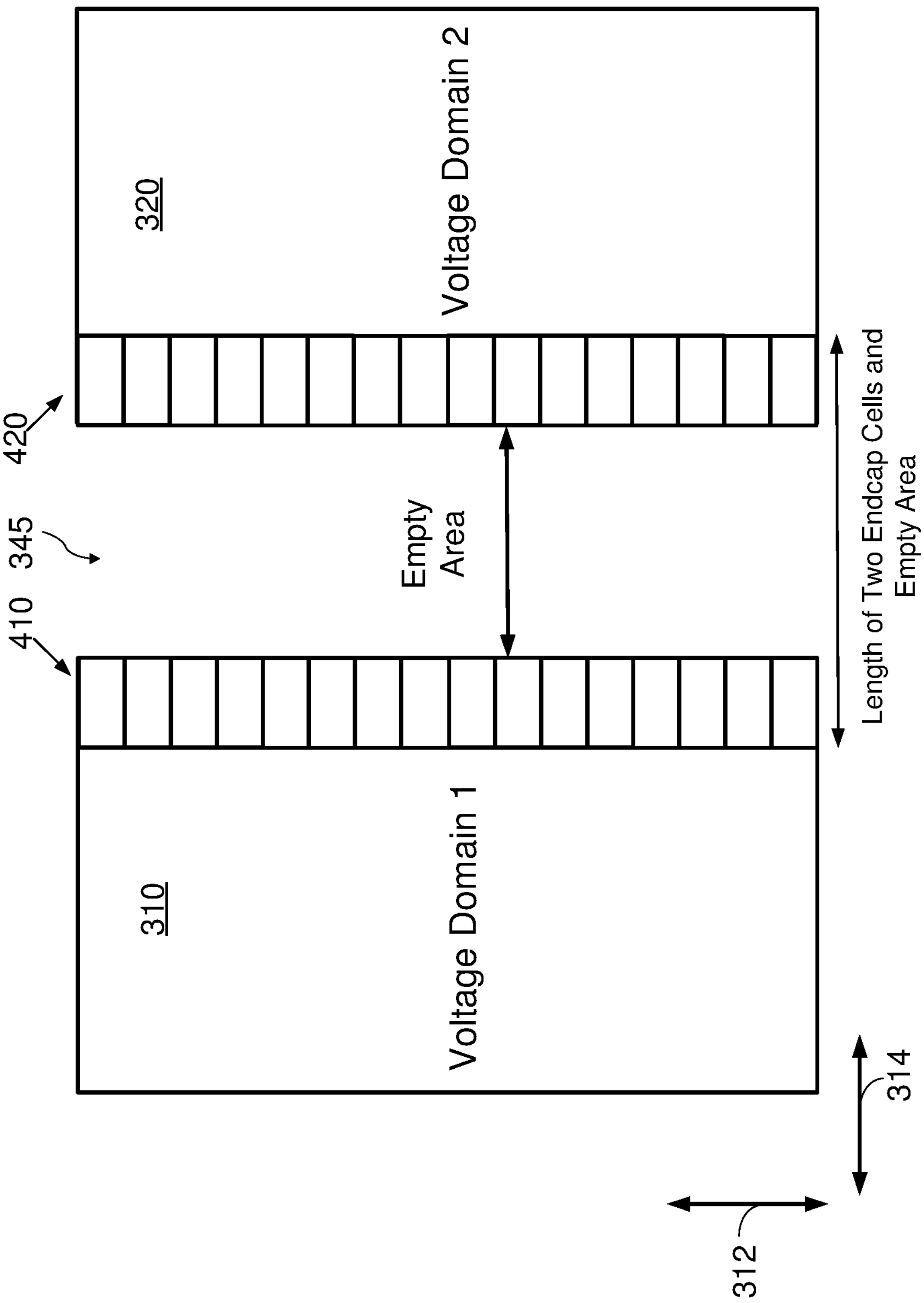
FIG. 4 shows an example of endcap cells according to certain aspects of the present disclosure.
Figure 5:
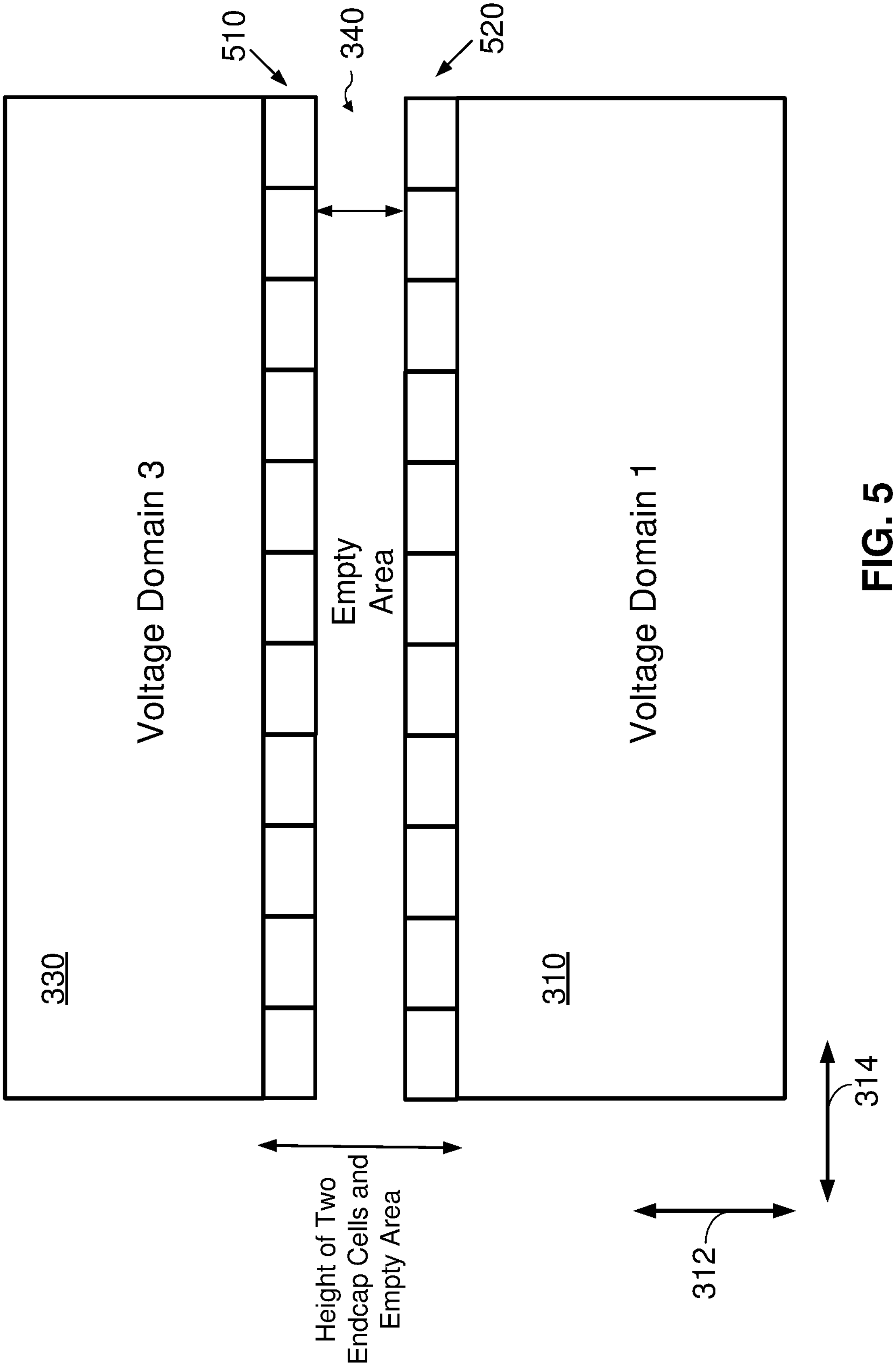
FIG. 5 shows another example of endcap cells according to certain aspects of the present disclosure.

The chip 100 may also include endcap cells placed along the boundaries of the voltage domains 310, 320, and 330. For example, the chip 100 may include endcap cells (e.g., horizontal endcap cells) configured to terminate the rows of the voltage domains 310, 320, and 330 in way that satisfies design rule checks (DRCs) specified by a foundry. In this regard, FIG. 4 shows an example of endcap cells 410 placed along a right boundary of the first voltage domain 310 and endcap cells 420 placed along a left boundary of the second voltage domain 320, in which the boundaries are separated in the first direction 314 (e.g., horizontal direction). In this example, each of the endcap cells 410 and 420 may include an OD break, a length of diffusion (LOD) region to mitigate the local layout effect, an n-tap, a p-tap, and/or termination region for base layer termination. FIG. 5 shows an example of endcap cells 510 placed along a top boundary of the first voltage domain 310 and endcap cells 520 placed along a bottom boundary of the third voltage domain 330, in which the boundaries are separated in the second direction 312 (e.g., vertical direction).

The empty areas 340, 345, and 350 between the voltage domains 310, 320, and 330 consume area on the chip 100 but do not provide functionality to the SoC. For example, the empty areas 340, 345, and 350 may consume approximately 4 to 5 percent of the total SoC area on the chip 100. Accordingly, it is desirable to reduce or eliminate the empty areas 340, 340, and 345 to reduce the area of the SoC, which translates to a reduction in cost per chip.

To address the above, aspects of the present disclose provide domain merger cells, which can be used to merge two voltage domains to eliminate the empty area between the voltage domains for reduced chip area. Exemplary domain merger cells are presented for merging two voltage domains in the second direction 312, the first direction 314, and at an L corner, as discussed further below.

Figure 6A:
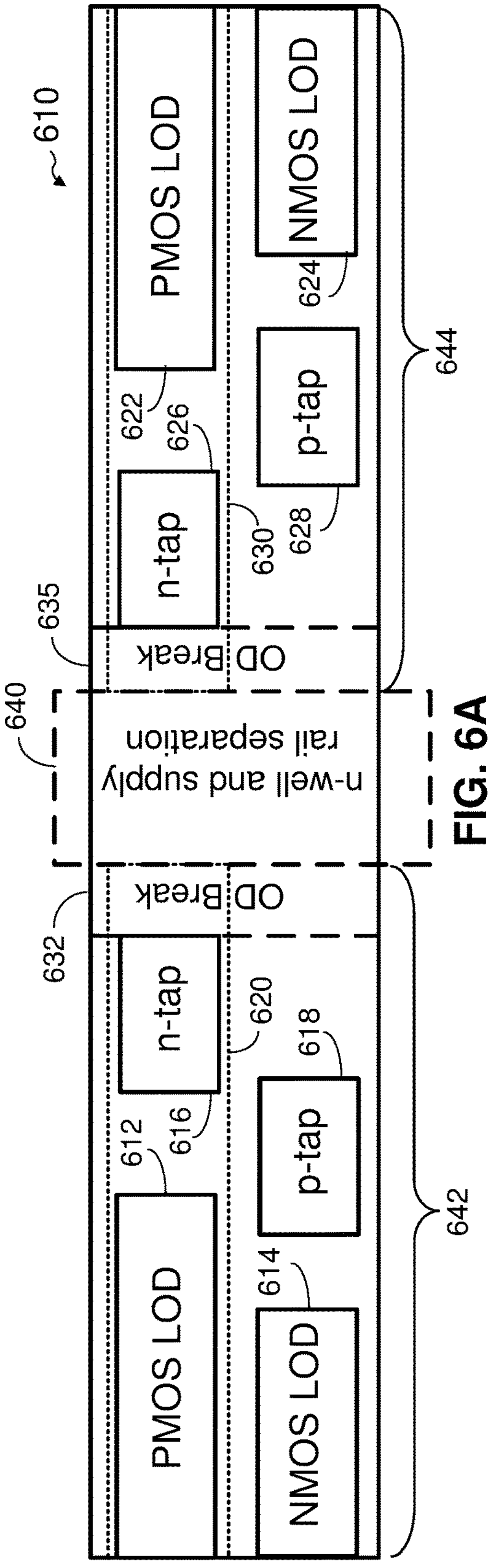
FIG. 6A shows an example of a merger cell according to certain aspects of the present disclosure.
Figure 6B:
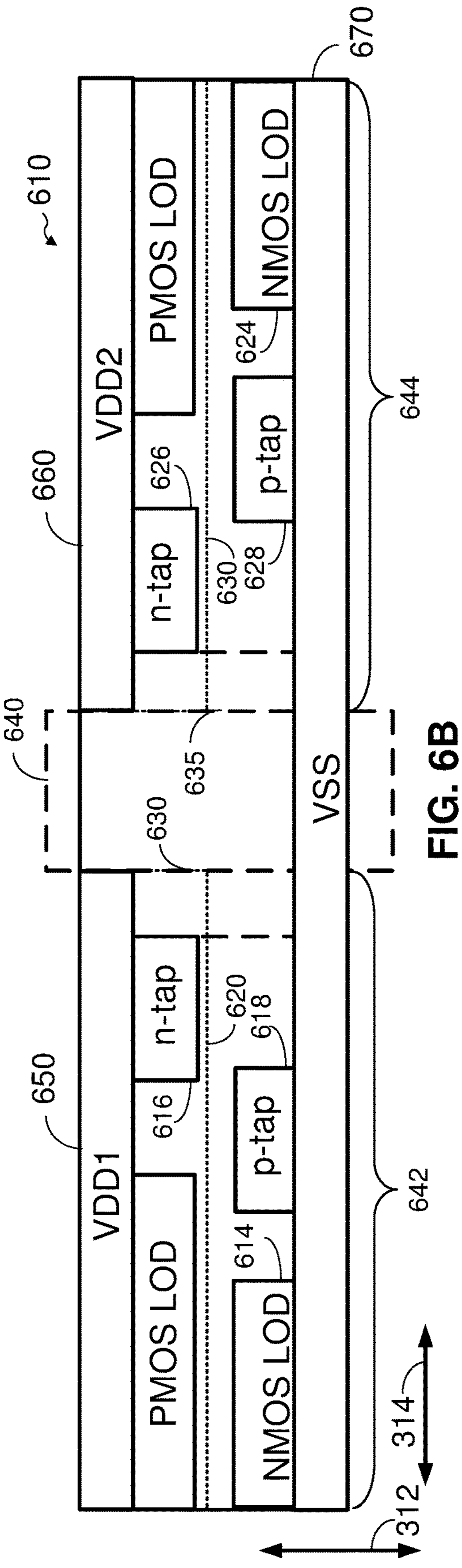
FIG. 6B shows an example of the merger cell of FIG. 6A further including two separate supply rails according to certain aspects of the present disclosure.
Figure 6C:
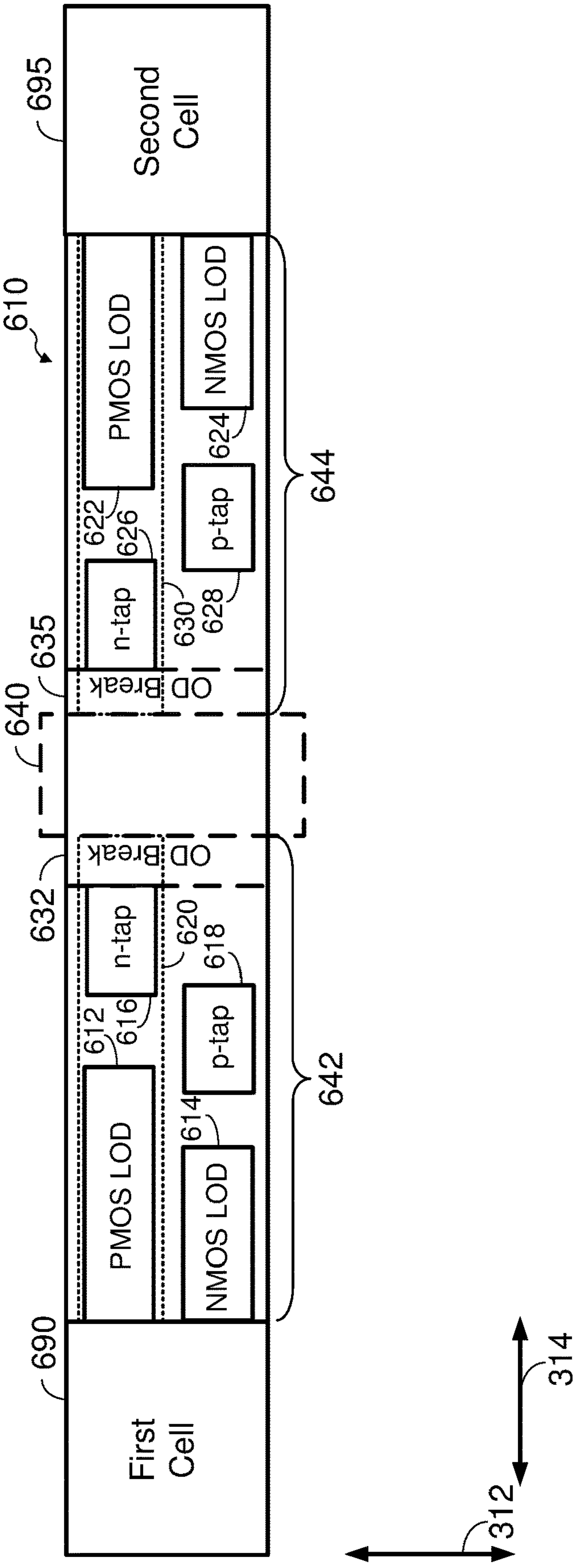
FIG. 6C shows an example of a first cell in a first voltage domain abutting a first side of the merger cell of FIG. 6A and a second cell in a second voltage domain abutting a second side of the merger cell of FIG. 6A according to certain aspects of the present disclosure.

FIGS. 6A and 6B show a top view of an example of a merger cell 610 according to certain aspects. In the example shown in FIG. 6A, the merger cell 610 (e.g., horizontal merger cell) is configured to merge a first voltage domain and a second voltage domain (e.g., the first voltage domain 310 and the second voltage domain 320) in the first direction 314 (e.g., horizontal direction). For example, a first side (e.g., left side) of the merger cell 610 may abut a first cell 690 in the first voltage domain (e.g., the first voltage domain 310), and a second side (e.g., right side) of the merger cell 610 opposite the first side may abut a second cell 695 in the second voltage domain (e.g., the second voltage domain 320) as shown in FIG. 6C. The first side and the second side are opposite sides of the merger cell 610 (i.e., opposing sides of the merger cell 610). The layouts of the cells 690 and 695 may be specified in a standard cell library. Cells in the first voltage domain are supplied with a first supply voltage, and cells in the second voltage domain are supplied with a second supply voltage different from the first supply voltage. For example, the second supply voltage may be at least ten percent higher or at least ten percent lower than the first supply voltage.

A first portion 642 (e.g., a left portion) of the merger cell 610 includes a first p-type LOD region 612, a first n-well 620, a first n-tap 616, a first n-type LOD region 614, and a first p-tap 618. A second portion 644 (e.g., a right portion) of the merger cell 610 includes a second p-type LOD region 622, a second n-well 630, a second n-tap 626, a second n-type LOD region 624, and a second p-tap 628.

As shown in FIG. 6B, the merger cell 610 also includes a first supply rail 650 in the first portion 642 of the merger cell 610, a second supply rail 660 in the second portion 644 of the merger cell 610, and a contiguous ground rail 670 that extends across both portions 642 and 644 of the merger cell 610. The first supply rail 650, the second supply rail 660, and the ground rail 670 may be formed from a same metal layer (e.g., metal layer M0) using a lithographic and etching process. Note that the first supply rail 650, the second supply rail 660, and the ground rail 670 are not shown in FIG. 6A in order to show structures underneath the rails. A supply rail may also be referred to as a power bus, a power rail, or another term.

The first p-type LOD region 612 extends in the first direction 314 and may be used to mitigate the local layout effect (e.g., on the first cell 690 in the first voltage domain abutting the first side (e.g., left side) of the merger cell 610). The first n-type LOD region 614 extends in the first direction 314 and may also be used to mitigate the local layout effect (e.g., on the first cell 690 in the first voltage domain abutting the first side (e.g., left side) of the merger cell 610). The first p-type LOD region 612 and the first n-type LOD region 614 are spaced apart in the second direction 312. An exemplary implementation of the LOD regions 612 and 614 is discussed below with reference to FIG. 7A.

The first n-well 620 extends in the first direction 314 with a portion of the first n-well 620 being underneath the first p-type LOD region 612. The first n-well 620 may be part of a larger n-well that extends in the first direction 314 into the first cell 690 in the first voltage domain abutting the first side (e.g., left side) of the merger cell 610. The first n-tap 616 is configured to couple the first n-well 620 to the first supply rail 650 (e.g., to prevent latch-up in the first n-well 620). The first supply rail 650 extends in the first direction 314 and may be formed from metal layer M0 (e.g., using a lithographic and etching process). The first supply rail 650 is configured to supply the first supply voltage of the first voltage domain. The first supply rail 650 may be part of a longer supply rail that extends in the first direction 314 into the first voltage domain.

The first p-tap 618 is configured to couple a p-substrate of the chip 100 to the ground rail 670. In the example in FIG. 6B, the ground rail 670 is contiguous across the first portion 642 and the second portion 644 of the merger cell 610.

The second p-type LOD region 622 extends in the first direction 314 and may be used to mitigate the local layout effect (e.g., on the second cell 695 in the second voltage domain abutting the second side (e.g., right side) of the merger cell 610). The second n-type LOD region 624 extends in the first direction 314 and may also be used to mitigate the local layout effect (e.g., on the second cell 695 in the second voltage domain abutting the second side (e.g., right side) of the merger cell 610). The second p-type LOD region 622 and the second n-type LOD region 624 are spaced apart in the second direction 312. An exemplary implementation of the LOD regions 622 and 624 is discussed below with reference to FIG. 7B.

The second n-well 630 extends in the first direction 314 with a portion of the second n-well 630 being underneath the second p-type LOD region 622. The second n-well 630 may be part of a larger n-well that extends in the first direction 314 into the second cell 695 in the second voltage domain abutting the second side of the merger cell 610. The second n-tap 626 is configured to couple the second n-well 630 to the second supply rail 660 (e.g., to prevent latch-up in the second n-well 630). The second supply rail 660 extends in the first direction 314 and may be formed from metal layer M0 (e.g., using a lithographic and etching process). The second supply rail 660 is configured to supply the second supply voltage of the second voltage domain. The second supply rail 660 may be part of a longer supply rail that extends in the first direction 314 into the second voltage domain.

The second p-tap 628 is configured to couple the p-substrate of the chip 100 to the ground rail 670. In the example in FIG. 6B, the ground rail 670 is contiguous across the first portion 642 and the second portion 644 of the merger cell 610.

The first supply rail 550 and the second supply rail 560 are aligned in the second direction 312 (e.g., vertical direction) and separated in the first direction 314 (e.g., horizontal direction) by a separation region 640 located between the first portion 642 and the second portion 644 of the merger cell 610. The separation (i.e., spacing) between the first supply rail 550 and the second supply rail 560 in the first direction 314 (e.g., horizontal direction) allows the first supply rail 550 to be held at the first supply voltage of the first voltage domain and the second supply rail 560 to be held at the second supply voltage of the second voltage domain. Thus, the merger cell 610 includes two different supply rails (i.e., the first and second supply rails 650 and 660) for the two voltage domains and a common ground rail (i.e., the ground rail 570). The ground rail 370 (e.g., VSS rail) is contiguous across the merger cell 610 in the first direction 314, and is common to both portions 642 and 644 of the merger cell 610. Thus, the merger cell 610 includes two different supply rails (i.e., the first and second supply rails 650 and 660) for the two voltage domains and a common ground rail (i.e., the ground rail 370).

The first n-well 620 and the second n-well 630 are separated in the first direction (e.g., horizontal direction) by the separation region 640 located between the first portion 642 and the second portion 644 of the merger cell 610. This allows the first n-well 620 and the second n-well 630 to be coupled to different voltages to accommodate different voltage domains in the merger cell 610. The first n-tap 616 couples the first n-well 620 to the first supply rail 650 at the first supply voltage, and the second n-tap 626 couples the second n-well 630 to the second supply rail 660 at the second supply voltage.

The merger cell 610 has a first OD break region 632 and a second OD break region 635, in which the separation region 640 is between the first OD break region 632 and the second OD break region 635. The OD break regions 632 and 635 separate OD regions in the first and second voltage domains. The ODs regions extend in the first direction 314 (e.g., horizontal direction), as discussed further below with reference to FIGS. 7A and 7B.

Figure 7A:
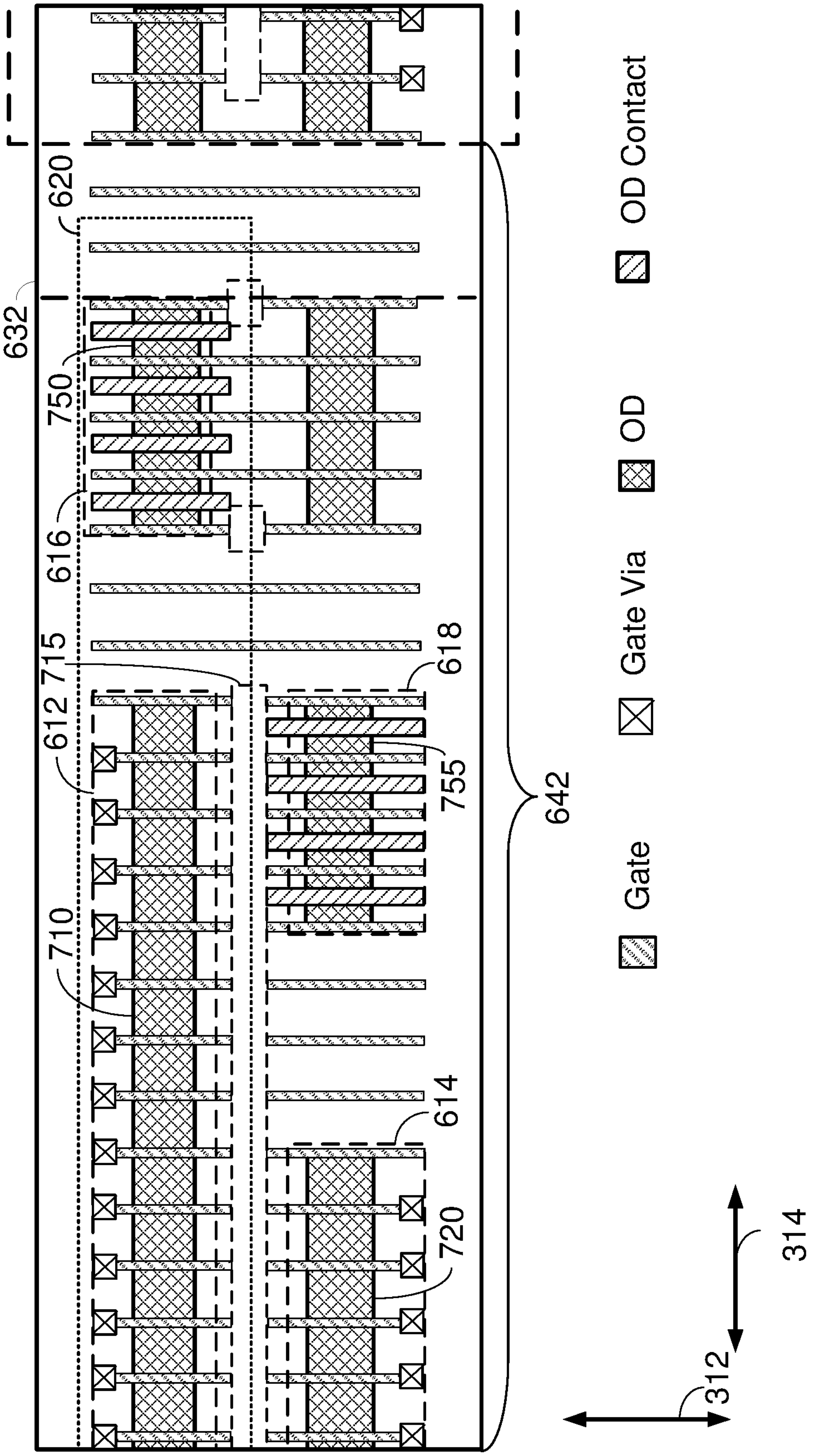
FIG. 7A shows a first portion of an exemplary implementation of the merger cell of FIG. 6A according to certain aspects of the present disclosure.
Figure 7B:
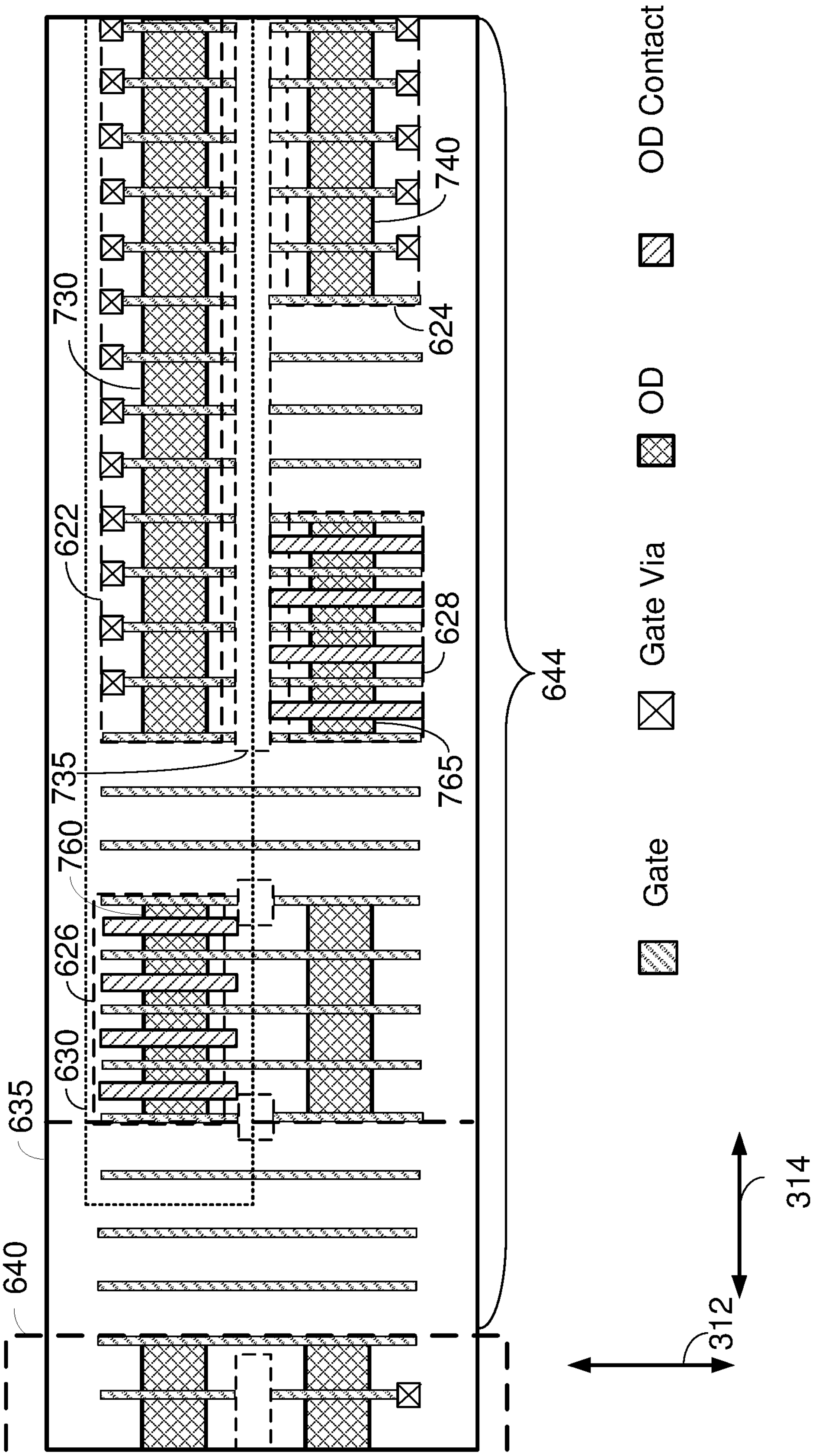
FIG. 7B shows a second portion of the exemplary implementation of the merger cell of FIG. 6A according to certain aspects of the present disclosure.
Figure 8A:
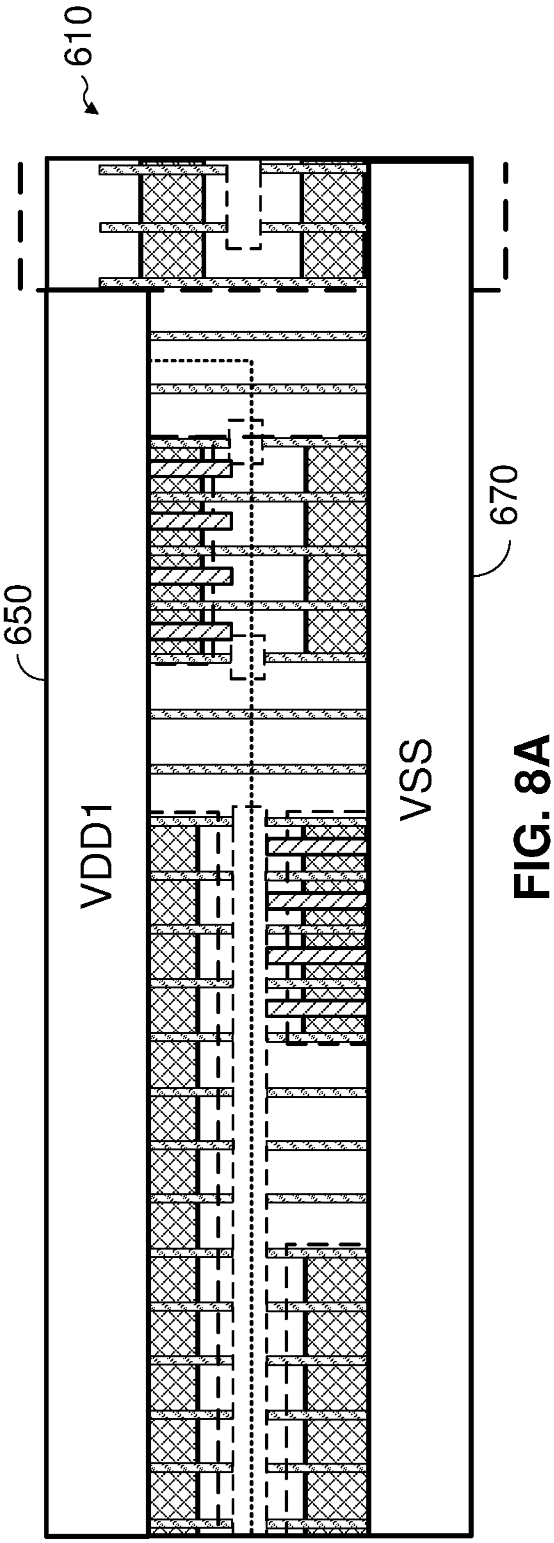
FIG. 8A shows an example of the first portion of the exemplary merger cell of FIG. 7A further including a first supply rail for a first voltage domain according to certain aspects of the present disclosure.
Figure 8B:
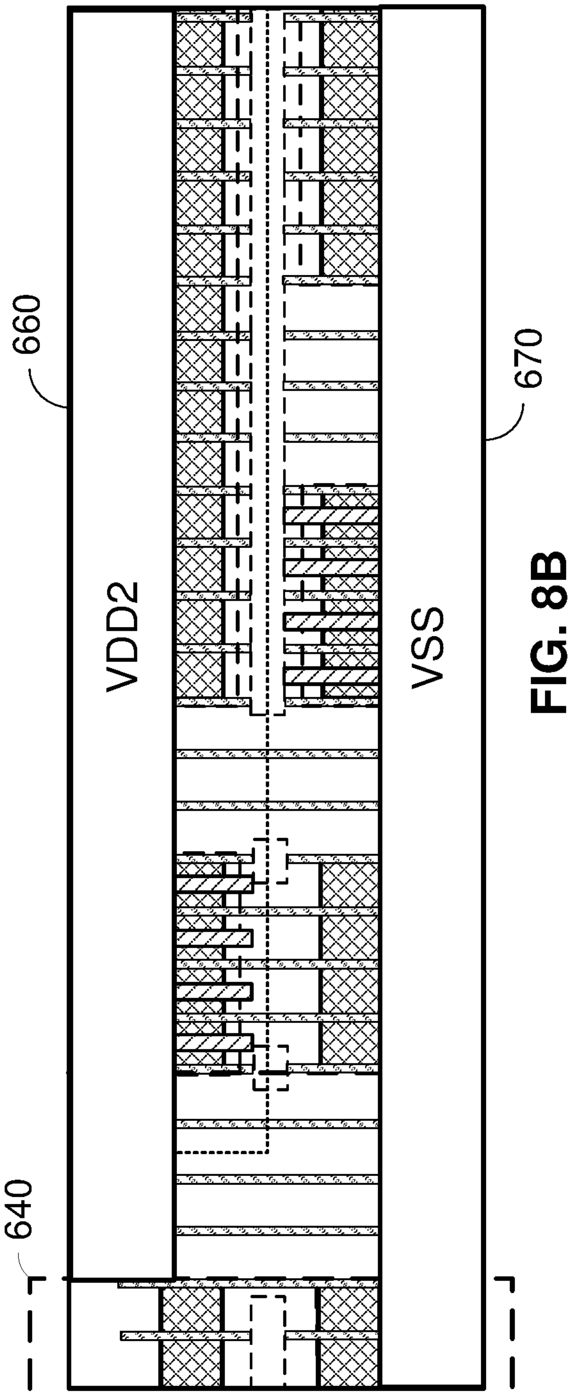
FIG. 8B shows an example of the second portion of the exemplary merger cell of FIG. 7B further including a second supply rail for a second voltage domain according to certain aspects of the present disclosure.

FIGS. 7A and 7B show an exemplary implementation of the merger cell 610 according to certain aspects. FIG. 7A shows the first portion 642 (e.g., left portion) and FIG. 7B shows the second portion 644 (e.g., right portion) of the merger cell 610. The rails 650, 660, and 670 are shown in FIGS. 8A and 8B.

As shown in FIGS. 7A and 7B, the merger cell 610 includes a row of gates (e.g., poly gates) arranged in parallel. Each of the gates is elongated and extends in the second direction 312 (e.g., vertical direction). The gates are spaced apart in the first direction 314 (e.g., horizontal direction). For example, the gates may be evenly spaced apart by a uniform cell poly pitch (CPP). In the example in FIGS. 7A and 7B, the layout (i.e., arrangement) of uniformly spaced gates in the first direction 314 (e.g., horizontal direction) is continuous across the merger cell 610. This helps eliminate the need for a termination region for the gates, which reduces the area of the merger cell 610.

The merger cell 610 also includes OD regions where each of the OD regions extend in the first direction 314 (e.g., horizontal direction). For a FinFet process, each of the OD regions may include fins (e.g., fins 210-1 to 210-4) extending in the first direction 314 (e.g., horizontal direction). As shown in FIGS. 7A and 7B, the OD regions are not present in the OD break regions 632 and 635. The OD break regions 632 and 635 separate the OD regions in the first portion 642 of the merger cell 610 from the OD regions in the second portion 644 of the merger cell 610.

In the example shown in FIG. 7A, the first p-type LOD region 612 includes an OD region 710 extending in the first direction 314 (e.g., horizontal direction). The OD region 710 may be implanted with P+ dopant. As shown in FIG. 7A, a subset of the gates (e.g., poly gates) in the merger cell 610 are formed over the OD region 710. The merger cell 610 also includes gate vias (e.g., VG vias) disposed on the gates formed over the OD region 710. The gate vias couple the gates to the first supply rail 650 (shown in FIG. 8A). This turns off the p-type devices (e.g., transistors) formed by the OD region 710 and the gates formed over the OD region 710.

The first n-type LOD region 614 includes OD region 720 extending in the first direction 314 (e.g., horizontal direction). The OD region 720 is spaced apart from the OD region 710 in the second direction 312 (e.g., vertical direction). The OD region 720 may be implanted with N+ dopant. As shown in FIG. 7A, a subset of the gates (e.g., poly gates) in the merger cell 610 are formed over the OD region 720. The merger cell 610 also includes gate vias (e.g., VG vias) disposed on the gates formed over the OD region 720. The gate vias couple the gates to the ground rail (shown in FIG. 8A). This turns off the n-type devices (e.g., transistors) formed by the OD region 720 and the gates formed over the OD region 720. In the example in FIG. 7A, a gate cut 715 (i.e., gate break) separates the gates formed over the OD region 710 from the gates formed over the OD region 720.

In the example shown in FIG. 7B, the second p-type LOD region 622 includes OD region 730 extending in the first direction 314 (e.g., horizontal direction). The OD region 730 may be implanted with P+ dopant. As shown in FIG. 7B, a subset of the gates (e.g., poly gates) in the merger cell 610 are formed over the OD region 730. The merger cell 610 also includes gate vias (e.g., VG vias) disposed on the gates formed over the OD region 730. The gate vias couple the gates to the second supply rail 660 (shown in FIG. 8B). This turns off the p-type devices (e.g., transistors) formed by the OD region 730 and the gates formed over the OD region 730.

The second n-type LOD region 624 includes OD region 740 extending in the first direction 314 (e.g., horizontal direction). The OD region 740 is spaced apart from the OD region 730 in the second direction 312 (e.g., vertical direction). The OD region 740 may be implanted with N+ dopant. As shown in FIG. 7B, a subset of the gates (e.g., poly gates) in the merger cell 610 are formed over the OD region 740. The merger cell 610 also includes gate vias (e.g., VG vias) disposed on the gates formed over the OD region 740. The gate vias couple the gates to the ground rail 670 (shown in FIG. 8B). This turns off the n-type devices (e.g., transistors) formed by the OD region 740 and the gates formed over the OD region 740. In the example in FIG. 7B, a gate cut 735 (i.e., gate break) separates the gates formed over the OD region 730 from the gates formed over the OD region 740.

In some implementations, the merger cell 610 includes gate contacts between the gates and the gate vias. The gate contacts may be formed from a gate contact layer (e.g., MP layer shown in the examples in FIGS. 1A, 1B, 1C, 2A, and 2B).

In the example in FIG. 7A, the first n-tap 616 includes OD region 750, which may be implanted with N+ dopant. The first n-tap 616 also includes OD contacts formed on the OD region 750 to provide contact with the OD region 750. The OD contacts may be formed from the source/drain contact layer discussed above (e.g., MD layer shown in examples in FIGS. 1A, 1B, 1C, 2A, and 2B). The OD contacts may be coupled to the first supply rail 650 through vias (not shown in FIG. 7A). In this example, the first n-well 620 extends underneath the OD region 750 and is coupled to the first supply rail 650 (shown in FIG. 8A) through the OD region 750 and the OD contacts. In the example in FIG. 7A, the OD region 750 is separated from the OD region 710 of the first p-type LOD region 612 by an OD break in the first direction 314 (e.g., horizontal direction). In this example, the first p-type LOD region 612 helps mitigate the local layout effect of the OD break (e.g., on a p-type device in the first cell 690 in the first voltage domain abutting the merger cell 610).

In the example in FIG. 7A, the first p-tap 618 includes OD region 755, which may be implanted with P+ dopant. The first p-tap 618 also includes OD contacts formed on the OD region 755 to provide contact with the OD region 755. The OD contacts may be formed from the source/drain contact layer discussed above (e.g., MD layer shown in examples in FIGS. 1A, 1B, 1C, 2A, and 2B). The OD contacts may be coupled to the ground rail 670 through vias (not shown in FIG. 7A). In this example, the p-substrate is coupled to the ground rail 670 (shown in FIG. 8A) through the OD region 755 and the OD contacts. In the example in FIG. 7A, the OD region 755 is separated from the OD region 720 of the first n-type LOD region 614 by an OD break in the first direction 314 (e.g., horizontal direction). In this example, the first n-type LOD region 614 helps mitigate the local layout effect of the OD break (e.g., on a n-type device in the first cell 690 in the first voltage domain abutting the merger cell 610).

In the example in FIG. 7B, the second n-tap 626 includes OD region 760, which may be implanted with N+ dopant. The second n-tap 626 also includes OD contacts formed on the OD region 760 to provide contact with the OD region 760. The OD contacts may be formed from the source/drain contact layer discussed above (e.g., MD layer shown in examples in FIGS. 1A, 1B, 1C, 2A, and 2B). The OD contacts may be coupled to the second supply rail 660 through vias (not shown in FIG. 7B). In this example, the second n-well 630 extends underneath the OD region 760 and is coupled to the second supply rail 660 (shown in FIG. 8B) through the OD region 760 and the OD contacts. In the example in FIG. 7B, the OD region 760 is separated from the OD region 730 of the second p-type LOD region 622 by an OD break in the first direction 314 (e.g., horizontal direction) In this example, the second p-type LOD region 622 helps mitigate the local layout effect of the OD break (e.g., on a p-type device in the second cell 695 in the second voltage domain abutting the merger cell 610).

In the example in FIG. 7B, the second p-tap 628 includes OD region 765, which may be implanted with P+ dopant. The second p-tap 628 also includes OD contacts formed on the OD region 765 to provide contact with the OD region 765. The OD contacts may be formed from the source/drain contact layer discussed above (e.g., MD layer shown in examples in FIGS. 1A, 1B, 1C, 2A, and 2B). The OD contacts may be coupled to the ground rail 670 through vias (not shown in FIG. 7B). In this example, the p-substrate is coupled to the ground rail 670 (shown in FIG. 8B) through the OD region 765 and the OD contacts. In the example in FIG. 7B, the OD region 765 is separated from the OD region 740 of the second n-type LOD region 624 by an OD break in the first direction 314 (horizontal direction). In this example, the second n-type LOD region 624 helps mitigate the local layout effect of the OD break (e.g., on a n-type device in the second cell 695 in the second voltage domain abutting the merger cell 610).

Figure 9:
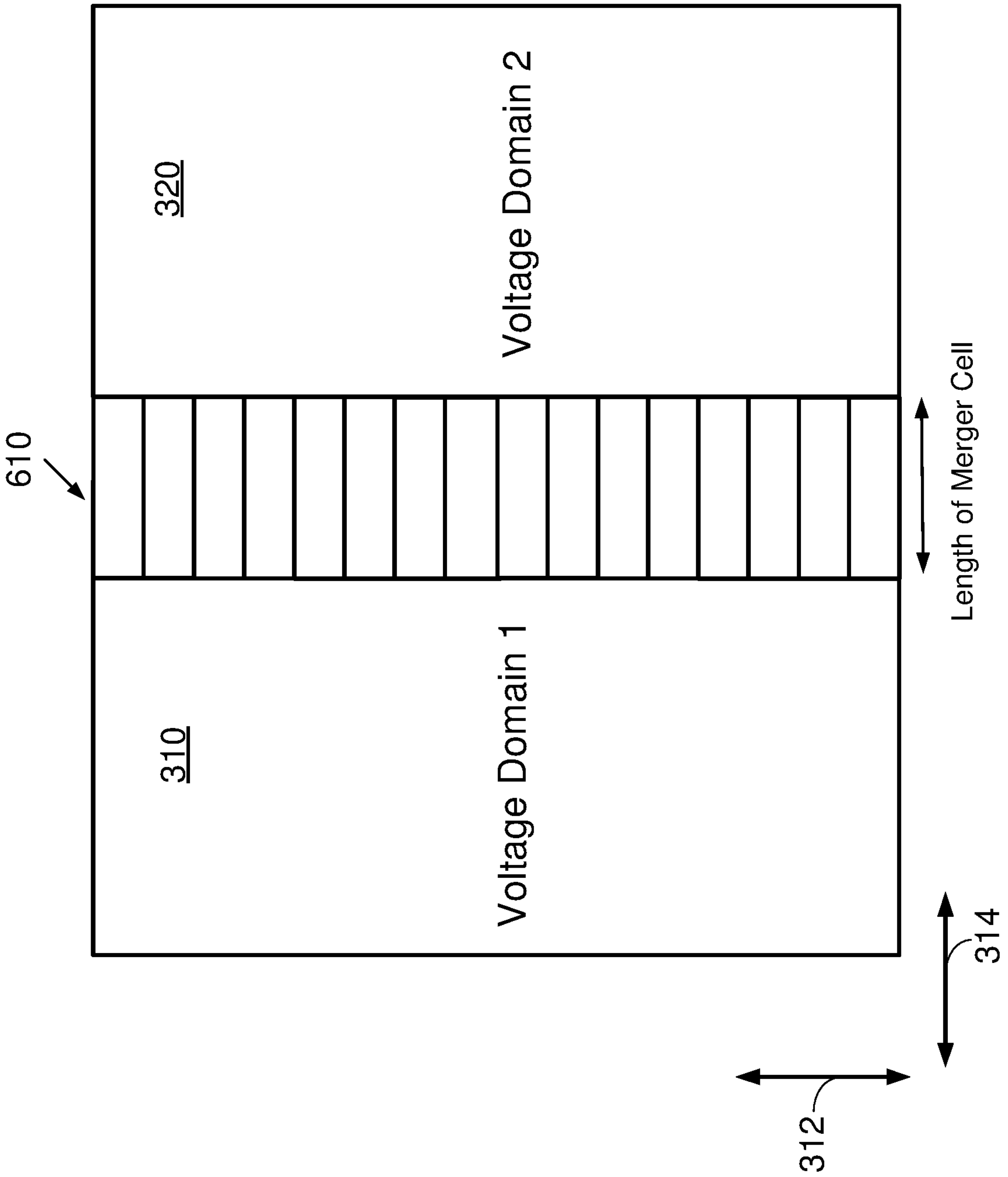
FIG. 9 shows an example of merger cells merging two voltage domains according to certain aspects of the present disclosure.

FIG. 9 shows an example in which multiple instances of the merger cell 610 are placed between the first voltage domain 310 and the second voltage domain 320 to merge the voltage domains in the first direction 314 (e.g., horizontal direction). In the example in FIG. 9, the multiple instances of the merger cell 610 are laid out side-by-side in the second direction 312. Comparing FIG. 4 with FIG. 9, the length of the merger cell 610 shown in FIG. 9 is less than the combined length of two endcap cells 410 and 420 and the empty area 345 shown in FIG. 4, which translates into a reduction in chip area.

Figure 10C:
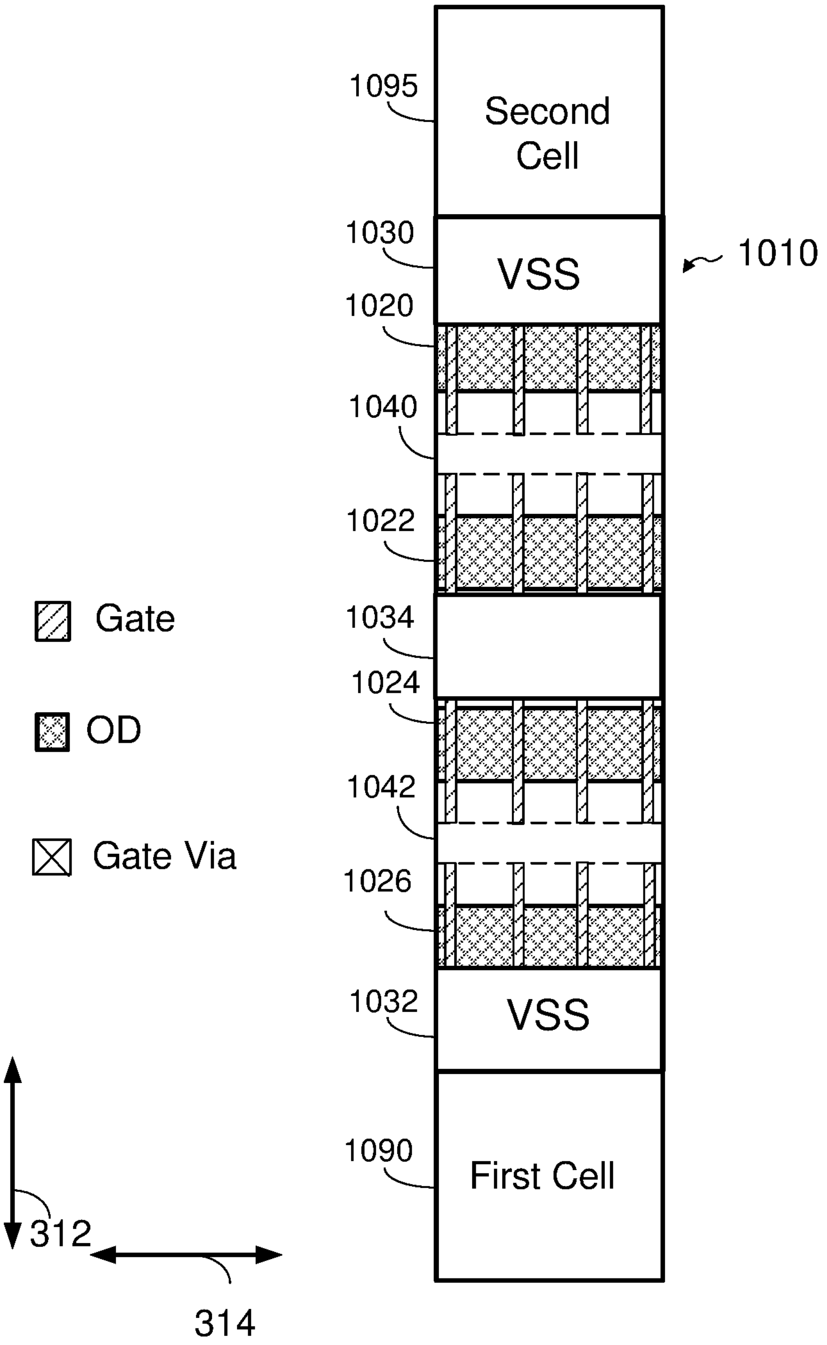
FIG. 10C shows an example of a first cell in a first voltage domain abutting a first side of the merger cell of FIG. 10A and a second cell in a second voltage domain abutting a second side of the merger cell of FIG. 10A according to certain aspects of the present disclosure.

FIGS. 10A and 10B show a top view of another example of a merger cell 1010 according to certain aspects. In the example shown in FIG. 10A, the merger cell 1010 (e.g., vertical merger cell) is configured to merge a first voltage domain and a second voltage domain (e.g., the first voltage domain 310 and the third voltage domain 330) in the second direction 312 (e.g., vertical direction). For example, a first side (e.g., bottom side) of the merger cell 1010 may abut a first cell 1090 in the first voltage domain (e.g., the first voltage domain 310), and a second side (e.g., top side) of the merger cell 1010 may abut a second cell 1095 in the second voltage domain (e.g., the third voltage domain 330), as shown in FIG. 10C. The first side and the second side are opposite sides of the merger cell 1010 (i.e., opposing sides of the merger cell 1010). The layouts of the standard cells may be specified in a standard cell library.

In this example, the merger cell 1010 includes a row of gates (e.g., poly gates) arranged in parallel. The gates are spaced apart in the first direction 314 (e.g., horizontal direction). For example, the gates may be evenly spaced apart by the CPP discussed above. Each of the gates is elongated and extends in the second direction 312 (e.g., vertical direction).

The merger cell 1010 also includes OD regions 1020, 1022, 1024, and 1026 where each of the OD regions extends in the first direction 314 (e.g., horizontal direction). For a FinFet process, each of the OD regions may include fins (e.g., fins 210-1 to 210-4) extending in the first direction (e.g., horizontal direction). The OD region 1020, 1022, 1024, and 1026 are spaced apart from one another in the second direction 312 (e.g., vertical direction). The OD regions 1022 and 1024 are between the OD regions 1020 and 1026. In certain aspects, the OD region 1022 and 1024 are floating (i.e., not coupled to a potential).

Referring to FIG. 10B, the merger cell 1010 includes a first ground rail 1030 and a second ground rail 1032, in which the OD regions 1020, 1022, 1024, and 1026 are located between the rails 1030 and 1032. The ground rails 1030 and 1032 may be formed from metal layer M0 using a lithographic and etching process. The merger cell 1010 may also include a metal line 1034 between the OD regions 1022 and 1024. The metal line 1034 may be formed from metal layer M0. In certain aspects, the metal line 1034 is not coupled to a supply voltage. In some implementations, the metal line 1034 may be omitted.

In the example shown in FIG. 10, the merger cell 1010 also includes gate vias (e.g., VG vias) disposed on the gates formed over the OD region 1020. The gate vias couple the gates formed over the OD region 1020 to the first ground rail 1030 (shown in FIG. 10B). The merger cell 1010 also includes gate vias (e.g., VG vias) disposed on the gates formed over the OD region 1026. The gate vias couple the gates formed over the OD region 1026 to the second ground rail 1032 (shown in FIG. 10B).

In the example in FIG. 10A, a gate cut 1040 (i.e., gate break) separates the gates formed over the OD region 1020 from the gates formed over the OD region 1022, and a gate cut 1042 (i.e., gate break)) separates the gates formed over the OD region 1026 from the gates formed over the OD region 1024. In the example in FIG. 10A, the gates formed over the OD regions 1022 and 1024 are contiguous in the second direction 312 (e.g., vertical direction).

Figure 11:
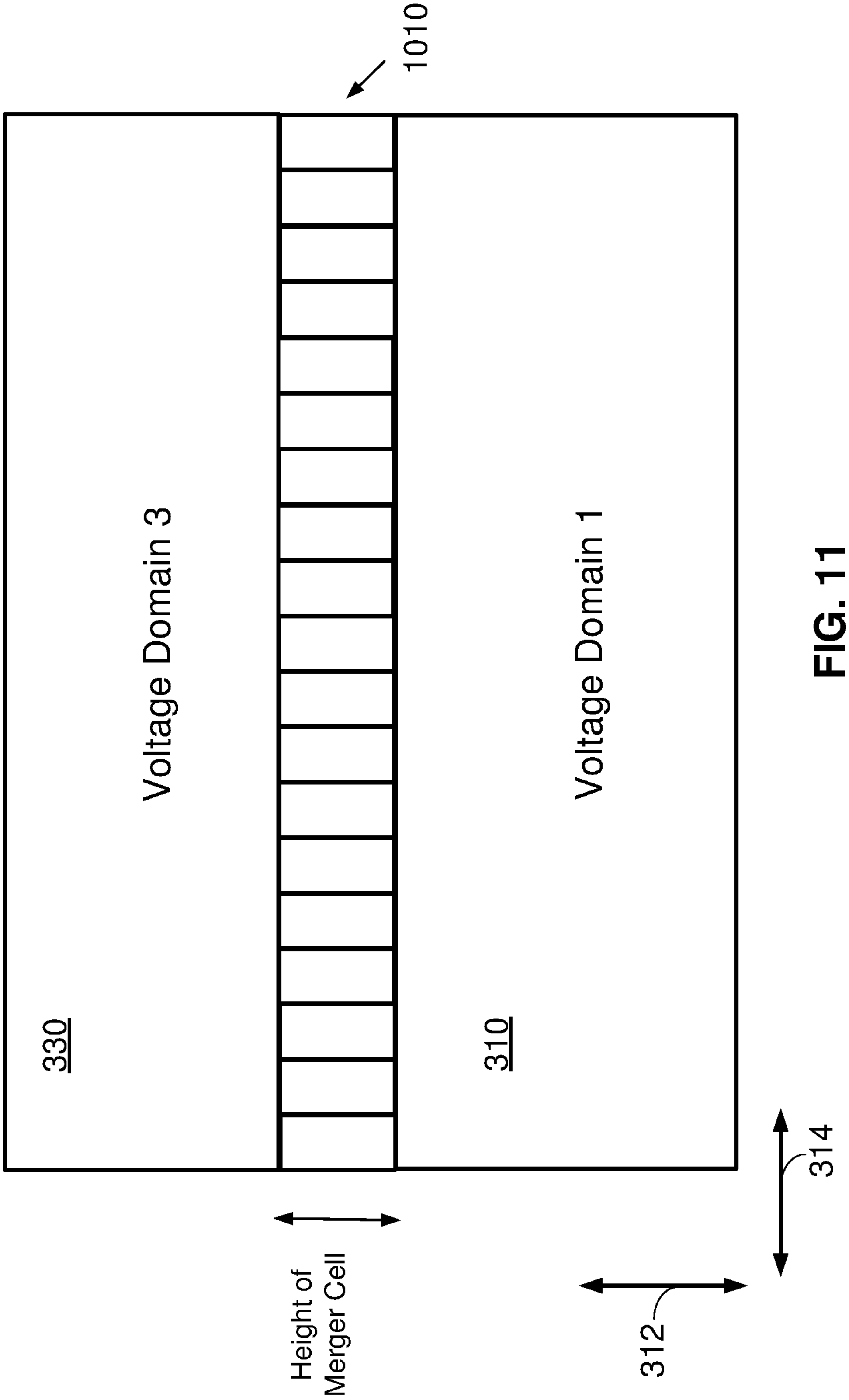
FIG. 11 shows another example of merger cells merging two voltage domains according to certain aspects of the present disclosure.

FIG. 11 shows an example in which multiple instances of the merger cell 1010 are placed between the first voltage domain 310 and the third voltage domain 330 to merge the voltage domains in the second direction (e.g., vertical direction). In the example in FIG. 11, the multiple instances of the merger cell 610 are laid out side-by-side in the first direction 314. Comparing FIG. 5 with FIG. 11, the height of the merger cell 1010 shown in FIG. 11 is less than the combined height of two endcap cells 510 and 520 and the empty area 340 shown in FIG. 5, which translates into a reduction in chip area.

Figure 12A:
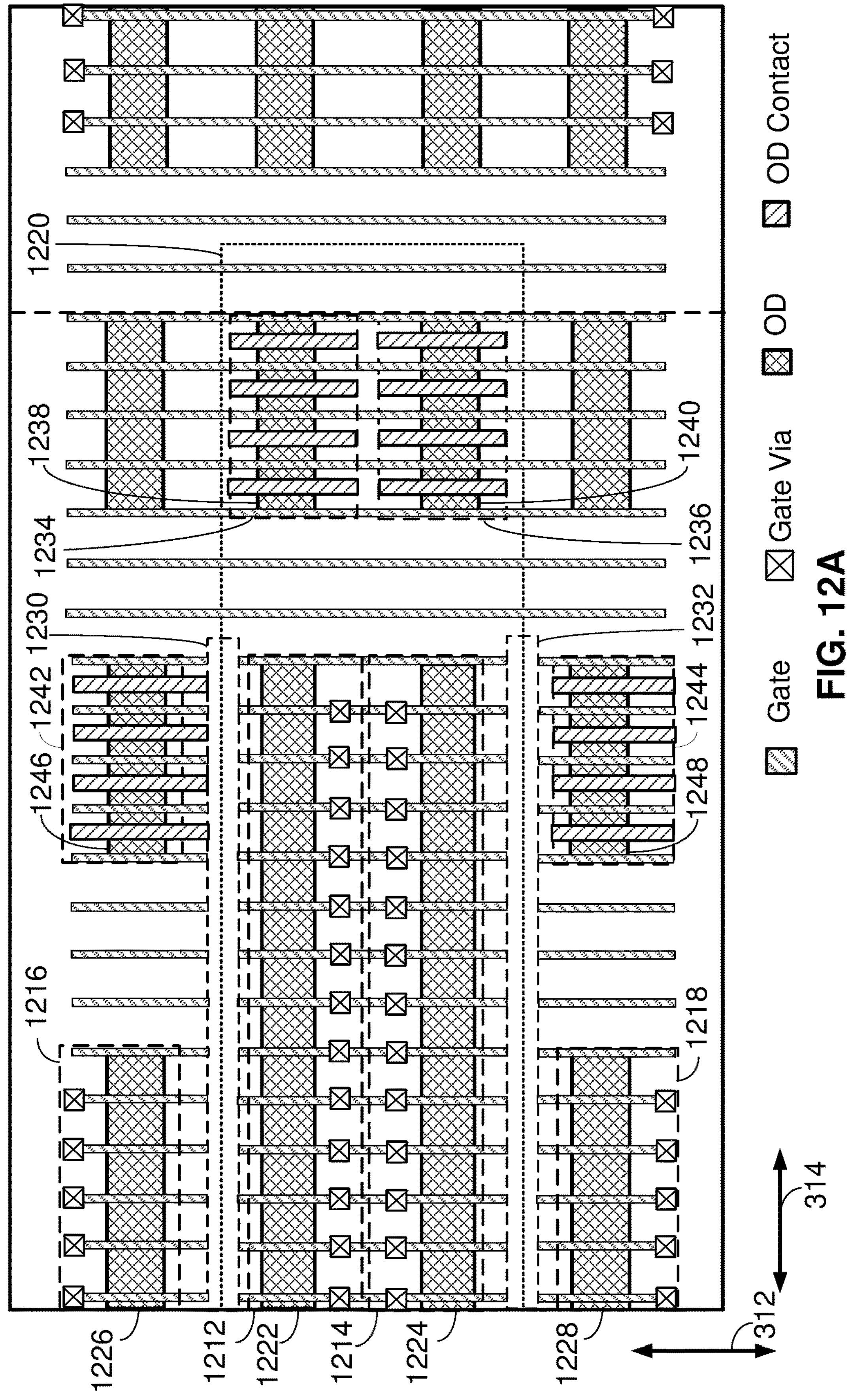
FIG. 12A shows another example of a merger cell according to certain aspects of the present disclosure.
Figure 12B:
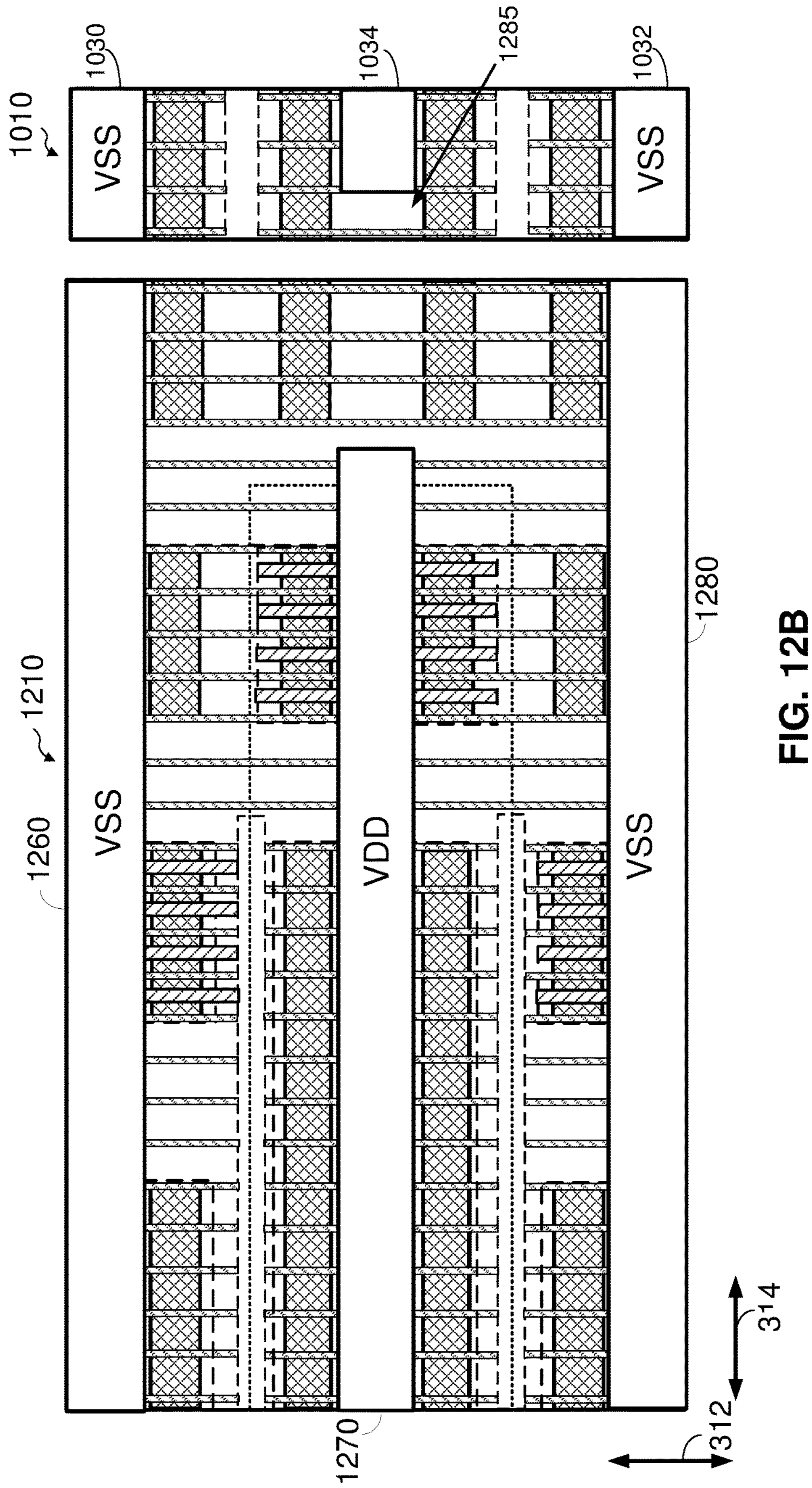
FIG. 12B shows an example of the merger cell of FIG. 12A further including a supply rail according to certain aspects of the present disclosure.

FIGS. 12A and 12B show a top view of an example of a merger cell 1210 according to certain aspects. The merger cell 1210 (e.g., corner merger cell) is configured to merge a first voltage domain and a second voltage domain (e.g., the first voltage domain 310 and the second voltage domain 320) at an L corner of the first voltage domain. For example, the merger cell 1210 may be placed at the corner 355 of the first voltage domain 310 shown in FIG. 3. In this example, the left side and the bottom side of the merger cell 1210 may abut one or more standard cells in the first voltage domain 310. Also, an instance of the merger cell 610 (e.g., horizontal merger cell) may abut the top side of the merger cell 1210, and an instance of the merger cell 1010 (e.g., vertical merger cell) may abut the left side of the merger cell 1210, as discussed further below.

The merger cell 1210 includes a first p-type LOD region 1212, a second p-type LOD region 1214, an n-well 1220, a first n-tap 1234, a second n-tap 1236, a first n-type LOD region 1216, a second n-type LOD region 1218, a first p-tap 1242, and a second p-tap 1244. As shown in FIG. 12B, the merger cell 1210 also includes a first ground rail 1260, a second ground rail 1280, and a supply rail 1270. Note that the first ground rail 1260, the second ground rail 1280, and the supply rail 1270 are not shown in FIG. 12A in order to show structures underneath the rails.

The first p-type LOD region 1212 extends in the first direction 314 and may be used to mitigate the local layout effect. The first p-type LOD region 1212 includes an OD region 1222 extending in the first direction 314 (e.g., horizontal direction). The OD region 1222 may be implanted with P+ dopant with the n-well 1220 extending underneath the OD region 1222. The merger cell 1210 includes gates formed over the OD region 1222 and gate vias (e.g., VG vias) coupling the gates formed over the OD region 1222 to the supply rail 1270 (shown in FIG. 12B). This turns off the p-type devices (e.g., transistors) formed by the OD region 1222 and the gates formed over the OD region 1222.

The second p-type LOD region 1214 may be a second instance of the first p-type LOD region 1212 that is flipped in the second direction (e.g., vertical direction). The second p-type LOD region 1214 includes an OD region 1224 extending in the first direction 314 (e.g., horizontal direction). The OD region 1224 may be implanted with P+ dopant with the n-well 1220 extending underneath the OD region 1224. The merger cell 1210 includes gates formed over the OD region 1224 and gate vias (e.g., VG vias) coupling the gates formed over the OD region 1224 to the supply rail 1270 (shown in FIG. 12B).

The first n-type LOD region 1216 extends in the first direction 314 and may also be used to mitigate the local layout effect. The first p-type LOD region 1212 and the first n-type LOD region 1216 are spaced apart in the second direction 312. The first n-type LOD region 1216 includes OD region 1226 extending in the first direction 314 (e.g., horizontal direction). The OD region 1226 may be implanted with N+ dopant. The merger cell 1210 also includes gates formed over the OD region 1226 and gate vias (e.g., VG vias) coupling the gates formed over the OD region 1226 to the first ground rail 1260 (shown in FIG. 12B). This turns off the n-type devices (e.g., transistors) formed by the OD region 1226 and the gates formed over the OD region 1226. In the example in FIG. 12A, a gate cut 1230 (i.e., gate break) separates the gates formed over the OD region 1222 from the gates formed over the OD region 1226.

The second n-type LOD region 1218 may be a second instance of the first n-type LOD region 1216 that is flipped in the second direction 312. The second n-type LOD region 1218 extends in the first direction 314 and may also be used to mitigate the local layout effect. The second p-type LOD region 1214 and the second n-type LOD region 1218 are spaced apart in the second direction 312. The second n-type LOD region 1218 includes OD region 1228 extending in the first direction 314 (e.g., horizontal direction). The OD region 1228 may be implanted with N+ dopant. The merger cell 1210 also includes gates formed over the OD region 1228 and gate vias (e.g., VG vias) coupling the gates formed over the OD region 1228 to the second ground rail 1280 (shown in FIG. 12B). This turns off the n-type devices (e.g., transistors) formed by the OD region 1228 and the gates formed over the OD region 1228. In the example in FIG. 12A, a gate cut 1232 (i.e., gate break) separates the gates formed over the OD region 1224 from the gates formed over the OD region 1228.

In the example in FIG. 12A, the first n-tap 1234 includes OD region 1238, which may be implanted with N+ dopant. The first n-tap 1234 also includes OD contacts formed on the OD region 1238 to provide contact with the OD region 1238. The OD contacts may be formed from the source/drain contact layer discussed above (e.g., MD layer shown in examples in FIGS. 1A, 1B, 1C, 2A, and 2B). The OD contacts may be coupled to the supply rail 1270 through vias (not shown in FIG. 12A). In this example, the n-well 1220 extends underneath the OD region 1238 and is coupled to the supply rail 1270 (shown in FIG. 12B) through the OD region 1238 and the OD contacts. In the example in FIG. 12A, the OD region 1238 is separated from the OD region 1222 of the first p-type LOD region 1212 by an OD break in the first direction 314 (e.g., horizontal direction). In this example, the first p-type LOD region 1212 helps mitigate the local layout effect of the OD break.

The second n-tap 1236 includes OD region 1240, which may be implanted with N+ dopant. The second n-tap 1236 also includes OD contacts formed on the OD region 1240 to provide contact with the OD region 71240. The OD contacts may be formed from the source/drain contact layer discussed above (e.g., MD layer shown in examples in FIGS. 1A, 1B, 1C, 2A, and 2B). The OD contacts may be coupled to the supply rail 1270 through vias (not shown in FIG. 12A). In this example, the n-well 1220 extends underneath the OD region 1240 and is coupled to the supply rail 1270 (shown in FIG. 12B) through the OD region 1240 and the OD contacts. In the example in FIG. 12A, the OD region 1240 is separated from the OD region 1224 of the second p-type LOD region 1214 by an OD break in the first direction 314 (e.g., horizontal direction) In this example, the second p-type LOD region 1214 helps mitigate the local layout effect of the OD break.

In the example in FIG. 12A, the first p-tap 1242 includes OD region 1246, which may be implanted with P+ dopant. The first p-tap 1242 also includes OD contacts formed on the OD region 1246 to provide contact with the OD region 1246. The OD contacts may be formed from the source/drain contact layer discussed above (e.g., MD layer shown in examples in FIGS. 1A, 1B, 1C, 2A, and 2B). The OD contacts may be coupled to the first ground rail 1260 through vias (not shown in FIG. 12A). In this example, the p-substrate is coupled to the first ground rail 1260 (shown in FIG. 12B) through the OD region 1246 and the OD contacts. In the example in FIG. 12A, the OD region 1246 is separated from the OD region 1226 of the first n-type LOD region 1216 by an OD break in the first direction 314 (e.g., horizontal direction). In this example, the first n-type LOD region 1216 helps mitigate the local layout effect of the OD break.

In the example in FIG. 12A, the second p-tap 1244 includes OD region 1248, which may be implanted with P+ dopant. The second p-tap 1244 also includes OD contacts formed on the OD region 1248 to provide contact with the OD region 1248. The OD contacts may be formed from the source/drain contact layer discussed above (e.g., MD layer shown in examples in FIGS. 1A, 1B, 1C, 2A, and 2B). The OD contacts may be coupled to the second ground rail 1280 through vias (not shown in FIG. 12A). In this example, the p-substrate is coupled to the second ground rail 1268 (shown in FIG. 12B) through the OD region 1248 and the OD contacts. In the example in FIG. 12A, the OD region 1248 is separated from the OD region 1228 of the second n-type LOD region 1218 by an OD break in the first direction 314 (e.g., horizontal direction). In this example, the second n-type LOD region 1218 helps mitigate the local layout effect of the OD break.

Referring to FIG. 12B, the supply rail 1270 is located between the first ground rail 1260 and the second ground rail 1280 in the second direction 312 (e.g., vertical direction). The supply rail 1270 may be part of a longer supply rail that extends into the first voltage domain (e.g., first voltage domain 310) abutting the left side of the merger cell 1210. In this example, the supply voltage of the supply rail 1270 is the first supply voltage of the first voltage domain. Each of the first ground rail 1260, the second ground rail 1280, and the supply rail 1270 may be formed from metal layer M0 (e.g., using a lithographic and etching process). In this example, each of the ground rails 1260 and 1280 are contiguous across the merger cell 1210 in the first direction 314 (e.g., horizontal direction). The supply rail 1270 extends partially across the merger cell 1210, in which the supply rail 1270 is separated from the right side of the merger cell 1210 in the first direction 314 (e.g., horizontal direction).

Figure 13A:
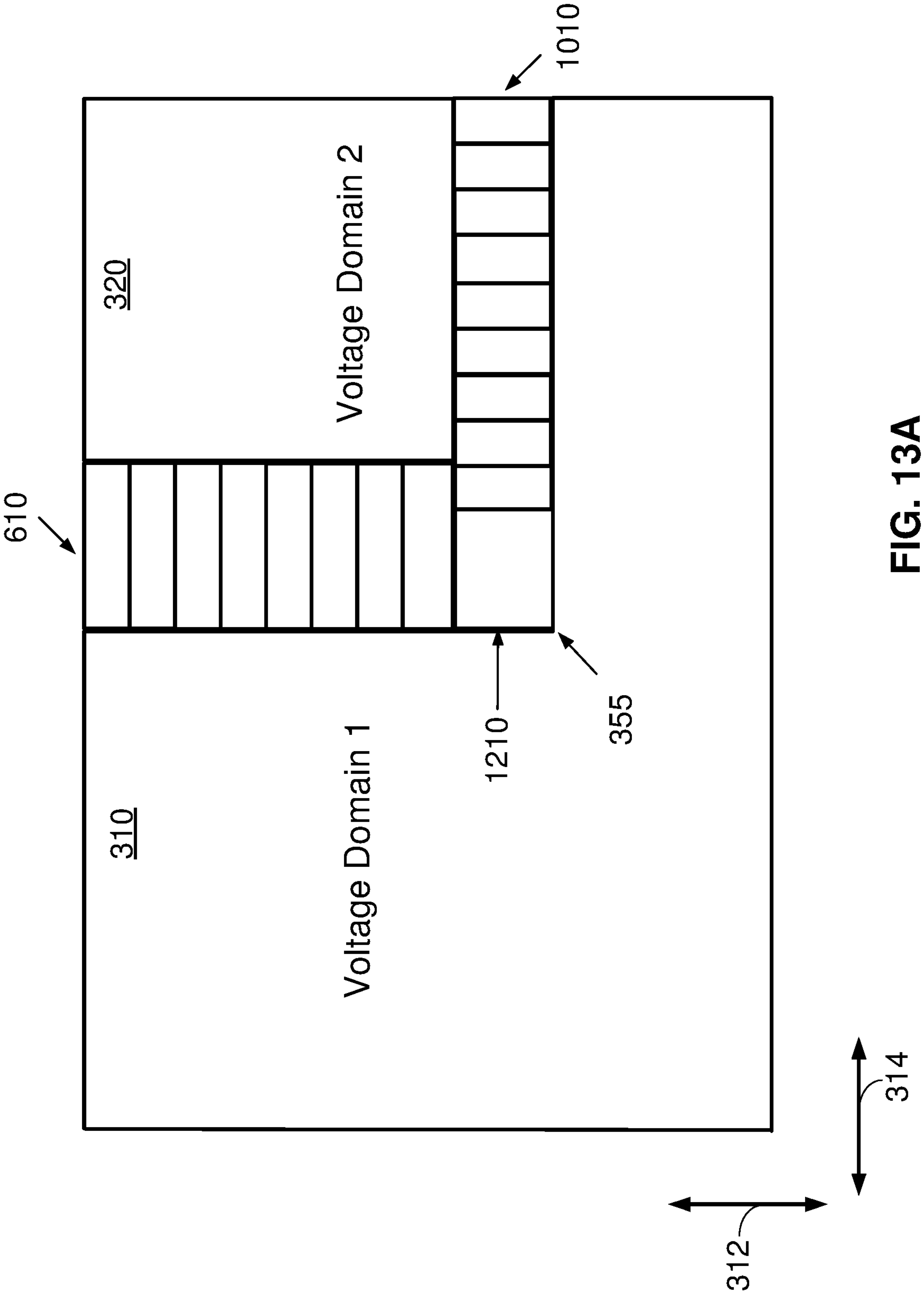
FIG. 13A shows another example of merger cells merging two voltage domains according to certain aspects of the present disclosure.

FIG. 13A shows an example in which the merger cell 1210 is placed at the L corner 355 of the first voltage domain 310. In this example, the left side and the bottom side of the merger cell 1210 abuts the first voltage domain 310. In the example in FIG. 13A, multiple instances of the merger cell 610 are placed between the first voltage domain 310 and the second voltage domain 320 to merge the voltage domains in the first direction (e.g., horizontal direction). The multiple instances of the merger cell 610 are laid out side-by-side in the second direction 312 as shown in FIG. 13A, in which one of the instances of the merger cell 610 abuts the top side of the merger cell 1210. Also, in this example, multiple instances of the merger cell 1010 are placed between the first voltage domain 310 and the second voltage domain 320 to merge the voltage domains in the second direction 312 (e.g., vertical direction). The multiple instances of the merger cell 1010 are laid out side-by-side in the first direction 314 as shown in FIG. 13A, in which one of the instances of the merger cell 1010 abuts the right side of the merger cell 1210.

FIG. 12B shows an example of an instance of the merger cell 1010 to the right of the merger cell 1210. Although FIG. 12B shows a small gap between the merger cells 1210 and 1010 to better distinguish the merger cell 1010 from the merger cell 1210 in FIG. 12B, it is to be appreciated that the merger cell 1010 may abut the right side of the merger cell 1210. In this example, the first ground rail 1260 of the merger cell 1210 and the first ground rail 1030 of the merger cell 1010 are aligned in the second direction 312, and the second ground rail 1280 of the merger cell 1210 and the second ground rail 1032 of the merger cell 1010 are aligned in the second direction 312.

In the example in FIG. 12B, the supply rail 1270 of the merger cell 1210 is aligned with the metal line 1034 of the merger cell 1010 in the second direction 312. The metal line 1034 is separated from the supply rail 1270 by the gap between the supply rail 1270 and the right side of the merger cell 1210, which helps isolate the metal line 1034 from the supply voltage on the supply rail 1270. A portion 1285 of the metal line 1034 abutting the merger cell 1210 may be removed to provide additional separation between the supply rail 1270 and the metal line 1034, as shown in the example in FIG. 12B. It is to be appreciated that the metal line 1034 may remain contiguous in the other instances of the merger cell 1010 shown in FIG. 13A that do not abut the merger cell 1210.

Figure 13B:
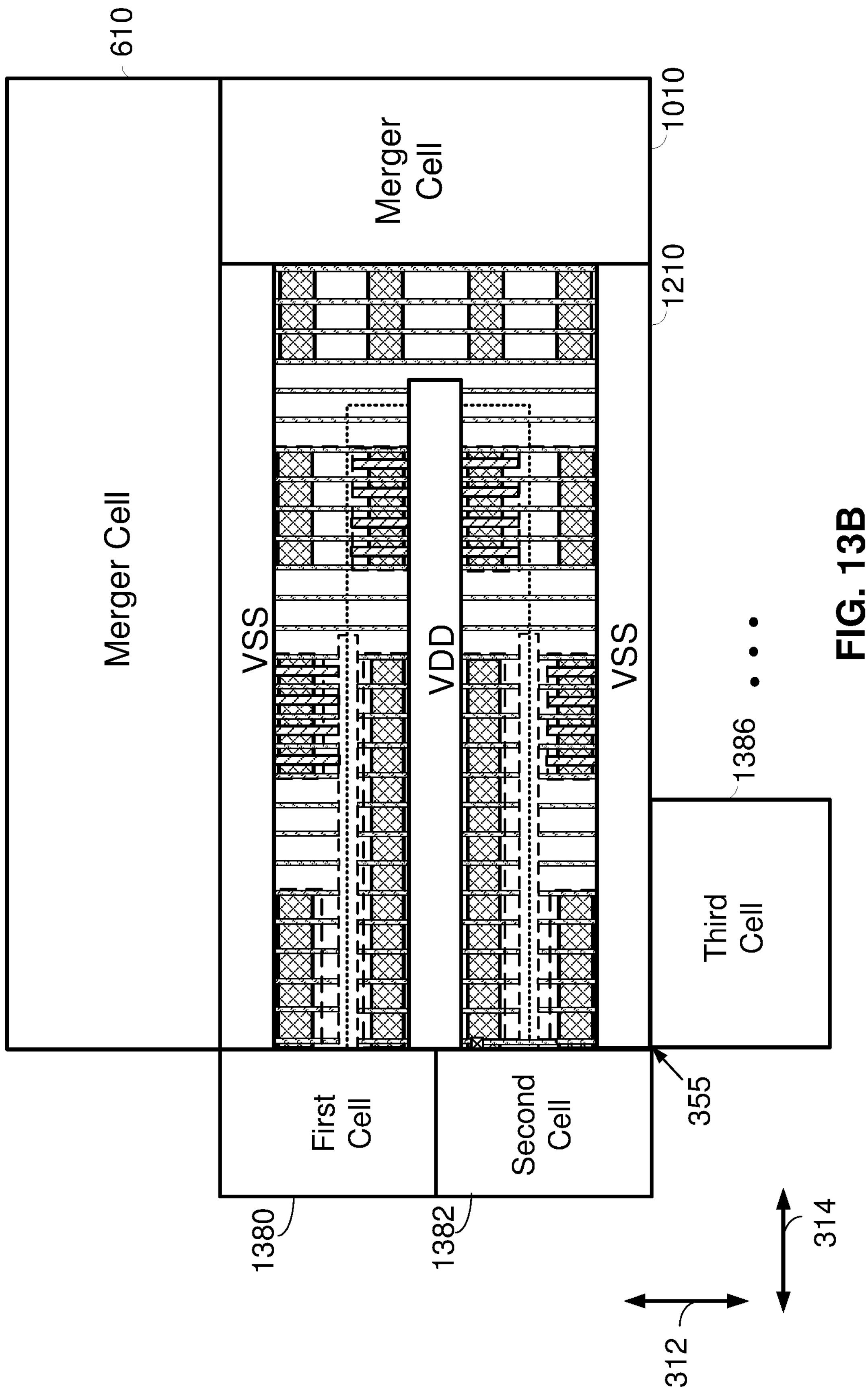
FIG. 13B shows an example of cells and merger cells abutting the merger cell of FIG. 12B according to certain aspects of the present disclosure.

FIG. 13B shows an example of cells in the first voltage domain 310 abutting the exemplary merger cell 1210 at the L corner 355 of the first voltage domain 310 according to certain aspects. More particularly, FIG. 13B shows an example of a first cell 1380 and a second cell 1382 in the first voltage domain 310 abutting a first side (e.g., left side) of the merger cell 1210. The first cell 1380 and the second cell 1382 may be in different rows of the first voltage domain 310. FIG. 13B also shows an example of a third cell 1386 in the first voltage domain 310 abutting a second side (e.g., bottom side) of the merger cell 1210 in which the second side is adjacent to the first side. Although one cell (i.e., the third cell 1386) is shown abutting the second side (e.g., bottom side) of the merger cell 1210 in FIG. 13B for simplicity, it is to be appreciated that the first voltage domain 310 may include two or more cells abutting the second side of the merger cell 1210. Thus, the first voltage domain 310 may include one or more cells abutting the second side of the merger cell 1210.

In the example in FIG. 13B, an instance of the merger cell 1010 abuts a third side (e.g., right side) of the merger cell 1210 in which the third side is opposite the first side of the merger cell 1210. The instance of the merger cell 1010 may be implemented with any one of the exemplary implementations shown in FIGS. 10A, 10B, and 12B discussed above. Also, in this example, an instance of the merger cell 610 abuts a fourth side (e.g., top side) of the merger cell 1210 in which the fourth side is opposite the second side and adjacent to each of the first side and the third side of the merger cell 1210. The instance of the merger cell 610 may be implemented with any one of the exemplary implementations shown in FIGS. 6A, 6B, 6C, 7A, 7B, 8A, and 8B.

Figure 14A:
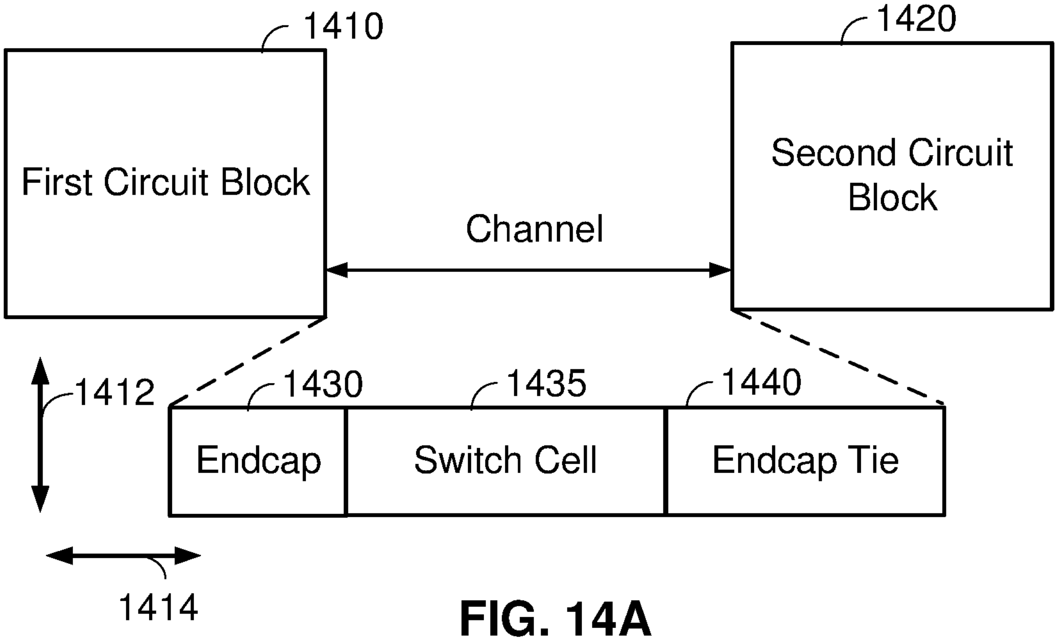
FIG. 14A shows an example of an endcap cell, a switch cell, and an endcap tie cell between a first circuit block and a second circuit block according to certain aspects of the present disclosure.

FIG. 14A shows an example of a first circuit block 1410 and a second circuit block 1420 integrated on a chip (i.e., a die) according to certain aspects. The first circuit block 1410 and the second circuit block 1420 are separated in a first direction 1414 (e.g., horizontal direction). In this example, the chip includes one or more endcap cells 1430 arranged along a boundary of the first circuit block 1410 in a second direction 1412 (e.g., vertical direction) and one or more endcap tie cells 1440 arranged along a boundary of the second circuit block 1420 in the second direction 1412 (e.g., vertical direction). For case of illustration, one endcap cell 1430 and one endcap tie cell 1440 are shown in FIG. 14A. Each endcap cell 1430 includes a termination region (also referred to as a termination logic) for base layer termination. Each endcap tie cell 1440 is an endcap cell that also includes a p-tap (e.g., to prevent latch-up).

The chip may also include one or more switch cells 1435 where each switch cell 1435 includes one or more switches (e.g., head switches) to provide power gating for the first circuit block 1410, the second circuit block 1420, and/or another circuit block, as discussed further below. For the example where the switches are head switches, each of the switches may be implemented with a respective p-type transistor. Each switch cell 1435 may also include one or more n-taps and one or more p-taps (i.e., to prevent latch-up). In the example in FIG. 14A, each switch cell 1435 may be disposed between a respective endcap cell 1430 and a respective endcap tie cell 1440.

Figure 14B:
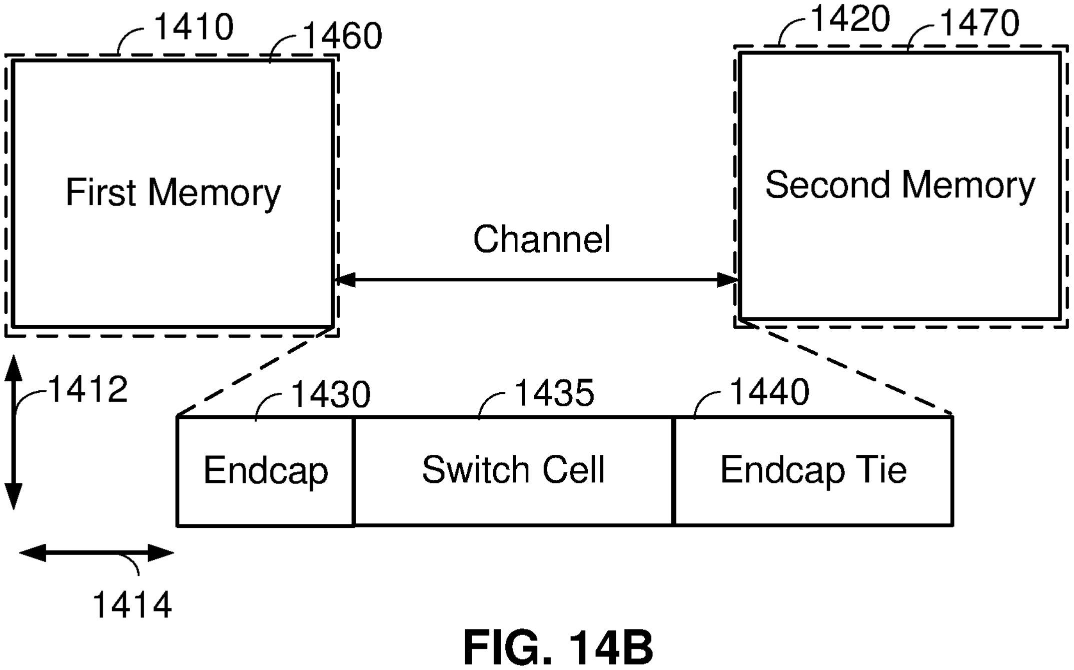
FIG. 14B shows an example in which the first circuit block of FIG. 14A includes a first memory bank and the second circuit block of FIG. 14A includes a second memory bank according to certain aspects of the present disclosure.

FIG. 14B shows an example in which the first circuit block 1410 includes a first memory bank 1460 and the second circuit block 1420 includes a second memory bank 1470. In this example, each of the memory banks 1460 and 1470 may include high-density bit cells for storing data and/or instructions (e.g., for a central processing unit (CPU)). However, it is to be appreciated that the first circuit block 1410 and the second circuit block 1420 are not limited to this example.

Figure 15:
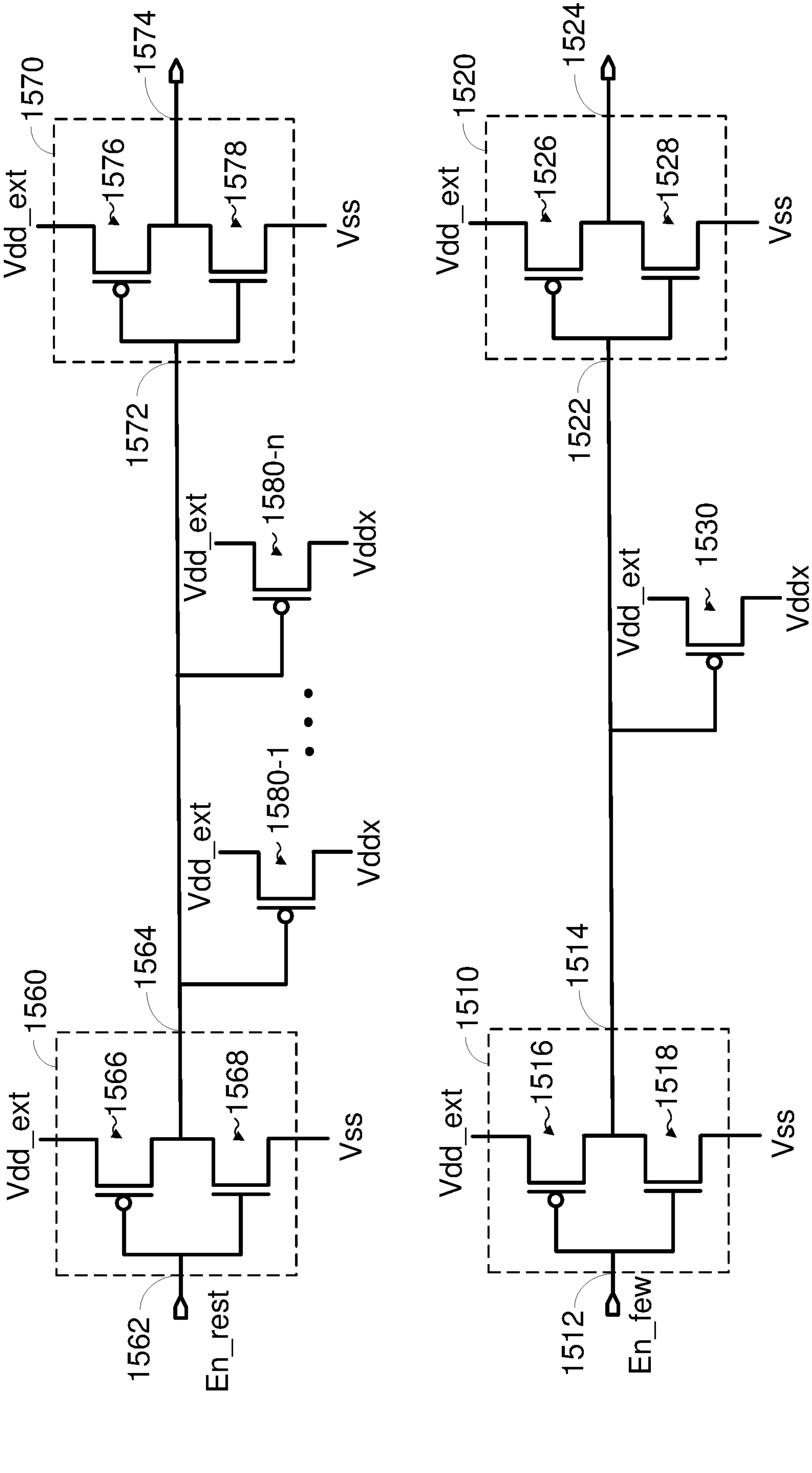
FIG. 15 shows an example of switches and drivers according to certain aspects of the present disclosure.

FIG. 15 is a circuit diagram showing an example of switches and drivers that may be included in the switch cell 1435 according to certain aspects. The switches include one or more few switches 1530 and rest switches 1580-1 to 1580-*n*. The one or more few switches 1530 are used to prevent a large inrush current during initial power up, and the rest switches 1580-1 to 1580-*n* are used to provide low resistor-current (IR) voltage drops after initial power up, as discussed further below. In the example shown in FIG. 15, each of the switches 1530 and 1580-1 to 1580-*n* is implemented with a respective p-type transistor. However, it is to be appreciated that the present disclosure is not limited to this example. The drivers (also referred to as switch drivers) include input driver 1510 and output driver 1520 for the one or more few switches 1530, and input driver 1560 and output driver 1570 for the rest switches 1580-1 to 1580-*n*.

In the example in FIG. 15, each of the one or more few switches 1530 are coupled between an external supply bus Vdd_ext and an internal supply bus Vddx. The external supply bus Vdd_ext may be coupled to a power source (e.g., a power management integrated circuit (PMIC)) and the internal supply bus Vddx may be used to provide power to the first circuit block 1410, the second circuit block 1420, and/or another circuit block. Each of the supply buses may include one or more supply rails (e.g., formed from metal layer M0, metal layer M1, or any combination thereof). For the example where each of the one or more few switches 1530 is implemented with a respective transistor, the one/off state of each of the one or more few switches 1530 is controlled by controlling the voltage at the respective gate. When the one or more few switches 1530 are turned on, the one or more few switches 1530 couple the internal supply bus Vddx to the external supply bus Vdd_ext through the one or more few switches 1530. When the one or more few switches 1530 are turned off, the one or more few switches 1530 decouple the internal supply bus Vddx from the external supply bus Vdd_ext (e.g., to power collapse the first circuit block 1410, the second circuit block 1420, and/or the other circuit block).

In the example in FIG. 15, each of the rest switches 1580-1 to 1580-*n* is coupled between the external supply bus Vdd_ext and the internal supply bus Vddx. For the example where each of the rest switches 1580-1 to 1580-*n* is implemented with a respective transistor, the one/off state of each of the rest switches 1580-1 to 1580-*n* is controlled by controlling the voltage at the respective gate. When the rest switches 1580-1 to 1580-*n* are turned on, the rest switches 1580-1 to 158-*n* couple the internal supply bus Vddx to the external supply bus Vdd_ext through the rest switches 1580-1 to 1580-*n*. As discussed further below, the rest switches 1580-1 to 1580-*n* may have a much lower on resistance than the one or more few switches 1530. As used herein, the on resistance of a switch is the resistance of the switch when the switch is turned on.

The input driver 1510 has an input 1512 and an output 1514. The input 1512 is configured to receive a first enable signal (labeled "En_few") and the output 1514 is coupled to the gates of the one or more few switches 1530. The output driver 1520 has an input 1522 and an output 1524 where the input 1522 is coupled to the output 1514 of the input driver 1510. In this example, the input driver 1510 includes a p-type transistor 1516 and an n-type transistor 1518 in which the gates of the transistors 1516 and 1518 are coupled to the input 1512, the source of the p-type transistor 1516 is coupled to the external supply bus Vdd_ext, the source of the n-type transistor 1518 is coupled to ground, and the drains of the transistors 1516 and 1518 are coupled to the output 1514. The output driver 1520 includes a p-type transistor 1526 and an n-type transistor 1528 in which the gates of the transistors 1526 and 1528 are coupled to the input 1522, the source of the p-type transistor 1526 is coupled to the external supply bus Vdd_ext, the source of the n-type transistor 1528 is coupled to ground, and the drains of the transistors 1526 and 1528 are coupled to the output 1524.

The input driver 1560 has an input 1562 and an output 1564. The input 1562 is configured to receive a second enable signal (labeled "En_rest") and the output 1564 is coupled to the gates of the rest switches 1580-1 to 1580-*n*. The output driver 1570 has an input 1572 and an output 1574 where the input 1572 is coupled to the output 1564 of the input driver 1560. In this example, the input driver 1560 includes a p-type transistor 1566 and an n-type transistor 1568 in which the gates of the transistors 1566 and 1568 are coupled to the input 1562, the source of the p-type transistor 1566 is coupled to the external supply bus Vdd_ext, the source of the n-type transistor 1568 is coupled to ground, and the drains of the transistors 1566 and 1568 are coupled to the output 1564. The output driver 1570 includes a p-type transistor 1576 and an n-type transistor 1578 in which the gates of the transistors 1576 and 1578 are coupled to the input 1572, the source of the p-type transistor 1576 is coupled to the external supply bus Vdd_ext, the source of the n-type transistor 1578 is coupled to ground, and the drains of the transistors 1576 and 1578 are coupled to the output 1574.

In this example, the first circuit block 1410, the second circuit block 1420, and/or the other circuit block are power collapsed when the one or more few switches 1530 and the rest switches 1580-1 to 1580-*n* are turned off. For example, the first circuit block 1410, the second circuit block 1420, and/or the other circuit block may be power collapsed to conserve power when the first circuit block 1410, the second circuit block 1420, and/or the other circuit block are not active.

The first circuit block 1410, the second circuit block 1420, and/or the other circuit block may be powered up from the collapsed power state based on a power up sequence. During the power sequence, the first enable signal (labeled "En_few") is input to the input driver 1510 to cause the input driver 1510 to turn on the one or more few switches 1530. The one or more few switches 1530 have a large on resistance compared with the rest switches 1580-1 to 1580-*n*. The large on resistance limits the current flow from the external supply bus Vdd_ext to the internal supply bus Vddx during initial power up, which prevents a large inrush current from flowing from the external supply bus Vdd_ext to the internal supply bus Vddx. The output driver 1520 may output the first enable signal to another switch cell (not shown) coupled to the output 1524 of the output driver 1520. In certain aspects, the output driver 1520 may output the first enable signal to switch control logic to indicate that the one or more few switches 1530 have been turned on.

After the one or more few switches 1530 have been turned on, the second enable signal (labeled "En_rest") is input to the input driver 1560 to cause the input driver 1560 to turn on the rest switches 1580-1 to 1580-*n*. The rest switches 1580-1 to 1580-*n* have a small on resistance to provide low IR voltage drops between the external supply bus Vdd_ext and the internal supply bus Vddx after initial power up. The output driver 1570 may output the second enable signal to another switch cell (not shown) coupled to the output 1574 of the output driver 1570. In certain aspects, the output driver 1570 may output the second enable signal to switch control logic to indicate that the rest switches 1580-1 to **1580-*n*** have been turned on.

Returning to FIGS. 14A and 14B, it is desirable to reduce the channel length between the first circuit block 1410 and the second circuit block 1420 in order to reduce the area between first circuit block 1410 and the second circuit block 1420. The smallest possible channel length between the first circuit block 1410 and the second circuit block 1420 depends on the combined length of the endcap cell 1430, the switch cell 1435, and the endcap tie cell 1440 in the first direction 1414 (i.e., the sum of the lengths of the endcap cell 1430, the switch cell 1435, and the endcap tie cell 1440 in the first direction 1414). A challenge with reducing the channel length is that the switch cell 1435 and the endcap tie cell 1440 each have one or more integrated p-taps. This results in redundant p-taps when the switch cell 1435 is abutted with the endcap tie cell 1440. The redundant p-taps increase the combined length of the switch cell 1435 and the endcap tie cell 1440, which increases the channel length (and hence the area) between the first circuit block 1410 and the second circuit block 1420.

To address the above, aspects of the present disclosure provide an endcap switch cell that integrates features of an endcap tie cell (e.g., the endcap tie cell 1440) and features of a switch cell (e.g., the switch cell 1435) into a single cell. The endcap switch cell has a length that is shorter than the combined length of the endcap tie cell and the switch cell by eliminating one or more redundancies (e.g., redundant p-taps) in the endcap tie cell and the switch cell. Because the length of the endcap switch cell is shorter than the combined length of the endcap tie cell and the switch cell, the endcap switch cell may be used in place of the endcap tie cell and the switch cell to reduce the channel length (and hence area) between a first circuit block (e.g., first circuit block 1410) and a second circuit block (e.g., second circuit block 1420). The above features and other features according to aspects of the present disclosure are discussed further below.

Figure 16A:
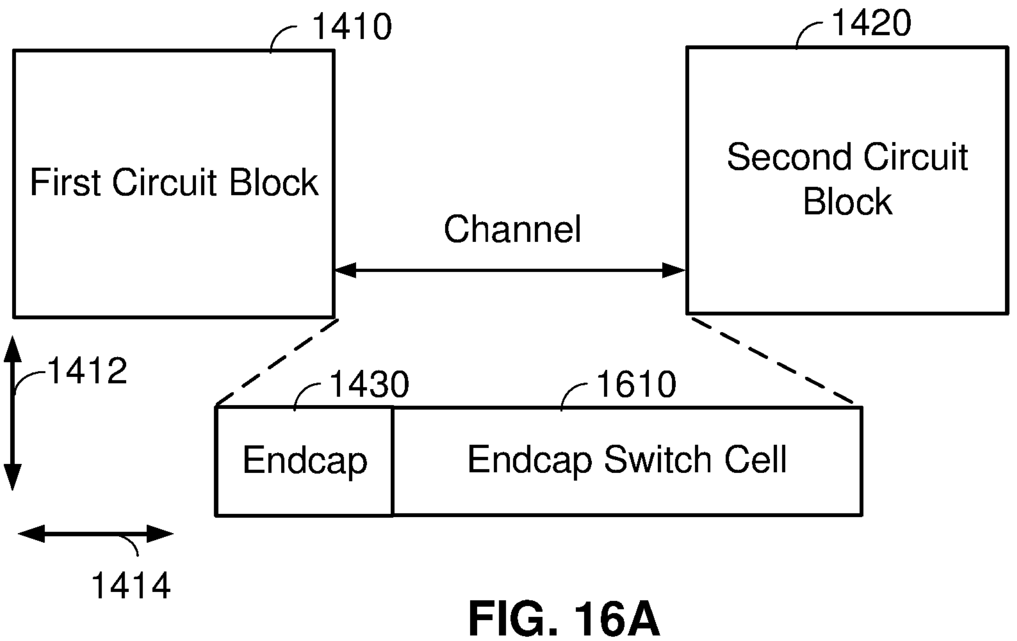
FIG. 16A shows an example of an endcap cell and an endcap switch cell between a first circuit block and a second circuit block according to certain aspects of the present disclosure.
Figure 16B:
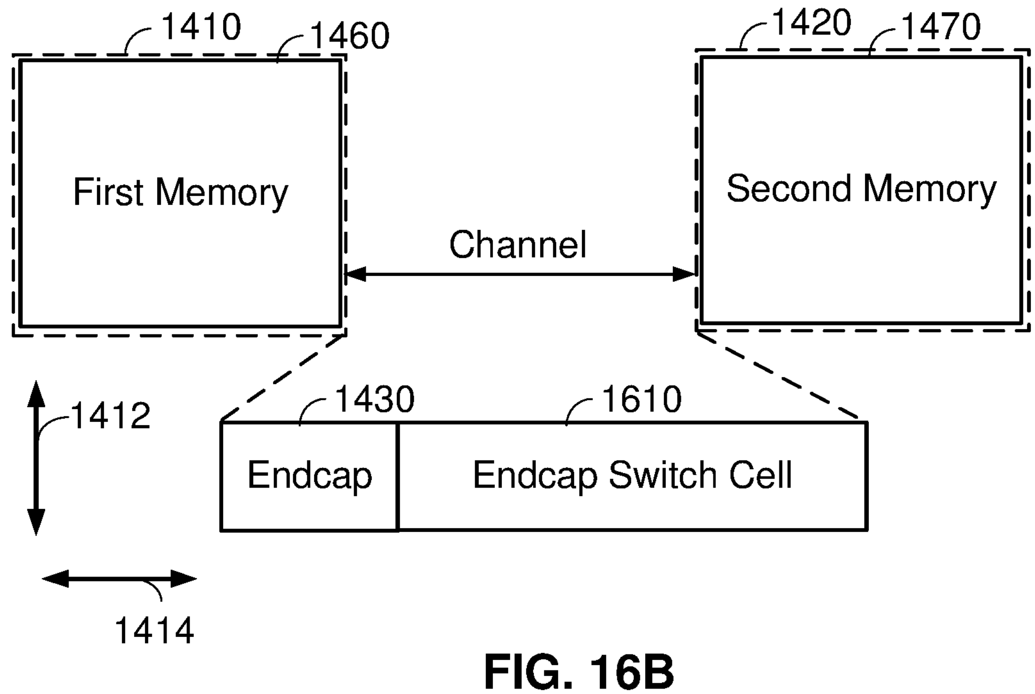
FIG. 16B shows an example in which the first circuit block of FIG. 16A includes a first memory bank and the second circuit block of FIG. 16B includes a second memory bank according to certain aspects of the present disclosure.

FIG. 16A shows an example in which the switch cell 1435 and the endcap tie cell 1440 shown in FIG. 14A are replaced by an endcap switch cell 1610 according to aspects of the present disclosure. The endcap switch cell 1610 integrates features of the switch cell 1435 and features of the endcap tie cell 1440 while eliminating one or more redundancies (e.g., redundant p-taps) in the switch cell 1435 and the endcap tie cell 1440. This allows the endcap switch cell 1610 to have a length that is shorter than the combined length of the switch cell 1435 and the endcap tie cell 1440. The shorter length of the endcap switch cell 1610 decreases the channel length between the first circuit block 1410 and the second circuit block 1420. FIG. 16B shows an example in which the first circuit block 1410 includes the first memory bank 1460 and the second circuit block 1420 includes the second memory bank 1470 discussed above.

Figure 17A:
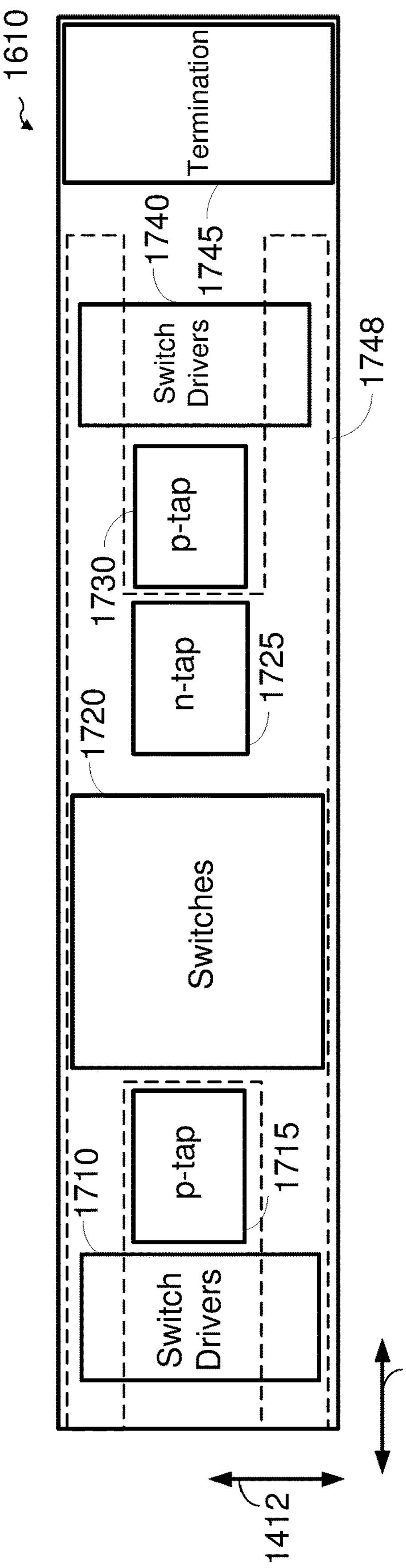
FIG. 17A shows an example of an endcap switch cell according to certain aspects of the present disclosure.

FIG. 17A shows a top view of an exemplary implementation of the endcap switch cell 1610 according to certain aspects. In this example, the endcap switch cell 1600 includes a first driver region 1710, a first p-tap 1715, a switch region 1720, an n-tap 1725, a second p-tap 1730, a second driver region 1740, a termination region 1745, and an n-well 1748.

In the example in FIG. 17A, the first p-tap 1715 and the second p-tap 1730 are spaced apart in the first direction 1414 in which a portion of the n-well 1748 is located between the first p-tap 1715 and the second p-tap 1730. Each of the first p-tap 1715 and the second p-tap 1730 is configured to couple a p-substrate of the chip to ground (e.g., to prevent latch-up of n-type devices). In certain aspects, the spacing between the first p-tap 1715 and the second p-tap 1735 is chosen to comply with a design rule check (DRC) requiring that the spacing between adjacent p-taps be within a defined interval to provide latch-up protection coverage.

In this example, the endcap switch cell 1610 reduces the number of p-taps compared with the endcap tie cell 1440 and the switch cell 1435. This is because the switch cell 1435 includes two p-taps and the endcap tie cell 1440 includes at least one p-tap for a total of at least three p-taps. The endcap switch cell 1610 (which replaces the endcap tie cell 1440 and the switch cell 1435) includes two p-taps (i.e., the first p-tap 1715 and the second p-tap 1730), which reduces the total number of p-taps by at least one. This allows the length of the endcap switch cell 1610 to be shorter than the combined length of the endcap tie cell 1440 and the switch cell 1435, which decreases the channel length (and hence area) between the first circuit block 1410 and the second circuit block 1420.

The n-tap 1725 is located within the n-well 1748 and is configured to couple (i.e., tie) the n-well 1748 to the internal supply bus Vddx or the external supply bus Vdd_ext (i.e., to prevent latch-up). In the example shown in FIG. 17A, the n-tap 1725 is located between the switch region 1720 and the second p-tap 1730. However, it is to be appreciated that the present disclosure is not limited to this example.

The switch region 1720 may include switches distributed throughout the switch region 1720, in which the switches may include the one or more few switches 1530 and the rest switches 1580-1 to **1580-*n* discussed above. In certain aspects, the switches in the switch region 1720 are head switches implemented with p-type transistors, as discussed further below. In this example, the n-well 1748 extends under the switch region 1720** (e.g., to provide an n-well for the p-type transistors implementing the switches).

Figure 17B:
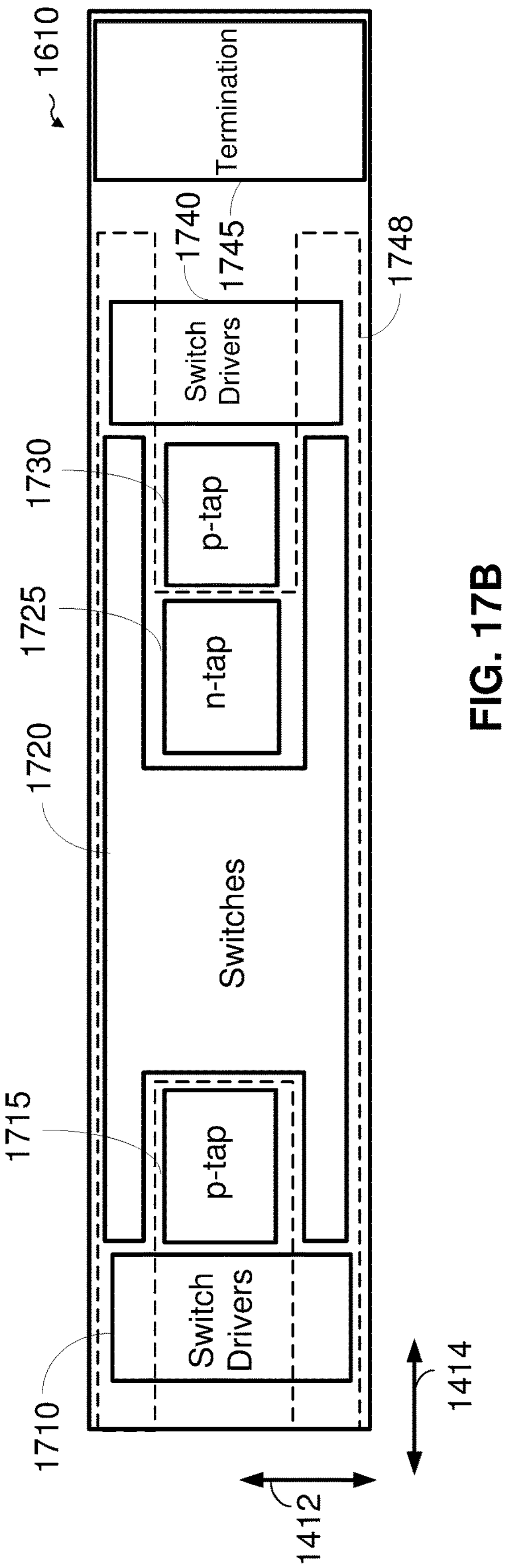
FIG. 17B shows an example of the endcap switch cell of FIG. 17A with an expanded switch region according to certain aspects of the present disclosure.

In the example shown in FIG. 17A, the switch region 1720 is located between the first p-tap 1715 and the n-tap 1725. It is to be appreciated that the switch region 1720 is not limited to the exemplary shape shown in FIG. 17A. For example, FIG. 17B shows an example in which a portion of the switch region 1720 extends between the first p-tap 1715 and a first side (e.g., top side) of the endcap switch cell 1610, and a portion of the switch region 1720 extends between the first p-tap 1715 and a second side (e.g., bottom side) of the endcap switch cell 1610 opposite the first side. Also, in this example, a portion of the switch region 1720 extends between the first side (e.g., top side) of the endcap switch cell 1610 and the n-tap 1725 and the second p-tap 1730, and a portion of the switch region 1720 extends between the second side (e.g., bottom side) of the endcap switch cell 1610 and the n-tap 1725 and the second p-tap 1730. These portions of the switch region 1720 may provide greater area efficiency and greater flexibility in the placement of switches in the endcap switch cell 1610. In certain aspects, the endcap switch cell 1610 may include additional switches (not shown) in the area between the second driver region 1740 and the termination region 1745.

The first driver region 1710 may include the input driver 1560 and the output driver 1570 for the rest switches 1580-1 to **1580-*n*, and the second driver region 1740 may include the input driver 1510 and the output driver 1520 for the one or more few switches 1530**. However, it is to be appreciated that the present disclosure is not limited to this example.

In this example, the termination region 1745 abuts a third side (e.g., right side) of the endcap switch cell 1610, which abuts the second circuit block 1420 shown in FIGS. 16A and 16B. The termination region 1745 may be configured to provide base layer termination (e.g., for a row of standard cells in the second circuit block 1420 abutting the endcap switch cell 1610). An exemplary implementation of the termination region 1745 is discussed further below.

Figure 17C:
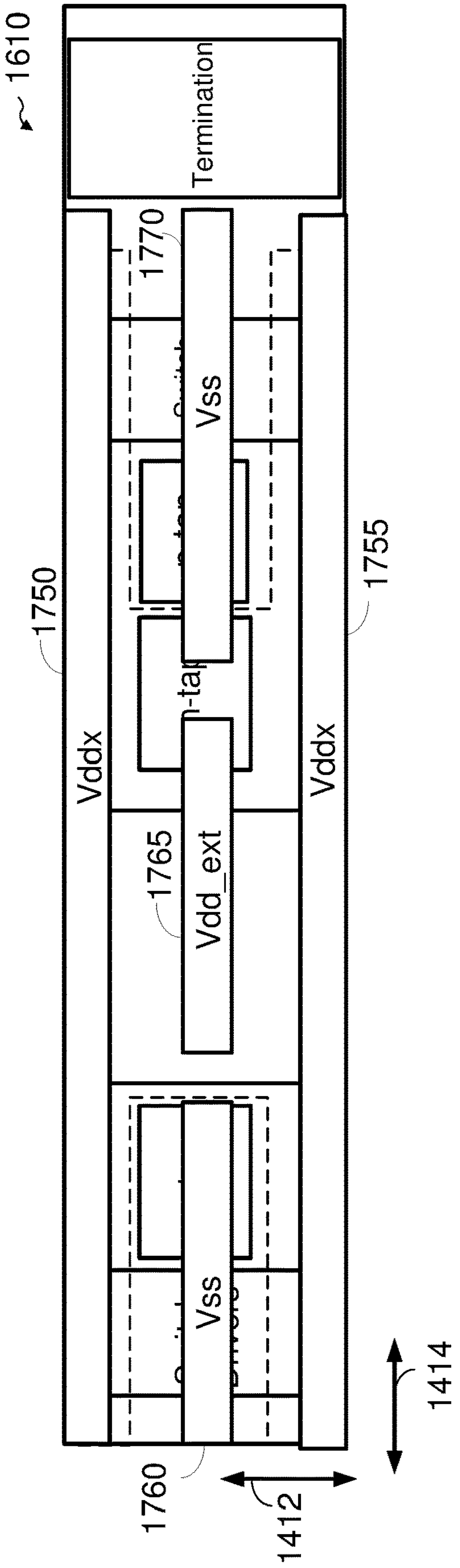
FIG. 17C shows an example of the endcap switch cell of FIG. 17A including supply rails and ground rails according to certain aspects of the present disclosure.

Referring to FIG. 17C, the endcap switch cell 1610 may also include a first supply rail 1750 and a second supply rail 1755. The supply rails 1750 and 1755 may be part of the internal supply bus Vddx configured to provide power to the first circuit block 1410, the second circuit block 1420, and/or the other circuit block discussed above. Each of the supply rails 1750 and 1755 extends in the first direction 1414 (e.g., horizontal direction) and may be formed from metal layer M0 (e.g., using a lithographic and etching process). In this example, the supply rails 1750 and 1755 do not extend over the termination region 1745.

The endcap switch cell 1610 also includes a first ground rail 1760 and a second ground rail 1770. Each of the ground rails 1760 and 1770 extends in the first direction 1414 (e.g., horizontal direction) and may be formed from metal layer M0 (e.g., using a lithographic and etching process). In the example in FIG. 17C, the first ground rail 1760 and the second ground rail 1770 are aligned in the second direction 1412 (e.g., vertical direction) and spaced apart from one another in the first direction 1414 (e.g., horizontal direction). Each of the ground rails 1760 and 1770 is located between the first supply rail 1750 and the second supply rail 1755.

The endcap switch cell 1610 also includes a third supply rail 1765 extending in the first direction 1414 and located between the first ground rail 1760 and the second ground rail 1770 in the first direction 1414. The third supply rail 1765 may be part of the external supply bus Vdd_ext coupled to an external power source (e.g., PMIC).

Figure 18:
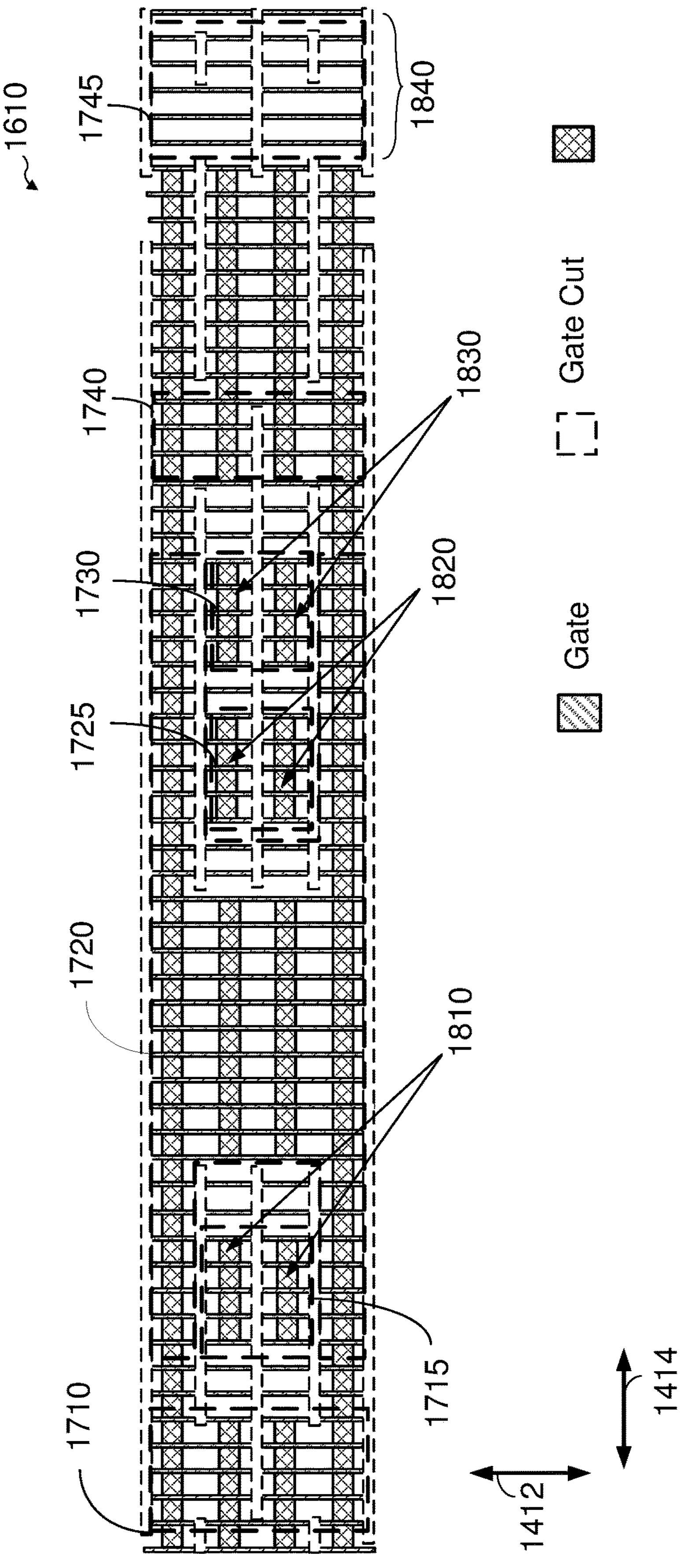
FIG. 18 shows an exemplary layout of gates and oxide diffusion (OD) regions in the endcap switch cell according to certain aspects of the present disclosure.

FIG. 18 shows an exemplary layout of the endcap switch cell 1610 according to certain aspects. In this example, the endcap switch cell 1610 includes OD regions where each OD region extends in the first direction 1414 (e.g., horizontal direction). The endcap switch cell 1610 also includes a row of gates (e.g., poly gates) arranged in parallel. The gates are spaced apart in the first direction 1414 (e.g., horizontal direction). For example, the gates may be evenly spaced apart by the CPP discussed above. Each of the gates is elongated and extends in the second direction 1412 (e.g., vertical direction). The gates are formed over the OD regions, as shown in FIG. 18. FIG. 18 also shows examples of gate cuts (i.e., gate breaks) that extend in the first direction 1414. The gate cuts cut the gates into shorter gates in the second direction 1412 (e.g., vertical direction), as discussed further below. For the example where the gates are poly gates, the gate cuts may also be referred to as poly cuts.

In this example, the first p-tap 1715 includes one or more OD regions 1810 extending in the first direction 1414. The one or more OD regions 1810 may be implanted with P+ dopant, in which the n-well 1748 does not extend under the one or more OD regions 1810. The one or more OD regions 1810 provide coupling to the underlying p-substrate of the chip. In this example, the one or more OD regions 1810 may be coupled to a ground rail (e.g., the first ground rail 1760 in FIG. 17C) through the MD layer, vias, metal routing, or any combination thereof. Examples of the MD layer and vias are shown in FIGS. 1A, 1B, 1C, 2A, and 2B discussed above.

In this example, the n-tap 1725 includes one or more OD regions 1820 extending in the first direction 1414. The one or more OD regions 1820 may be implanted with N+ dopant, in which the n-well 1748 extends under the one or more OD regions 1820. The one or more OD regions 1820 provide coupling to the underlying n-well 1748. In this example, the one or more OD regions 1820 may be coupled to a supply rail (e.g., one of the supply rails 1750, 1755, and 1765 in FIG. 17C) through the MD layer, vias, metal routing, or any combination thereof. Examples of the MD layer and vias are shown in FIGS. 1A, 1B, 1C, 2A, and 2B discussed above.

In this example, the second p-tap 1730 includes one or more OD regions 1830 extending in the first direction 1414. The one or more OD regions 1830 may be implanted with P+ dopant, in which the n-well 1748 does not extend under the one or more OD regions 1830. The one or more OD regions 1830 provide coupling to the underlying p-substrate of the chip. In this example, the one or more OD regions 1830 may be coupled to a ground rail (e.g., the second ground rail 1770 in FIG. 17C) through the MD layer, vias, metal routing, or any combination thereof. Examples of the MD layer and vias are shown in FIGS. 1A, 1B, 1C, 2A, and 2B discussed above.

In this example, the termination region 1745 includes floating gates 1840 extending in+6 the second direction 1412 and space apart in the first direction 1414 (e.g., by the CPP). As used herein, a floating gate is a gate that is not electrically coupled to a supply rail, a ground rail, or a signal line. The termination region 1745 may also include floating OD regions, floating contacts, and/or floating metal lines (not shown). The floating metal lines may be formed from metal layer M0 and extend in the first direction 1414. The floating metal lines are electrically isolated from the supply rails 1750, 1755, and 1765 and the ground rails 1760 and 1770.

Figure 19A:
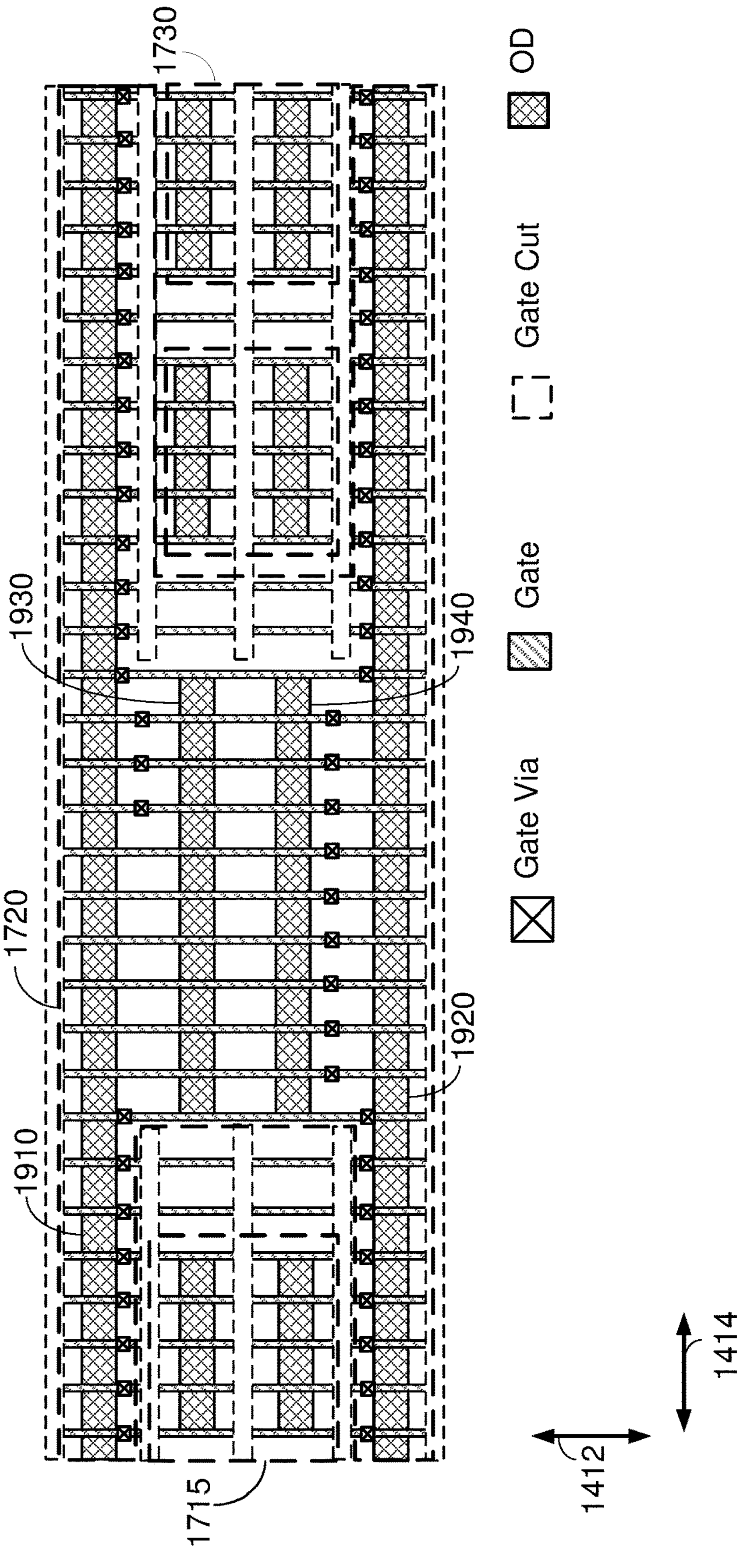
FIG. 19A shows a close-up view of a switch region including OD regions and gates of p-type transistors implementing switches according to certain aspects of the present disclosure.

FIG. 19A shows a close-up view of the switch region 1720 according to certain aspects. In this example, the switch region 1720 includes a first OD region 1910, a second OD region 1920, a third OD region 1930, and a fourth OD region 1940. Each of the OD regions 1910, 1920, 1930, and 1940 extends in the first direction 1414, and may be implanted with P+ dopant to form p-type transistors for the switches in the switch region 1720, as discussed further below. The n-well 1748 (shown in FIGS. 17A and 17B) extends under the OD regions 1910, 1920, 1930, and 1940 in the switch region 1720. In the example in FIG. 19A, the OD regions 1910, 1920, 1930, and 940 are spaced apart from one another in the second direction 1412. The OD regions 1910, 1920, 1930, and 1940 are a subset of the OD regions shown in FIG. 18.

As shown in FIG. 19A, the switch region 1720 also includes subset of the gates in the endcap switch cell 1610 which extend over the OD regions 1910, 1920, 1930, and 1940 in the second direction 1412 (e.g., vertical direction). In this example, the gates over the OD regions 1910, 1920, 1930, and 1940 provides the gates of the p-type transistors implementing the switches (e.g., rest switches 1580-1 to **1580-*n* and one or more few switches 1530) in the switch region 1720, and the OD regions 1910, 1920, 1930, and 1940 (which are P+ doped in this example) provide the sources/drains of the p-type transistors implementing the switches in the switch region 1720**.

FIG. 19A also shows an example of gate vias disposed on the gates extending over the OD regions 1910, 1920, 1930, and 1940 in the switch region 1720. The gate vias provide electrical coupling to the gates of the p-type transistors implementing the switches in the switch region 1720 to control the on/off states of the switches, as discussed further below.

In certain aspects, the switch region 1720 may also include additional p-type transistors implementing additional switches (not shown) between the second driver region 1740 and the termination region 1745.

Figure 19B:
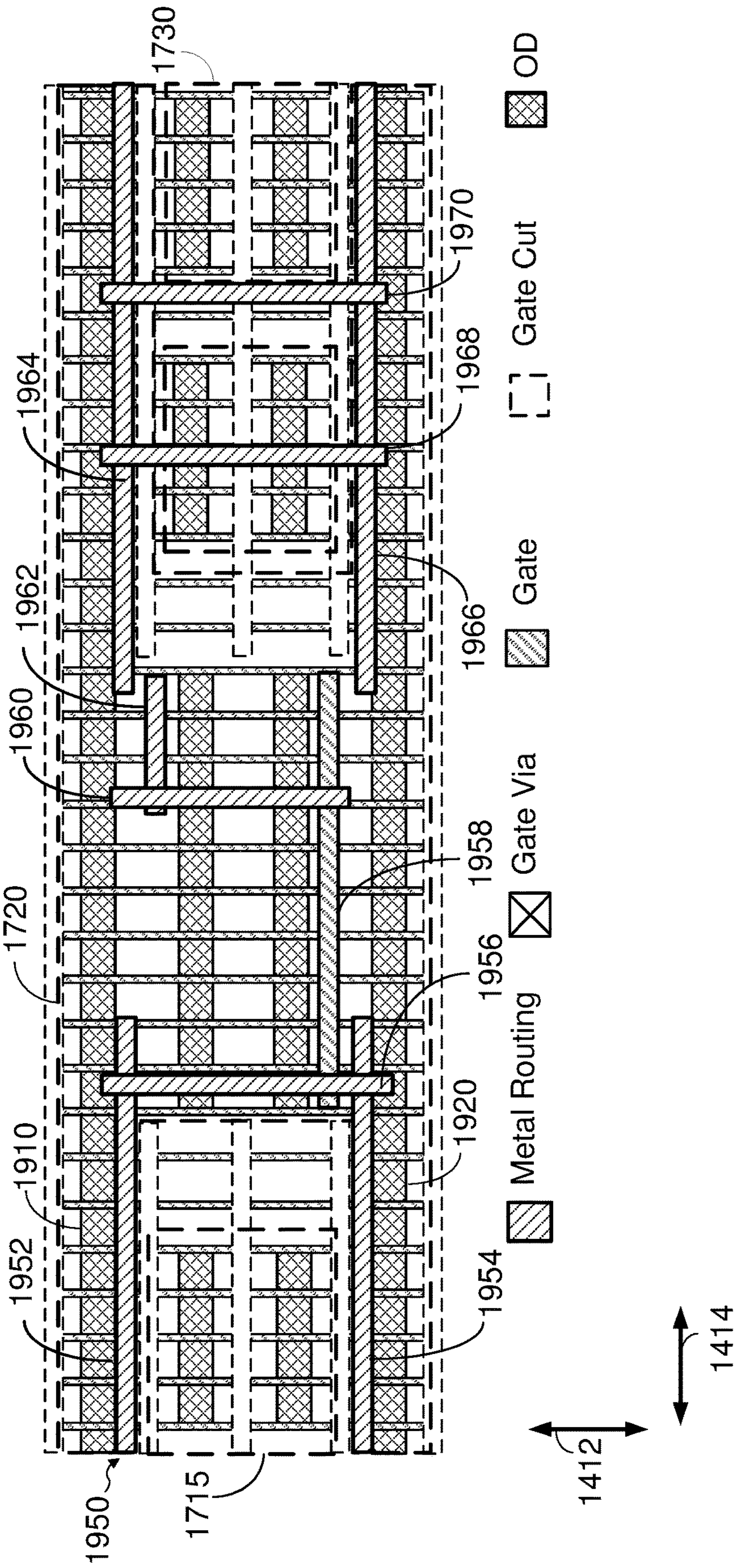
FIG. 19B shows an example of metal routing for routing an output of an input driver to the gates of p-type transistors in the switch region according to certain aspects of the present disclosure.

FIG. 19B shows an example of metal routing 1950 for routing the output 1564 of the input driver 1560 to the gates of the p-type transistors implementing the rest switches 1580-1 to 1580-*n* in the switch region 1720. The metal routing 1950 includes metal lines 1952, 1954, 1958, 1962, 1964, and 1966 extending in the first direction 1414. The metal lines 1952, 1954, 1958, 1962, 1964, and 1966 are disposed over the gate vias shown in FIG. 19A, and are coupled to the gates of the p-transistors in the switch region 1720 through the respective gate vias. Each of the metal lines 1952, 1954, 1958, 1962, 1964, and 1966 may be formed from metal layer M0 or another metal layer.

The metal routing 1950 also includes metal lines 1956, 1960, 1968, and 1970 extending in the second direction 1412. The metal lines 1956, 1960, 1968, and 1970 are used to provide signal routing between the metal lines 1952, 1954, 1958, 1962, 1964, and 1966 in the second direction 1412. The metal lines 1956, 1960, 1968, and 1970 may be formed from metal layer M1, and may be coupled to the metal lines 1952, 1954, 1958, 1962, 1964, and 1966 through V0 vias (e.g., V0 vias shown in FIGS. 1A, 1B, 1C, and 2A). It is to be appreciated that the metal routing 1950 shown in FIG. 19B is exemplary, and that the present disclosure is not limited to this example. In general, the metal routing 1950 may be implemented using various layouts of metal lines in the first direction 1414 and the second direction 1412 complying with the DRC for the chip.

Figure 19C:
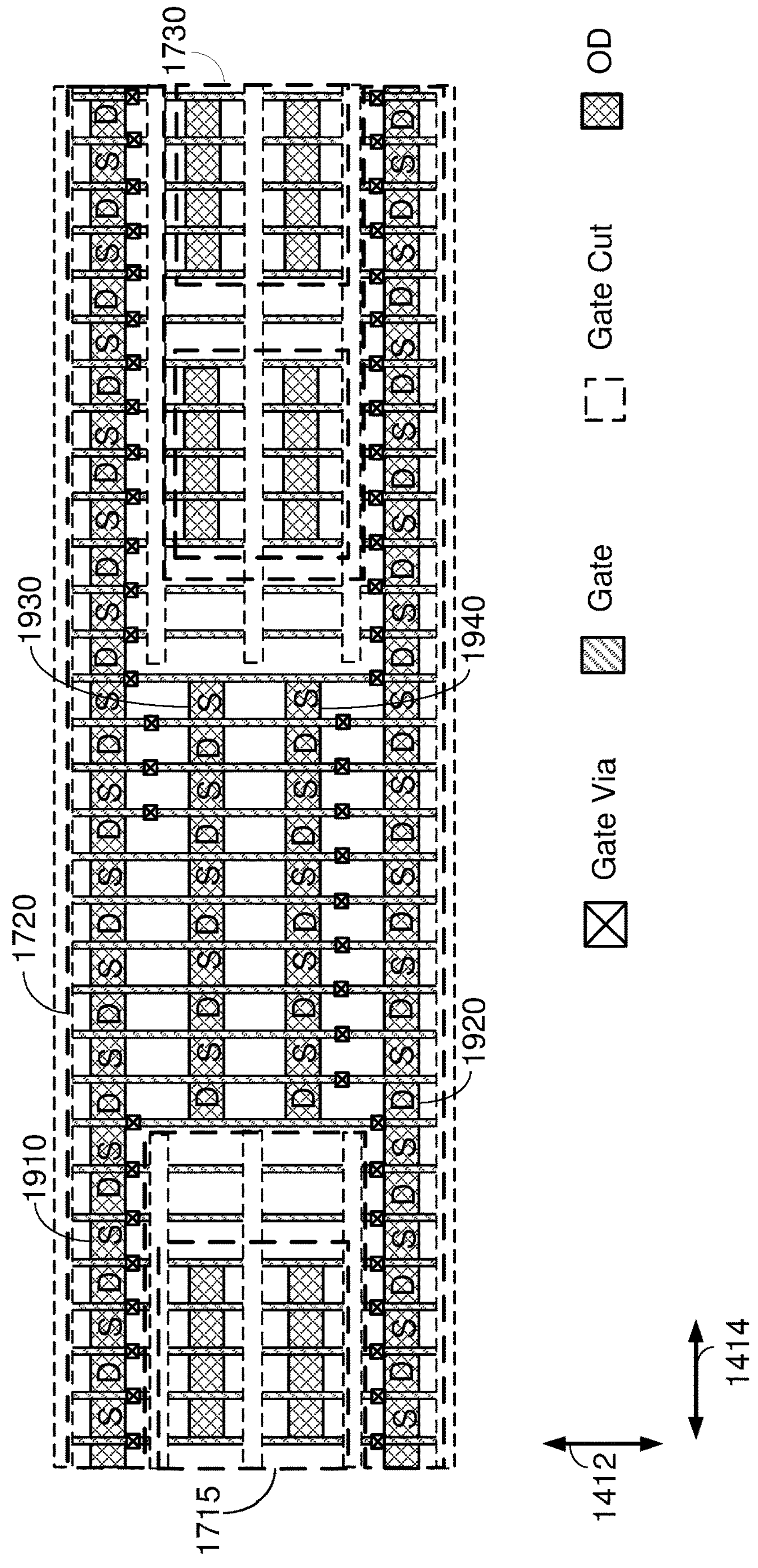
FIG. 19C shows an example of source and drain regions of p-type transistors in the switch region according to certain aspects of the present disclosure.

The OD regions 1910, 1920, 1930, and 1940 provide the sources and the drains of the p-type transistors implementing the switches in the switch region 1720. In this regard, FIG. 19C shows an example of the portions of the OD regions 1910, 1920, 1930, and 1940 providing the sources (labeled "S") of the p-type transistors, and the portions of the OD regions 1910, 1920, 1930, and 1940 providing the drains (labeled "D") of the p-type transistors. As shown in FIG. 19C, the sources and drains in each of the OD regions 1910, 1920, 1930, and 1940 are separated by the gates formed over the OD region.

In certain aspects, the sources of the p-type transistors may be coupled to the external supply bus Vdd_ext and the drains of the p-type transistors may be coupled to the internal supply rail Vddx. This allows the p-type transistors to couple the external supply bus Vdd_ext to the internal supply rail Vddx when the p-type transistors are turned on by the output 1564 of the input driver 1560 (shown in FIG. 15). As discussed above, the p-type transistors in the switch region 1720 may implement the rest switches 1580-1 to 1580-*n*.

The sources of the p-type transistors may be coupled to the external supply bus Vdd_ext by first metal routing (not shown in FIG. 19C). The first metal routing may include source/drain contacts, vias, metal lines extending in the first direction 1414, metal lines extending in the second direction 1412, or any combination thereof. The drains of the p-type transistors may be coupled to the internal supply bus Vddx by second metal routing (not shown in FIG. 19C). The second metal routing may include source/drain contacts, vias, metal lines extending in the first direction 1414, metal lines extending in the second direction 1412, or any combination thereof.

Figure 20A:
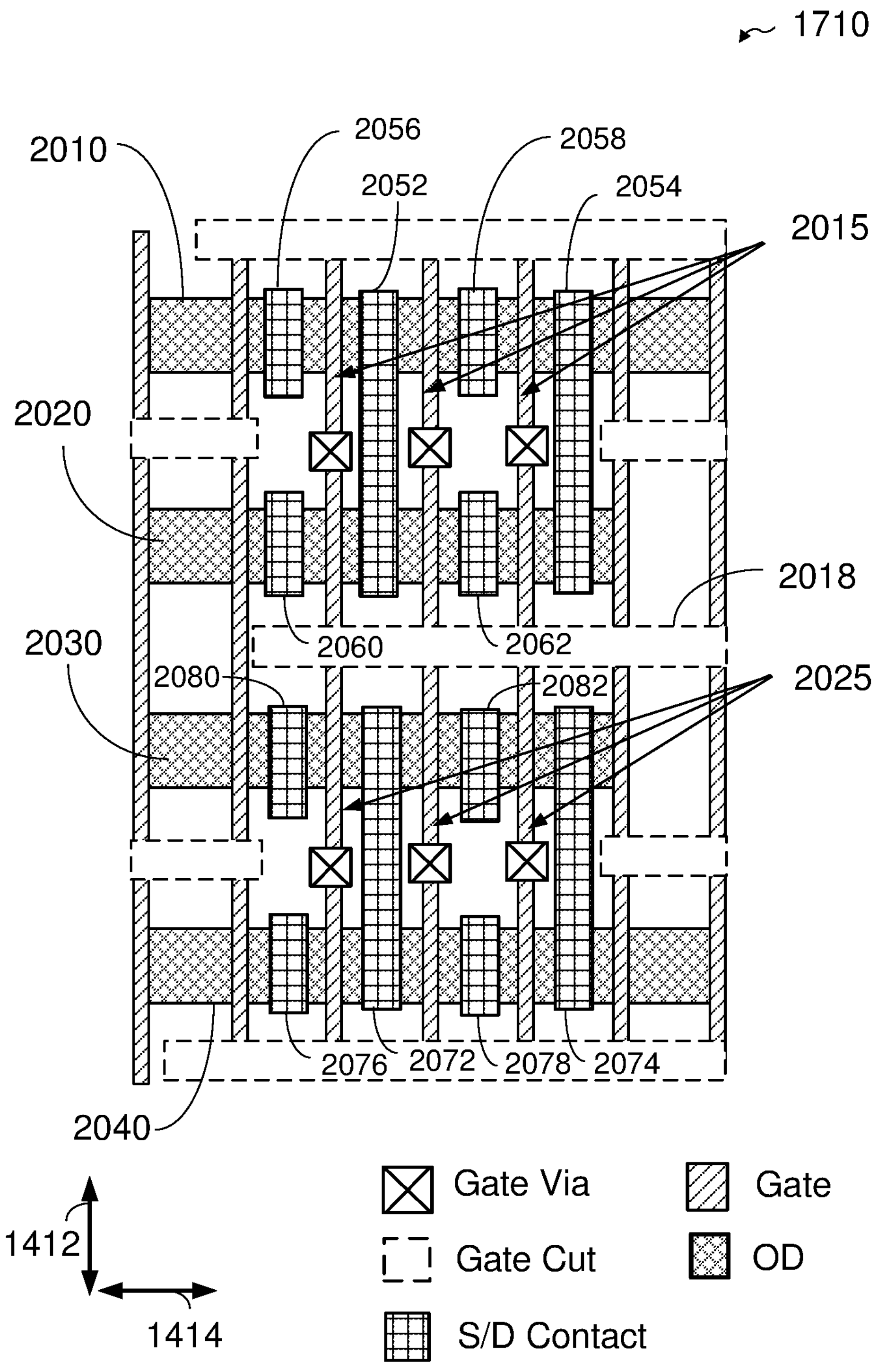
FIG. 20A shows an exemplary layout for a first driver region in the endcap switch cell according to certain aspects of the present disclosure.

FIG. 20A shows a close-up view of the first driver region 1710 according to certain aspects. In this example, the first driver region 1710 includes a first OD region 2010, a second OD region 2020, a third OD region 2030, and a fourth OD region 2040 extending in the first direction 1414 (e.g., horizontal direction). The OD regions 2010, 2020, 2030, and 2040 are spaced apart from one another in the second direction 1412. The OD regions 2010, 2020, 2030, and 2040 are a subset of the OD regions shown in FIG. 18.

Each of the first OD region 2010 and the fourth OD region 2040 may be implanted with P+ dopant, and the n-well 1748 (shown in FIGS. 17A and 17B) may extend under the first OD region 2010 and the four OD region 2040. Each of the second OD region 2020 and the third OD region 2030 may be implanted with N+ dopant, in which the n-well 1784 does not extend under the second OD region 2020 and the third OD region 2030.

The first driver region 1710 also includes first gates 2015 extending in the second direction 1412 over the first OD region 2010 and the second OD region 2020. In this example, the first OD region 2010 and the first gates 2015 form the p-type transistor 1566 of the input driver 1560, and the second OD region 2020 and the first gates 2015 form the n-type transistor 1568 of the input driver 1560. The first gates 2015 are contiguous across the first OD region 2010 and the second OD region 2020 since the gates of the p-type transistor 1566 and the n-type transistor 1518 are coupled to the same input 1562. The first gates 2015 are a subset of the gates shown in FIG. 18.

The first driver region 1710 also includes drain contacts 2052 and 2054 extending in the second direction 1412 over the first OD region 2010 and the second OD region 2020. The drain contacts 2052 and 2054 may be formed from a source/drain contact layer (e.g., MD layer). The drain contacts 2052 and 2054 provide the drain contacts for the p-type transistor 1566 and the n-type transistor 1568, and are coupled to the output 1564 of the input driver 1560, as discussed further below. The first driver region 1710 also includes source contacts 2056 and 2058 extending over the first OD region 2010 to provide source contacts for the p-type transistor 1566, and source contacts 2060 and 2062 extending over the second OD region 2020 to provide source contacts for the n-type transistor 1568. The source contacts 2056 and 2058 may be coupled to the external supply bus Vdd_ext, and the source contacts 2060 and 2062 may be coupled to ground (e.g., the first ground rail 1760 shown in FIG. 17C).

The first driver region 1710 also includes second gates 2025 extending in the second direction 1412 over the third OD region 2030 and the fourth OD region 2040. The second gates 2025 are separated from the first gates 2015 by gate cut 2018. In this example, the third OD region 2030 and the second gates 2025 form the n-type transistor 1578 of the output driver 1570, and the fourth OD region 2040 and the second gates 2025 form the p-type transistor 1576 of the output driver 1570. The second gates 2025 are contiguous across the third OD region 2030 and the fourth OD region 2040 since the gates of the p-type transistor 1576 and the n-type transistor 1578 are coupled to the same input 1572. The second gates 2025 are a subset of the gates shown in FIG. 18.

The first driver region 1710 also includes drain contacts 2072 and 2074 extending in the second direction 1412 over the third OD region 2030 and the fourth OD region 2040. The drain contacts 2075 and 2074 may be formed from a source/drain contact layer (e.g., MD layer). The drain contacts 2072 and 2074 provide the drain contacts for the p-type transistor 1576 and the n-type transistor 1578, and are coupled to the output 1574 of the output driver 1570. The first driver region 1710 also includes source contacts 2076 and 2078 extending over the fourth OD region 2040 to provide source contacts for the p-type transistor 1576, and source contacts 2080 and 2082 extending over the third OD region 2030 to provide source contacts for the n-type transistor 1578. The source contacts 2076 and 2078 may be coupled to the external supply bus Vdd_ext, and the source contacts 2080 and 2082 may be coupled to ground (e.g., the first ground rail 1760 shown in FIG. 17C).

Figure 20B:
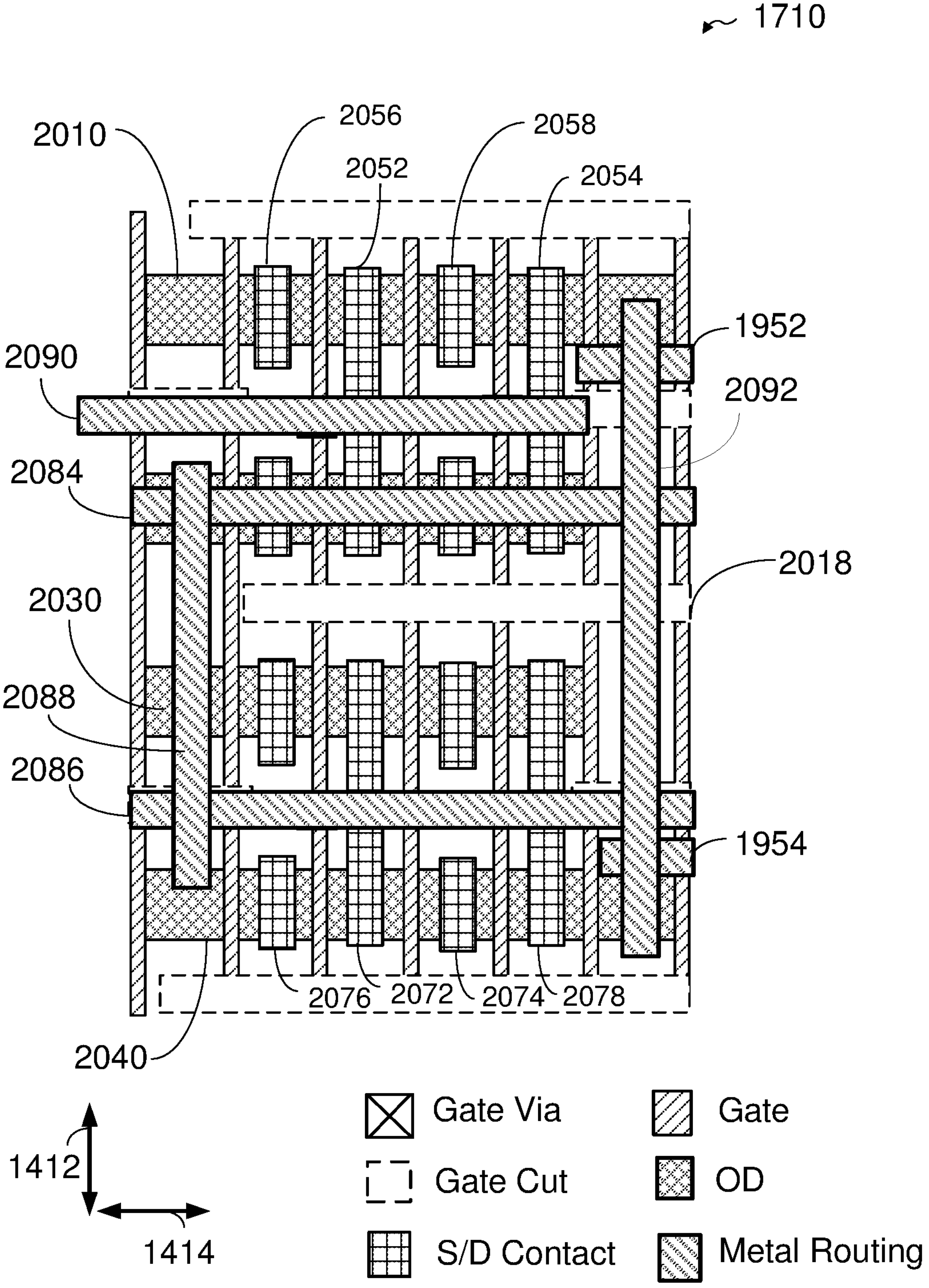
FIG. 20B shows an example of metal routing for the first driver region of FIG. 20A according to certain aspects of the present disclosure.

FIG. 20B shows an example of metal routing for the first driver region 1710 according to certain aspects. The metal routing includes metal lines 2084, 2086, and 2090 extending in the first direction 1414, and metal lines 2088 and 2092 extending in the second direction 1412. The metal lines 2084, 2086, and 2090 may be formed from metal layer M0, and the metal lines 2088 and 2092 may be formed from metal layer M1.

In this example, the metal line 2090 extends over the first gates 2015 and is coupled to the first gates 2015 through gate vias (shown in FIG. 20A). The metal line 2090 may provide routing to the input 1562 of the input driver 1560 for receiving the enable signal ("En_rest") for the rest switches 1580-1 to **1580-*n* discussed above. The metal line 2084 extends over the drain contacts 2052 and 2054 and is coupled to the drain contacts 2052 and 2054 (e.g., through vias) to provide routing for the output 1564 of the input driver 1560. The metal line 2086 extends over the second gates 2025 and is coupled to the second gates 2025 through gate vias (shown in FIG. 20A). The metal line 2086 may provide routing to the input 1572 of the output driver 1570. The metal line 2088 extends over the metal line 2084 and the metal line 2086 and couples the metal line 2084 to the metal line 2086. As a result, the metal lines 2084, 2088, and 2088 provide metal routing that couples the output 1564 of the input driver 1560 to the input 1572 of the output driver 1570**.

The metal line 2092 is coupled to the metal lines 2084 and 2086, which couple the metal line 2092 to the output 1564 of the input driver 1560. The metal line 2092 is also coupled to the metal lines 1952 and 1954, which are coupled to the gates of the p-type transistors implementing the switches (e.g., the rest switches 1580-1 to **1580-*n*) in the switch region 1720, as shown in FIG. 19B. As a result, the metal lines 2084, 2086, 2092, 1952, and 1954 provide metal routing that couples the output 1564 of the input driver 1560 to gates of the p-type transistors in the switch region 1720**.

Figure 21A:
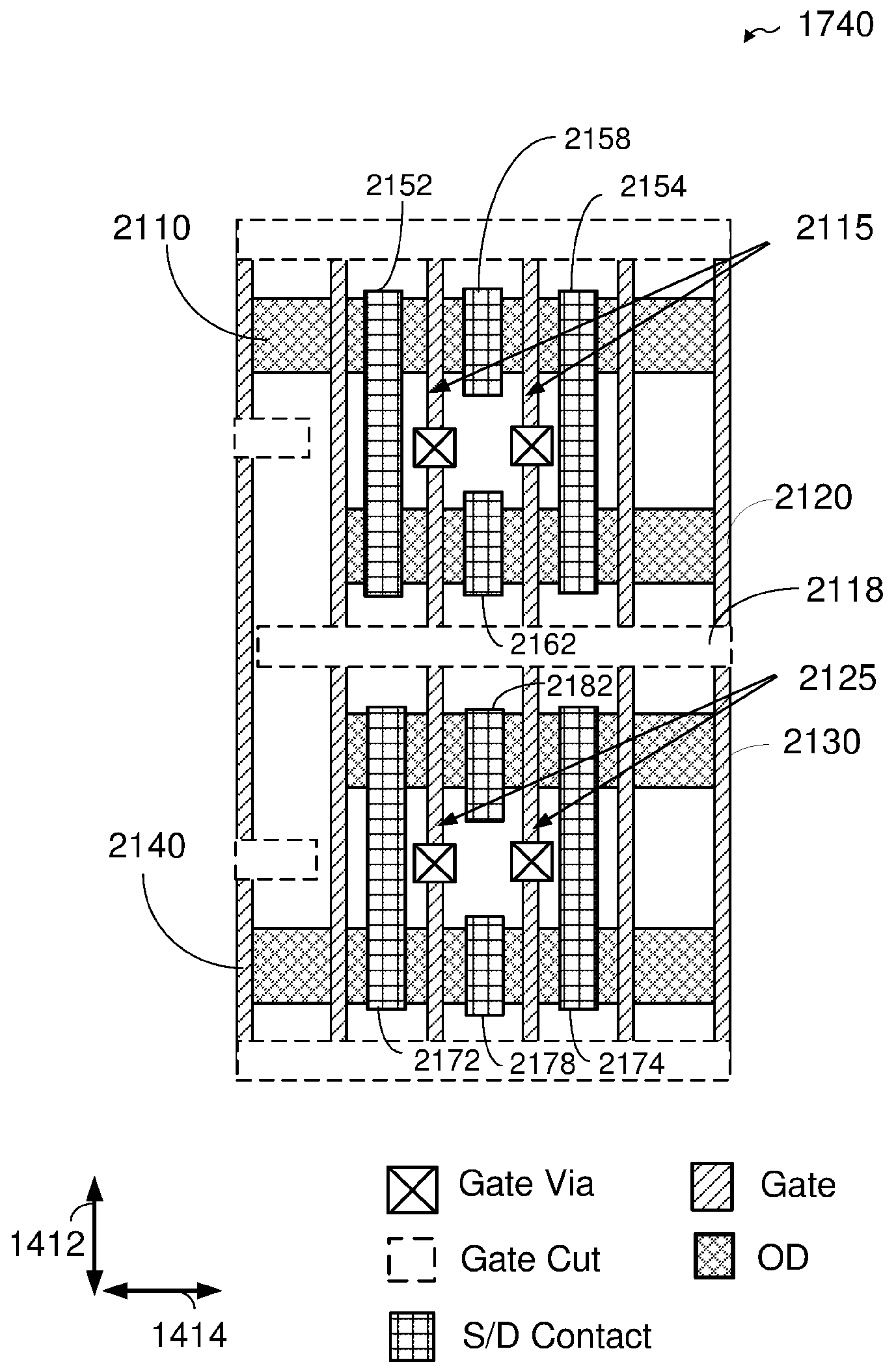
FIG. 21A shows an exemplary layout for a second driver region in the endcap switch cell according to certain aspects of the present disclosure.

FIG. 21A shows a close-up view of the second driver region 1740 according to certain aspects. In this example, the second driver region 1740 includes a first OD region 2110, a second OD region 2120, a third OD region 2130, and a fourth OD region 2140 extending in the first direction 1414 (e.g., horizontal direction). The OD regions 2110, 2120, 2130, and 2140 are spaced apart from one another in the second direction 1412. The OD regions 2110, 2120, 2130, and 2140 are a subset of the OD regions shown in FIG. 18.

Each of the first OD region 2110 and the fourth OD region 2140 may be implanted with P+ dopant, and the n-well 1748 (shown in FIGS. 17A and 17B) may extend under the first OD region 2110 and the four OD region 2140. Each of the second OD region 2120 and the third OD region 2130 may be implanted with N+ dopant, in which the n-well 1784 does not extend under the second OD region 2120 and the third OD region 2130.

The second driver region 1740 also includes first gates 2115 extending in the second direction 1412 over the first OD region 2110 and the second OD region 2120. In this example, the first OD region 2110 and the first gates 2115 form the p-type transistor 1516 of the input driver 1510, and the second OD region 2120 and the first gates 2115 form the n-type transistor 1518 of the input driver 1510. The first gates 2115 are contiguous across the first OD region 2110 and the second OD region 2120 since the gates of the p-type transistor 1516 and the n-type transistor 1518 are coupled to the same input 1512. The first gates 2115 are a subset of the gates shown in FIG. 18.

The second driver region 1740 also includes drain contacts 2152 and 2154 extending in the second direction 1412 over the first OD region 2110 and the second OD region 2120. The drain contacts 2152 and 2154 may be formed from a source/drain contact layer (e.g., MD layer). The drain contacts 2152 and 2154 provide the drain contacts for the p-type transistor 1516 and the n-type transistor 1518, and are coupled to the output 1514 of the input driver 1510, as discussed further below. The second driver region 1740 also includes a source contact 2158 extending over the first OD region 2110 to provide a source contact for the p-type transistor 1516, and a source contact 2162 extending over the second OD region 2120 to provide a source contact for the n-type transistor 1518. The source contact 2158 may be coupled to the external supply bus Vdd_ext, and the source contact 2162 may be coupled to ground (e.g., the second ground rail 1770 shown in FIG. 17C).

The second driver region 1740 also includes second gates 2125 extending in the second direction 1412 over the third OD region 2130 and the fourth OD region 2140. The second gates 2125 are separated from the first gates 2115 by gate cut 2118. In this example, the third OD region 2130 and the second gates 2125 form the n-type transistor 1528 of the output driver 1520, and the fourth OD region 2140 and the second gates 2125 form the p-type transistor 1526 of the output driver 1520. The second gates 2125 are contiguous across the third OD region 2130 and the fourth OD region 2140 since the gates of the p-type transistor 1526 and the n-type transistor 1528 are coupled to the same input 1522. The second gates 2125 are a subset of the gates shown in FIG. 18.

The second driver region 1740 also includes drain contacts 2172 and 2174 extending in the second direction 1412 over the third OD region 2130 and the fourth OD region 2140. The drain contacts 2175 and 2174 may be formed from a source/drain contact layer (e.g., MD layer). The drain contacts 2172 and 2174 provide the drain contacts for the p-type transistor 1526 and the n-type transistor 1528, and are coupled to the output 1524 of the output driver 1520. The second driver region 1740 also a source contact 2178 extending over the fourth OD region 2140 to provide a source contact for the p-type transistor 1526, and a source contact 2182 extending over the third OD region 2130 to provide a source contact for the n-type transistor 1528. The source contact 2178 may be coupled to the external supply bus Vdd_ext, and the source contact 2182 may be coupled to ground (e.g., the second ground rail 1770 shown in FIG. 17C).

Figure 21B:
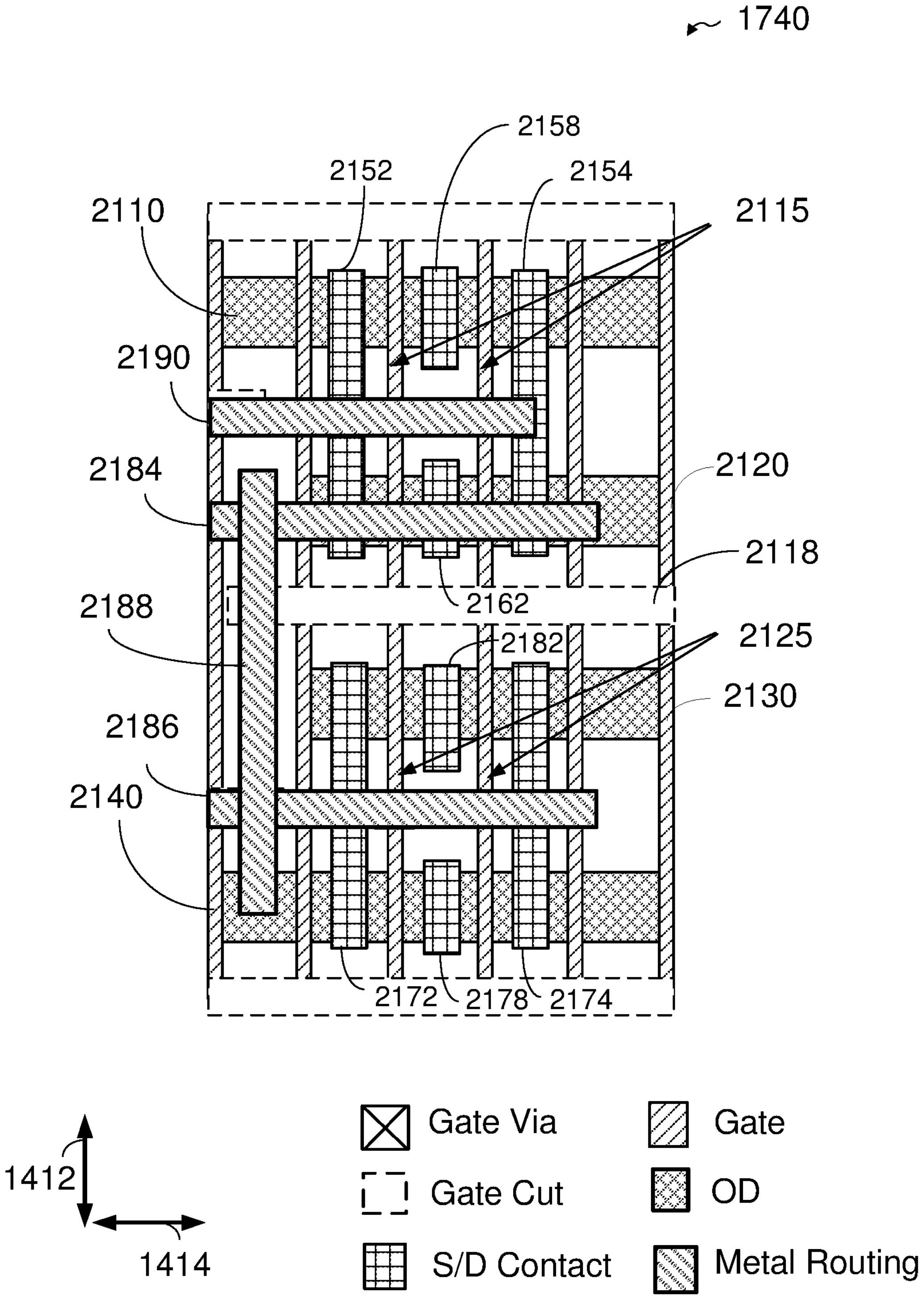
FIG. 21B shows an example of metal routing for the second driver region of FIG. 21A according to certain aspects of the present disclosure.

FIG. 21B shows an example of metal routing for the second driver region 1740 according to certain aspects. The metal routing includes metal lines 2184, 2186, and 2190 extending in the first direction 1414, and metal line 2188 extending in the second direction 1412. The metal lines 2184, 2186, and 2190 may be formed from metal layer M0, and the metal line 2188 may be formed from metal layer M1.

In this example, the metal line 2190 extends over the first gates 2115 and is coupled to the first gates 2115 through gate vias (shown in FIG. 21A). The metal line 2190 may provide routing to the input 1512 of the input driver 1510 for receiving the enable signal ("En_few") for the one or more few switch 1530 discussed above. The metal line 2184 extends over the drain contacts 2152 and 2154 and is coupled to the drain contacts 2152 and 2154 (e.g., through vias) to provide routing for the output 1514 of the input driver 1510. The metal line 2186 extends over the second gates 2125 and is coupled to the second gates 2125 through gate vias (shown in FIG. 21A). The metal line 2186 may provide routing to the input 1522 of the output driver 1520. The metal line 2188 extends over the metal line 2184 and the metal line 2186 and couples the metal line 2184 to the metal line 2186. As a result, the metal lines 2184, 2188, and 2188 provide metal routing that couples the output 1514 of the input driver 1510 to the input 1522 of the output driver 1520.

Figure 21C:
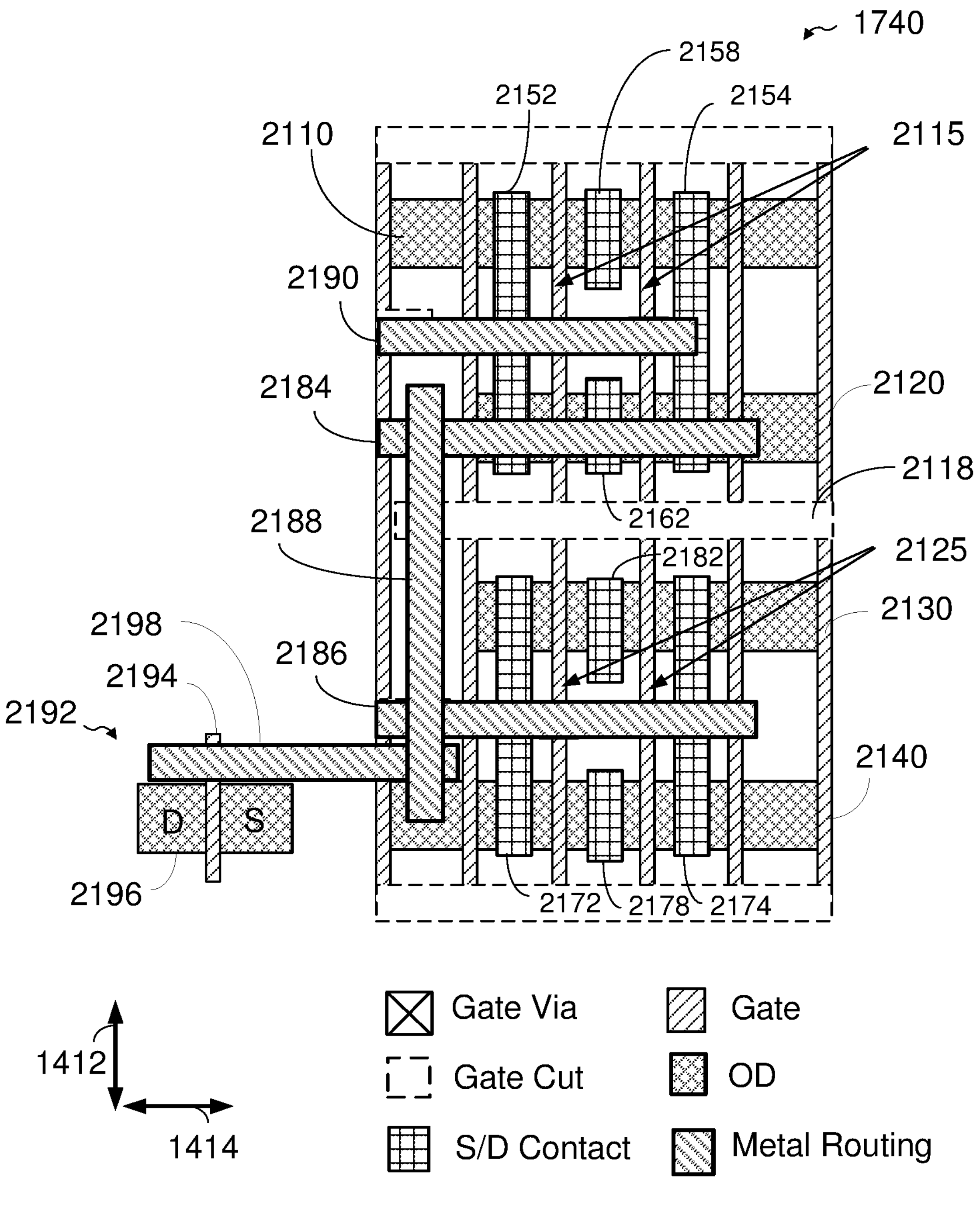
FIG. 21C shows an example of a switch coupled to an output of an input driver in the second driver region according to certain aspects of the present disclosure.

FIG. 21C shows an example of a p-type transistor 2192 implementing a few switch (e.g., one of the one or more few switches 1530). The p-type transistor 2192 includes an OD region 2196 extending in the first direction 1414 and a gate 2194 extending over the OD region 2196 in the second direction 1412. The p-type transistor 2192 may be located at anyone of various locations in the endcap switch cell 1610 (e.g., a portion of the switch region 1720 next to the second driver region 1740). The OD region 2196 may be implanted with a P+ dopant with the n-well 1748 extending under the OD region 2196. Although the OD region 2196 is shown separate from the fourth OD region 2140, it is to be appreciated that the OD region 2196 may be contiguous with the fourth OD region 2140 in some implementations.

In this example, a first portion of the OD region 2196 provides a source (labeled "S") of the p-type transistor 2192, and a second portion of the OD region 2196 provides a drain (labeled "D") of the p-type transistor 2192 in which the gate 2194 is located between the source and the drain. The source may be coupled to the external supply bus Vdd_ext and the drain may be coupled to the internal supply bus Vddx.

FIG. 21C also shows an example of metal routing from the output 1514 of the input driver 1510 to the gate of the p-type transistor 2192. In this example, the metal routing includes a metal line 2198 extending in the first direction 1414 and coupled to the metal line 2188. However, it is to be appreciated that the present disclosure is not limited to this example.

Figure 22:
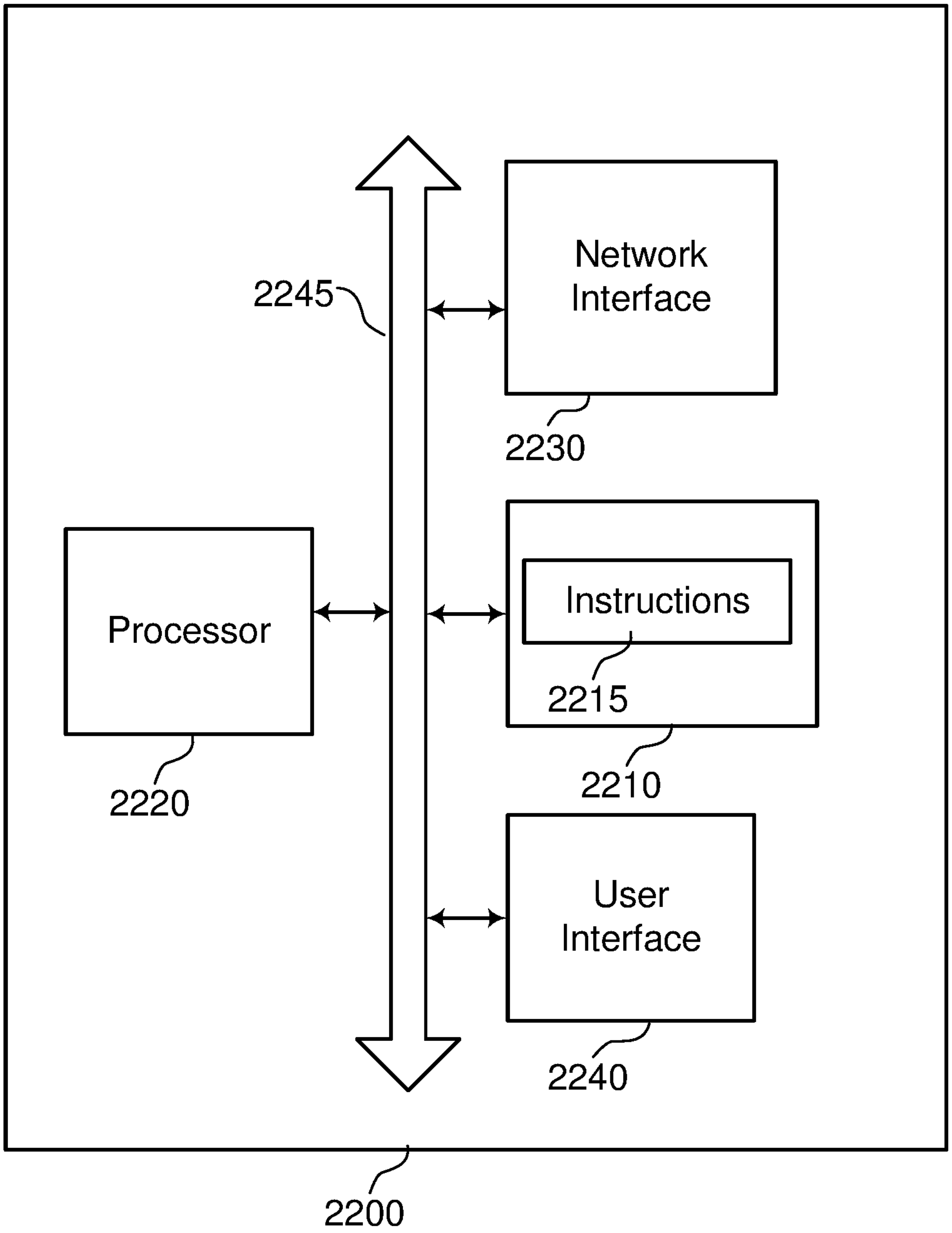
FIG. 22 is a block diagram illustrating a computer system according to certain aspects of the present disclosure.

In certain aspects, the exemplary layouts discussed above may be determined using a computer system. In this regard, FIG. 22 illustrates a computer system 2200 that may be used to determine layouts for the chip 100 (e.g., layout for SoC on the chip 100) according to certain aspects. The computer system 2200 may include a processor 2220, a memory 2210, a network interface 2230, and a user interface 2240. These components may be in electronic communication via one or more buses 2245.

The memory 2210 may store instructions 2215 that are executable by the processor 2220 to cause the computer system 2200 to perform one or more of the operations described herein. The processor 2220 may include a general-purpose processor, a digital signal processor (DSP), a central processing unit (CPU), a microcontroller, an application specific integrated circuit (ASIC), a field programmable gate array (FPGA), a programmable logic device, a discrete gate or transistor logic component, a discrete hardware component, or any combination thereof. The memory 2210 may include, by way of example, random access memory (RAM), flash memory, read only memory (ROM), programmable read only memory (PROM), erasable programmable read only memory (EPROM), electrically erasable programmable read only memory (EEPROM), registers, magnetic disks, optical disks, hard drives, or any other suitable storage medium, or any combination thereof. The memory 2210 may also store a standard cell library in which the standard cell library includes one or more files specifying layouts for various cells that may be placed on the chip 100 including the layouts of the merger cell 610 (e.g., horizontal merger cell), the merger cell 1010 (e.g., vertical merger cell), the merger cell 1210 (e.g., corner merger cell), the endcap switch cell 1610, the first cell 690, the second cell 695, the first cell 1090, the second cell 1095, the first cell 1380, the second cell 1382, and/or the third cell 1386.

The network interface 2230 is configured to interface the computer system 2200 with one or more other devices. The user interface 2240 may be configured to receive data from a user (e.g., via keypad, mouse, etc.) and provide the data to the processor 2220. The user interface 2240 may also be configured to output data from the processor 2220 to the user (e.g., via a display, a speaker, etc.).

In certain aspects, the processor 2220 is configured to generate a layout for at least a portion of a chip (i.e., chip layout), which may include retrieving cells from the standard cell library in the memory 2210, specifying the placement (i.e., layout) of the retrieved cells on the chip based on a desired circuit design (e.g., specified in a netlist or another format in a file) and/or design rule checks (DRCs), and/or specifying metal routing in one or more of the metal layers (e.g., M0, M1, etc.) for providing signal routing and/or supply routing for the cells. The processor 2220 may be configured to store the layout in a file which may be stored in the memory 2210. In certain aspects, specifying the placement of the cells may include placing (i.e., laying out) the cells based on any one or more of the exemplary layouts shown in FIGS. 6C, 10C, 13B, 16A and 16B. For example, specifying the placement of the cells may include placing the first cell 690 in the first voltage domain, placing the second cell 695 in the second voltage domain, and placing the merger cell 610 between the first cell 690 and the second cell 695, as shown in the example in FIG. 6C.

Implementation examples are described in the following numbered clauses:

1. A chip, comprising:
   - a merger cell, wherein the merger cell comprises:
     - a first p-type length of diffusion (LOD) region extending in a first direction;
     - a first n-well underneath the first p-type LOD region;
     - a first supply rail configured to receive a first supply voltage;
     - a first n-tap coupling the first n-well to the first supply rail;
     - a second p-type length of diffusion (LOD) region extending in the first direction;
     - a second n-well underneath the second p-type LOD region;
     - a second supply rail configured to receive a second supply voltage different from the first supply voltage; and
     - a second n-tap coupling the second n-well to the second supply rail.
2. The chip of clause 1, wherein the first supply rail and the second supply rail are aligned in a second direction that is perpendicular to the first direction, and the second supply rail is separated from the first supply rail in the first direction.
3. The chip of clause 2, wherein the first supply rail and the second supply rail are formed from a same metal layer.
4. The chip of any one of clauses 1 to 3, wherein the first p-type LOD region comprises:
   - a first oxide diffusion (OD) region extending in the first direction; and first gates formed over the first OD region, wherein the first gates are coupled to the first supply rail.

5. The chip of clause 4, wherein the second p-type LOD region comprises:

a second OD region extending in the first direction; and second gates formed over the second OD region, wherein the second gates are coupled to the second supply rail.

6. The chip of clause 5, wherein each of the first OD region and the second OD region is P+ doped.

7. The chip of clause 5 or 6, wherein:

the first n-tap comprises a third OD region extending in the first direction, wherein the third OD region is coupled to the first supply rail and the first n-well, and the third OD region is separated from the first OD region in the first direction; and the second n-tap comprises a fourth OD region extending in the first direction, wherein the third OD region is coupled to the second supply rail and the second n-well, and the fourth OD region is separated from the second OD region in the first direction.

8. The chip of clause 7, wherein:

each of the first OD region and the second OD region is P+ doped; and each of the third OD region and the fourth OD region is N+ doped.

9. The chip of any one of clauses 1 to 8, wherein the merger cell further comprises:

a first n-type LOD region extending in the first direction; and a second n-type LOD region extending in the first direction.

10. The chip of clause 9, wherein the merger cell further comprises a ground rail, and the first n-type LOD region comprises:

a first oxide diffusion (OD) region extending in the first direction; and first gates formed over the first OD region, wherein the first gates are coupled to the ground rail.

11. The chip of clause 10, wherein the second n-type LOD region comprises:

a second OD region extending in the first direction; and second gates formed over the second OD region, wherein the second gates are coupled to the ground rail.

12. The chip of clause 11, wherein the ground rail is contiguous across the merger cell in the first direction.

13. The chip of clause 11 or 12, wherein the first supply rail, the second supply rail, and the ground rail are formed from a same metal layer.

14. The chip of any one of clauses 11 to 13, wherein each of the first OD region and the second OD region is N+ doped.

15. The chip of any one of clauses 11 to 14, wherein the merger cell further comprises:

a first p-tap coupled to the ground rail; and a second p-tap coupled to the ground rail.

16. The chip of any one of clauses 11 to 15, wherein the first p-type LOD region comprises:

a third region extending in the first direction; and third gates formed over the third OD region, wherein the third gates are coupled to the first supply rail.

17. The chip of clause 16, wherein the second p-type LOD region comprises:

a fourth OD region extending in the first direction; and fourth gates formed over the fourth OD region, wherein the fourth gates are coupled to the second supply rail.

18. The chip of clause 17, wherein:

each of the first OD and the second OD is N+ doped; and each of the third OD and the fourth OD is P+ doped.

19. The chip of any one of clauses 1 to 18, further comprising:

a first cell in a first voltage domain abutting a first side of the merger cell; and a second cell in a second voltage domain abutting a second side of the merger cell.

20. The chip of clause 19, wherein the first side and the second side are opposite sides of the merger cell.

Within the present disclosure, the word “exemplary” is used to mean “serving as an example, instance, or illustration.” Any implementation or aspect described herein as “exemplary” is not necessarily to be construed as preferred or advantageous over other aspects of the disclosure. Likewise, the term “aspects” does not require that all aspects of the disclosure include the discussed feature, advantage or mode of operation. The term “coupled” is used herein to refer to the direct or indirect electrical coupling between two structures.

Any reference to an element herein using a designation such as “first,” “second,” and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A chip, comprising:

a merger cell, wherein the merger cell comprises:

a first p-type length of diffusion (LOD) region extending in a first direction;

a first n-well underneath the first p-type LOD region;

a first supply rail configured to receive a first supply voltage;

a first n-tap coupling the first n-well to the first supply rail;

a second p-type length of diffusion (LOD) region extending in the first direction;

a second n-well underneath the second p-type LOD region;

a second supply rail configured to receive a second supply voltage different from the first supply voltage; and a second n-tap coupling the second n-well to the second supply rail.

2. The chip of claim 1, wherein the first supply rail and the second supply rail are aligned in a second direction that is perpendicular to the first direction, and the second supply rail is separated from the first supply rail in the first direction.

3. The chip of claim 2, wherein the first supply rail and the second supply rail are formed from a same metal layer.

4. The chip of claim 1, wherein the first p-type LOD region comprises:

a first oxide diffusion (OD) region extending in the first direction; and first gates formed over the first OD region, wherein the first gates are coupled to the first supply rail.

5. The chip of claim 4, wherein the second p-type LOD region comprises:

a second OD region extending in the first direction; and second gates formed over the second OD region, wherein the second gates are coupled to the second supply rail.

6. The chip of claim 5, wherein each of the first OD region and the second OD region is P+ doped.

7. The chip of claim 5, wherein:

the first n-tap comprises a third OD region extending in the first direction, wherein the third OD region is coupled to the first supply rail and the first n-well, and the third OD region is separated from the first OD region in the first direction; and the second n-tap comprises a fourth OD region extending in the first direction, wherein the third OD region is coupled to the second supply rail and the second n-well, and the fourth OD region is separated from the second OD region in the first direction.

8. The chip of claim 7, wherein:

each of the first OD region and the second OD region is P+ doped; and each of the third OD region and the fourth OD region is N+ doped.

9. The chip of claim 1, wherein the merger cell further comprises:

a first n-type LOD region extending in the first direction; and a second n-type LOD region extending in the first direction.

10. The chip of claim 9, wherein the merger cell further comprises a ground rail, and the first n-type LOD region comprises:

a first oxide diffusion (OD) region extending in the first direction; and first gates formed over the first OD region, wherein the first gates are coupled to the ground rail.

11. The chip of claim 10, wherein the second n-type LOD region comprises:

a second OD region extending in the first direction; and second gates formed over the second OD region, wherein the second gates are coupled to the ground rail.

12. The chip of claim 11, wherein the ground rail is contiguous across the merger cell in the first direction.

13. The chip of claim 11, wherein the first supply rail, the second supply rail, and the ground rail are formed from a same metal layer.

14. The chip of claim 11, wherein each of the first OD region and the second OD region is N+ doped.

15. The chip of claim 11, wherein the merger cell further comprises:

a first p-tap coupled to the ground rail; and a second p-tap coupled to the ground rail.

16. The chip of claim 11, wherein the first p-type LOD region comprises:

a third region extending in the first direction; and third gates formed over the third OD region, wherein the third gates are coupled to the first supply rail.

17. The chip of claim 16, wherein the second p-type LOD region comprises:

a fourth OD region extending in the first direction; and fourth gates formed over the fourth OD region, wherein the fourth gates are coupled to the second supply rail.

18. The chip of claim 17, wherein:

each of the first OD and the second OD is N+ doped; and each of the third OD and the fourth OD is P+ doped.

19. The chip of claim 1, further comprising:

a first cell in a first voltage domain abutting a first side of the merger cell; and a second cell in a second voltage domain abutting a second side of the merger cell.

20. The chip of claim 19, wherein the first side and the second side are opposite sides of the merger cell.

* * * * *